United States Patent
Lubomirsky

(10) Patent No.: US 10,224,210 B2
(45) Date of Patent: Mar. 5, 2019

(54) PLASMA PROCESSING SYSTEM WITH DIRECT OUTLET TOROIDAL PLASMA SOURCE

(71) Applicant: Applied Materials, Inc., Santa Clara, CA (US)

(72) Inventor: Dmitry Lubomirsky, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/565,077

(22) Filed: Dec. 9, 2014

(65) Prior Publication Data

US 2016/0163513 A1    Jun. 9, 2016

(51) Int. Cl.
*H01J 37/32* (2006.01)
*H01L 21/3065* (2006.01)

(52) U.S. Cl.
CPC ........ *H01L 21/3065* (2013.01); *H01J 37/321* (2013.01); *H01J 37/32357* (2013.01); *H01J 37/32449* (2013.01); *H01J 37/32458* (2013.01)

(58) Field of Classification Search
CPC ............... H01J 37/3244; H01J 37/3211; H01J 37/32357; H01J 37/321; H01J 37/32449; H01J 37/32458; H01L 21/3065
See application file for complete search history.

(56) References Cited

U.S. PATENT DOCUMENTS

| | | |
|---|---|---|
| 2,369,620 A | 2/1945 | Sullivan et al. |
| 3,401,302 A | 9/1968 | Thorpe |
| 3,451,840 A | 6/1969 | Hough |
| 3,537,474 A | 11/1970 | Rohrer |

(Continued)

FOREIGN PATENT DOCUMENTS

| | | |
|---|---|---|
| CN | 1124364 A | 6/1996 |
| CN | 1847450 A | 10/2006 |

(Continued)

OTHER PUBLICATIONS

Manual No. TQMA72E1. "Bayard-Alpert Pirani Gauge FRG-730: Short Operating Instructions" Mar. 2012. Agilent Technologies, Lexington, MA 02421, USA. pp. 1-45.

(Continued)

*Primary Examiner* — Yuechuan Yu
(74) *Attorney, Agent, or Firm* — Kilpatrick Townsend & Stockton LLP

(57) ABSTRACT

A plasma processing system includes a process chamber and a plasma source that generates a plasma in a plasma cavity. The plasma cavity is substantially symmetric about a toroidal axis. The plasma source defines a plurality of outlet apertures on a first axial side of the plasma cavity Plasma products produced by the plasma pass in the axial direction, through the plurality of outlet apertures, from the plasma cavity toward the process chamber. A method of plasma processing includes generating a plasma within a substantially toroidal plasma cavity that defines a toroidal axis, to form plasma products, and distributing the plasma products to a process chamber through a plurality of outlet openings substantially azimuthally distributed about a first axial side of the plasma cavity, directly into a process chamber.

14 Claims, 13 Drawing Sheets

(56) References Cited

U.S. PATENT DOCUMENTS

| | | |
|---|---|---|
| 3,756,511 A | 9/1973 | Shinroku |
| 3,937,857 A | 2/1976 | Brummett et al. |
| 3,969,077 A | 7/1976 | Hill |
| 4,006,047 A | 2/1977 | Brummett et al. |
| 4,190,488 A | 2/1980 | Winters |
| 4,209,357 A | 6/1980 | Gorin et al. |
| 4,214,946 A | 7/1980 | Forget et al. |
| 4,232,060 A | 11/1980 | Mallory, Jr. |
| 4,234,628 A | 11/1980 | DuRose |
| 4,265,943 A | 5/1981 | Goldstein et al. |
| 4,340,462 A | 7/1982 | Koch |
| 4,341,592 A | 7/1982 | Shortes et al. |
| 4,361,418 A | 11/1982 | Tscheppe |
| 4,364,803 A | 12/1982 | Nidola et al. |
| 4,368,223 A | 1/1983 | Kobayashi et al. |
| 4,374,698 A | 2/1983 | Sanders et al. |
| 4,381,441 A | 4/1983 | Desmarais et al. |
| 4,397,812 A | 8/1983 | Mallory, Jr. |
| 4,468,413 A | 8/1984 | Bachmann |
| 4,565,601 A | 1/1986 | Kakehi et al. |
| 4,579,618 A | 4/1986 | Celestino et al. |
| 4,585,920 A | 4/1986 | Hoog et al. |
| 4,610,775 A | 9/1986 | Phifer |
| 4,625,678 A | 12/1986 | Shloya et al. |
| 4,632,857 A | 12/1986 | Mallory, Jr. |
| 4,656,052 A | 4/1987 | Satou et al. |
| 4,656,076 A | 4/1987 | Vetanen et al. |
| 4,668,335 A | 5/1987 | Mockler |
| 4,690,746 A | 9/1987 | McInerney et al. |
| 4,715,937 A | 12/1987 | Moslehi et al. |
| 4,749,440 A | 6/1988 | Blackwood et al. |
| 4,753,898 A | 6/1988 | Parrillo et al. |
| 4,786,360 A | 11/1988 | Cote et al. |
| 4,792,378 A | 12/1988 | Rose et al. |
| 4,793,897 A | 12/1988 | Dunfield et al. |
| 4,807,016 A | 2/1989 | Douglas |
| 4,810,520 A | 3/1989 | Wu |
| 4,816,638 A | 3/1989 | Ukai et al. |
| 4,820,377 A | 4/1989 | Davis et al. |
| 4,828,649 A | 5/1989 | Davis |
| 4,838,990 A | 6/1989 | Jucha et al. |
| 4,851,370 A | 7/1989 | Doklan et al. |
| 4,857,140 A | 8/1989 | Loewenstein |
| 4,865,685 A | 9/1989 | Palmour |
| 4,867,841 A | 9/1989 | Loewenstein et al. |
| 4,868,071 A | 9/1989 | Walsh et al. |
| 4,872,947 A | 10/1989 | Wang et al. |
| 4,878,994 A | 11/1989 | Jucha et al. |
| 4,886,570 A | 12/1989 | Davis et al. |
| 4,892,753 A | 1/1990 | Wang et al. |
| 4,894,352 A | 1/1990 | Lane et al. |
| 4,904,341 A | 2/1990 | Blaugher et al. |
| 4,904,621 A | 2/1990 | Lowenstein et al. |
| 4,913,929 A | 4/1990 | Moslehi et al. |
| 4,919,750 A | 4/1990 | Bausmith et al. |
| 4,946,903 A | 8/1990 | Gardella et al. |
| 4,951,601 A | 8/1990 | Maydan et al. |
| 4,960,488 A | 10/1990 | Law et al. |
| 4,980,018 A | 12/1990 | Mu et al. |
| 4,981,551 A | 1/1991 | Palmour |
| 4,985,372 A | 1/1991 | Narita et al. |
| 4,991,542 A | 2/1991 | Kohmura et al. |
| 4,992,136 A | 2/1991 | Tachi et al. |
| 4,993,358 A | 2/1991 | Mahawili |
| 4,994,404 A | 2/1991 | Sheng et al. |
| 5,000,113 A | 3/1991 | Wang et al. |
| 5,006,192 A | 4/1991 | Deguchi |
| 5,010,842 A | 4/1991 | Oda et al. |
| 5,013,691 A | 5/1991 | Lory et al. |
| 5,028,565 A | 7/1991 | Chang |
| 5,030,319 A | 7/1991 | Nishino et al. |
| 5,038,713 A | 8/1991 | Kawakami et al. |
| 5,045,244 A | 9/1991 | Marlett |
| 5,061,838 A | 10/1991 | Lane et al. |
| 5,069,938 A | 12/1991 | Lorimer et al. |
| 5,083,030 A | 1/1992 | Stavov |
| 5,089,441 A | 2/1992 | Moslehi |
| 5,089,442 A | 2/1992 | Olmer |
| 5,147,692 A | 9/1992 | Bengston |
| 5,156,881 A | 10/1992 | Okano et al. |
| 5,180,435 A | 1/1993 | Markunas et al. |
| 5,186,718 A | 2/1993 | Tepman et al. |
| 5,188,706 A | 2/1993 | Hori et al. |
| 5,198,034 A | 3/1993 | deBoer et al. |
| 5,200,016 A | 4/1993 | Namose |
| 5,203,911 A | 4/1993 | Sricharoenchalkit et al. |
| 5,215,787 A | 6/1993 | Homma |
| 5,221,427 A | 6/1993 | Koinuma et al. |
| 5,228,501 A | 7/1993 | Tepman et al. |
| 5,231,690 A | 7/1993 | Soma et al. |
| 5,235,139 A | 8/1993 | Bengston et al. |
| 5,238,499 A | 8/1993 | van de Ven et al. |
| 5,240,497 A | 8/1993 | Shacham et al. |
| 5,248,371 A | 9/1993 | Maher et al. |
| 5,248,527 A | 9/1993 | Uchida et al. |
| 5,252,178 A | 10/1993 | Moslehi |
| 5,266,157 A | 11/1993 | Kadomura |
| 5,269,881 A | 12/1993 | Sekiya |
| 5,270,125 A | 12/1993 | America et al. |
| 5,271,972 A | 12/1993 | Kwok et al. |
| 5,275,977 A | 1/1994 | Otsubo et al. |
| 5,277,750 A | 1/1994 | Frank |
| 5,279,669 A | 1/1994 | Lee |
| 5,279,865 A | 1/1994 | Chebi et al. |
| 5,288,518 A | 2/1994 | Homma |
| 5,290,382 A | 3/1994 | Zarowin et al. |
| 5,290,383 A | 3/1994 | Koshimizu |
| 5,292,370 A | 3/1994 | Tsai et al. |
| 5,292,682 A | 3/1994 | Stevens et al. |
| 5,300,463 A | 4/1994 | Cathey et al. |
| 5,302,233 A | 4/1994 | Kim et al. |
| 5,304,250 A | 4/1994 | Sameshima et al. |
| 5,306,530 A | 4/1994 | Strongin et al. |
| 5,314,724 A | 5/1994 | Tsukune et al. |
| 5,319,247 A | 6/1994 | Matsuura |
| 5,326,427 A | 7/1994 | Jerbic |
| 5,328,218 A | 7/1994 | Lowrey et al. |
| 5,328,558 A | 7/1994 | Kawamura et al. |
| 5,330,578 A | 7/1994 | Sakama |
| 5,334,552 A | 8/1994 | Homma |
| 5,345,999 A | 9/1994 | Hosokawa |
| 5,352,636 A | 10/1994 | Beinglass |
| 5,356,478 A | 10/1994 | Chen et al. |
| 5,362,526 A | 11/1994 | Wang et al. |
| 5,366,585 A | 11/1994 | Robertson et al. |
| 5,368,897 A | 11/1994 | Kurihara et al. |
| 5,378,316 A | 1/1995 | Franke et al. |
| 5,380,560 A | 1/1995 | Kaja et al. |
| 5,382,311 A | 1/1995 | Ishikawa et al. |
| 5,384,284 A | 1/1995 | Doan et al. |
| 5,385,763 A | 1/1995 | Okano et al. |
| 5,399,237 A | 3/1995 | Keswick et al. |
| 5,399,529 A | 3/1995 | Homma |
| 5,403,434 A | 4/1995 | Moslehi |
| 5,413,670 A | 5/1995 | Langan et al. |
| 5,413,967 A | 5/1995 | Matsuda et al. |
| 5,415,890 A | 5/1995 | Kloiber et al. |
| 5,416,048 A | 5/1995 | Blalock et al. |
| 5,420,075 A | 5/1995 | Homma et al. |
| 5,429,995 A | 7/1995 | Nishiyama et al. |
| 5,439,553 A | 8/1995 | Grant et al. |
| 5,451,259 A | 9/1995 | Krogh |
| 5,464,499 A | 11/1995 | Moslehi |
| 5,468,342 A | 11/1995 | Nulty et al. |
| 5,474,589 A | 12/1995 | Ohga et al. |
| 5,478,403 A | 12/1995 | Shinigawa et al. |
| 5,478,462 A | 12/1995 | Walsh |
| 5,483,920 A | 1/1996 | Pryor |
| 5,494,494 A | 2/1996 | Mizuno et al. |
| 5,500,249 A | 3/1996 | Telford et al. |
| 5,505,816 A | 4/1996 | Barnes et al. |
| 5,510,216 A | 4/1996 | Calabrese et al. |
| 5,516,367 A | 5/1996 | Lei et al. |
| 5,518,962 A | 5/1996 | Murao |

(56) References Cited

U.S. PATENT DOCUMENTS

| | | | |
|---|---|---|---|
| 5,534,070 | A | 6/1996 | Okamura et al. |
| 5,536,360 | A | 6/1996 | Nguyen et al. |
| 5,531,835 | A | 7/1996 | Fodor et al. |
| 5,549,780 | A | 8/1996 | Koinuma et al. |
| 5,558,717 | A | 9/1996 | Zhao et al. |
| 5,560,779 | A | 10/1996 | Knowles et al. |
| 5,563,105 | A | 10/1996 | Dobuzinsky et al. |
| 5,567,243 | A | 10/1996 | Foster et al. |
| 5,571,576 | A | 11/1996 | Qian et al. |
| 5,575,853 | A | 11/1996 | Arami et al. |
| 5,578,130 | A | 11/1996 | Hayashi et al. |
| 5,578,161 | A | 11/1996 | Auda |
| 5,580,421 | A | 12/1996 | Hiatt et al. |
| 5,591,269 | A | 1/1997 | Arami et al. |
| 5,592,358 | A | 1/1997 | Shamouilian |
| 5,599,740 | A | 2/1997 | Jang et al. |
| 5,614,055 | A | 3/1997 | Fairbairn et al. |
| 5,616,518 | A | 4/1997 | Foo et al. |
| 5,624,582 | A | 4/1997 | Cain |
| 5,626,922 | A | 5/1997 | Miyanaga et al. |
| 5,628,829 | A | 5/1997 | Foster et al. |
| 5,635,086 | A | 6/1997 | Warren, Jr. |
| 5,645,645 | A | 7/1997 | Zhang et al. |
| 5,648,125 | A | 7/1997 | Cane |
| 5,648,175 | A | 7/1997 | Russell et al. |
| 5,656,093 | A | 8/1997 | Burkhart et al. |
| 5,660,957 | A | 8/1997 | Chou et al. |
| 5,661,093 | A | 8/1997 | Ravi et al. |
| 5,670,066 | A | 9/1997 | Barnes et al. |
| 5,674,787 | A | 10/1997 | Zhao et al. |
| 5,676,758 | A | 10/1997 | Hasgawa et al. |
| 5,679,606 | A | 10/1997 | Wang et al. |
| 5,685,946 | A | 11/1997 | Fathauer et al. |
| 5,688,331 | A | 11/1997 | Aruga et al. |
| 5,695,810 | A | 12/1997 | Dubin et al. |
| 5,712,185 | A | 1/1998 | Tsai et al. |
| 5,716,500 | A | 2/1998 | Bardos et al. |
| 5,716,506 | A | 2/1998 | Maclay et al. |
| 5,719,085 | A | 2/1998 | Moon et al. |
| 5,733,816 | A | 3/1998 | Iyer et al. |
| 5,747,373 | A | 5/1998 | Yu |
| 5,753,886 | A | 5/1998 | Iwamura et al. |
| 5,755,859 | A | 5/1998 | Brusic et al. |
| 5,756,400 | A | 5/1998 | Ye et al. |
| 5,756,402 | A | 5/1998 | Jimbo et al. |
| 5,772,770 | A | 6/1998 | Suda et al. |
| 5,781,693 | A | 7/1998 | Ballance et al. |
| 5,786,276 | A | 7/1998 | Brooks et al. |
| 5,788,825 | A | 8/1998 | Park et al. |
| 5,789,300 | A | 8/1998 | Fulford |
| 5,792,376 | A | 8/1998 | Kanai et al. |
| 5,800,686 | A | 9/1998 | Littau et al. |
| 5,804,259 | A | 9/1998 | Robles |
| 5,812,403 | A | 9/1998 | Fong et al. |
| 5,814,238 | A | 9/1998 | Ashby et al. |
| 5,814,365 | A | 9/1998 | Mahawill |
| 5,820,723 | A | 10/1998 | Benjamin et al. |
| 5,824,599 | A | 10/1998 | Schacham-Diamand et al. |
| 5,830,805 | A | 11/1998 | Schacham-Diamand et al. |
| 5,835,334 | A | 11/1998 | McMillin et al. |
| 5,843,538 | A | 12/1998 | Ehrsam et al. |
| 5,843,847 | A | 12/1998 | Pu et al. |
| 5,844,195 | A | 12/1998 | Fairbairn et al. |
| 5,846,332 | A | 12/1998 | Zhao et al. |
| 5,846,373 | A | 12/1998 | Pirkle et al. |
| 5,846,375 | A | 12/1998 | Gilchrist et al. |
| 5,846,598 | A | 12/1998 | Semkow et al. |
| 5,849,639 | A | 12/1998 | Molloy et al. |
| 5,850,105 | A | 12/1998 | Dawson et al. |
| 5,855,681 | A | 1/1999 | Maydan et al. |
| 5,855,685 | A | 1/1999 | Tobe et al. |
| 5,856,240 | A | 1/1999 | Sinha et al. |
| 5,858,876 | A | 1/1999 | Chew |
| 5,863,376 | A | 1/1999 | Wicker |
| 5,865,896 | A | 2/1999 | Nowak et al. |
| 5,866,483 | A | 2/1999 | Shiau et al. |
| 5,872,052 | A | 2/1999 | Iyer |
| 5,872,058 | A | 2/1999 | Van Cleemput et al. |
| 5,882,424 | A | 3/1999 | Taylor et al. |
| 5,882,786 | A | 3/1999 | Nassau et al. |
| 5,883,012 | A | 3/1999 | Chiou |
| 5,885,404 | A | 3/1999 | Kim et al. |
| 5,885,749 | A | 3/1999 | Huggins et al. |
| 5,888,906 | A | 3/1999 | Sandhu et al. |
| 5,891,349 | A | 4/1999 | Tobe et al. |
| 5,891,513 | A | 4/1999 | Dubin et al. |
| 5,897,751 | A | 4/1999 | Makowiecki |
| 5,899,752 | A | 5/1999 | Hey et al. |
| 5,900,163 | A | 5/1999 | Yi et al. |
| 5,904,827 | A | 5/1999 | Reynolds |
| 5,907,790 | A | 5/1999 | Kellam |
| 5,910,340 | A | 6/1999 | Uchida et al. |
| 5,913,147 | A | 6/1999 | Dubin et al. |
| 5,913,978 | A | 6/1999 | Kato et al. |
| 5,915,190 | A | 6/1999 | Pirkle |
| 5,918,116 | A | 6/1999 | Chittipeddi |
| 5,919,332 | A | 7/1999 | Koshiishi et al. |
| 5,920,792 | A | 7/1999 | Lin |
| 5,926,737 | A | 7/1999 | Ameen et al. |
| 5,932,077 | A | 8/1999 | Reynolds |
| 5,933,757 | A | 8/1999 | Yoshikawa et al. |
| 5,935,334 | A | 8/1999 | Fong et al. |
| 5,935,340 | A | 8/1999 | Xia et al. |
| 5,937,323 | A | 8/1999 | Orczyk et al. |
| 5,939,831 | A | 8/1999 | Fong et al. |
| 5,942,075 | A | 8/1999 | Nagahata et al. |
| 5,944,049 | A | 8/1999 | Beyer et al. |
| 5,944,902 | A | 8/1999 | Redeker et al. |
| 5,948,702 | A | 9/1999 | Rotondaro |
| 5,951,601 | A | 9/1999 | Lesinski et al. |
| 5,951,776 | A | 9/1999 | Selyutin et al. |
| 5,951,896 | A | 9/1999 | Mahawill |
| 5,953,591 | A | 9/1999 | Ishihara et al. |
| 5,953,635 | A | 9/1999 | Andideh |
| 5,963,840 | A | 10/1999 | Xia et al. |
| 5,968,587 | A | 10/1999 | Frankel et al. |
| 5,968,610 | A | 10/1999 | Liu et al. |
| 5,969,422 | A | 10/1999 | Ting et al. |
| 5,976,327 | A | 11/1999 | Tanaka |
| 5,990,000 | A | 11/1999 | Hong et al. |
| 5,990,013 | A | 11/1999 | Berenguer et al. |
| 5,993,916 | A | 11/1999 | Zhao et al. |
| 5,994,209 | A | 11/1999 | Yieh et al. |
| 5,997,649 | A | 12/1999 | Hillman |
| 5,997,962 | A | 12/1999 | Ogasawara et al. |
| 6,004,884 | A | 12/1999 | Abraham |
| 6,007,635 | A | 12/1999 | Mahawill |
| 6,007,785 | A | 12/1999 | Liou |
| 6,010,962 | A | 1/2000 | Liu et al. |
| 6,013,191 | A | 1/2000 | Nasser-Faili et al. |
| 6,013,584 | A | 1/2000 | M'Saad |
| 6,015,724 | A | 1/2000 | Yamazaki et al. |
| 6,015,747 | A | 1/2000 | Lopatin et al. |
| 6,017,414 | A | 1/2000 | Koemtzopoulos et al. |
| 6,019,848 | A | 2/2000 | Kiyama et al. |
| 6,020,271 | A | 2/2000 | Yanagida |
| 6,030,666 | A | 2/2000 | Lam et al. |
| 6,030,881 | A | 2/2000 | Papasouliotis et al. |
| 6,035,101 | A | 3/2000 | Sajoto et al. |
| 6,036,878 | A | 3/2000 | Collins |
| 6,037,018 | A | 3/2000 | Jang et al. |
| 6,037,266 | A | 3/2000 | Tao et al. |
| 6,039,834 | A | 3/2000 | Tanaka et al. |
| 6,039,851 | A | 3/2000 | Iyer |
| 6,053,982 | A | 4/2000 | Halpin et al. |
| 6,059,643 | A | 5/2000 | Hu et al. |
| 6,063,683 | A | 5/2000 | Wu et al. |
| 6,063,712 | A | 5/2000 | Gilton et al. |
| 6,065,424 | A | 5/2000 | Shacham-Diamand et al. |
| 6,065,425 | A | 5/2000 | Takaki et al. |
| 6,072,147 | A | 6/2000 | Koshiishi |
| 6,072,227 | A | 6/2000 | Yau et al. |
| 6,074,512 | A | 6/2000 | Collins et al. |
| 6,074,514 | A | 6/2000 | Bjorkman et al. |

(56) References Cited

U.S. PATENT DOCUMENTS

| | | |
|---|---|---|
| 6,077,384 A | 6/2000 | Collins |
| 6,077,780 A | 6/2000 | Dubin |
| 6,079,356 A | 6/2000 | Umotoy et al. |
| 6,080,529 A | 6/2000 | Ye et al. |
| 6,081,414 A | 6/2000 | Flanigan et al. |
| 6,083,344 A | 7/2000 | Hanawa et al. |
| 6,083,844 A | 7/2000 | Bui-Le et al. |
| 6,086,677 A | 7/2000 | Umotoy et al. |
| 6,087,278 A | 7/2000 | Kim et al. |
| 6,090,212 A | 7/2000 | Mahawill |
| 6,093,457 A | 7/2000 | Okumura |
| 6,093,594 A | 7/2000 | Yeap et al. |
| 6,099,697 A | 8/2000 | Hausmann |
| 6,107,199 A | 8/2000 | Allen et al. |
| 6,110,530 A | 8/2000 | Chen et al. |
| 6,110,832 A | 8/2000 | Morgan et al. |
| 6,110,836 A | 8/2000 | Cohen et al. |
| 6,110,838 A | 8/2000 | Loewenstein |
| 6,113,771 A | 9/2000 | Landau et al. |
| 6,114,216 A | 9/2000 | Yieh et al. |
| 6,117,245 A | 9/2000 | Mandrekar et al. |
| 6,120,640 A | 9/2000 | Shih et al. |
| 6,136,163 A | 10/2000 | Cheung et al. |
| 6,136,165 A | 10/2000 | Moslehi et al. |
| 6,136,685 A | 10/2000 | Narwankar et al. |
| 6,136,693 A | 10/2000 | Chan et al. |
| 6,140,234 A | 10/2000 | Uzoh et al. |
| 6,144,099 A | 11/2000 | Lopatin et al. |
| 6,147,009 A | 11/2000 | Grill et al. |
| 6,148,761 A | 11/2000 | Majewski et al. |
| 6,149,828 A | 11/2000 | Vaartstra |
| 6,150,628 A | 11/2000 | Smith et al. |
| 6,153,935 A | 11/2000 | Edelstein et al. |
| 6,161,500 A | 12/2000 | Kopacz et al. |
| 6,161,576 A | 12/2000 | Maher et al. |
| 6,162,302 A | 12/2000 | Raghavan et al. |
| 6,162,370 A | 12/2000 | Hackett et al. |
| 6,165,912 A | 12/2000 | McConnell et al. |
| 6,167,834 B1 | 1/2001 | Wang et al. |
| 6,169,021 B1 | 1/2001 | Akram et al. |
| 6,170,428 B1 | 1/2001 | Redeker et al. |
| 6,171,661 B1 | 1/2001 | Zheng et al. |
| 6,174,450 B1 | 1/2001 | Patrick et al. |
| 6,174,810 B1 | 1/2001 | Patrick et al. |
| 6,174,812 B1 | 1/2001 | Hsuing et al. |
| 6,176,198 B1 | 1/2001 | Kao et al. |
| 6,176,667 B1 | 1/2001 | Fairbairn |
| 6,177,245 B1 | 1/2001 | Ward et al. |
| 6,179,924 B1 | 1/2001 | Zhao et al. |
| 6,180,523 B1 | 1/2001 | Lee et al. |
| 6,182,602 B1 | 2/2001 | Redeker et al. |
| 6,182,603 B1 | 2/2001 | Shang et al. |
| 6,184,121 B1 | 2/2001 | Buchwalter et al. |
| 6,186,091 B1 | 2/2001 | Chu et al. |
| 6,189,483 B1 | 2/2001 | Ishikawa et al. |
| 6,190,233 B1 | 2/2001 | Hong et al. |
| 6,194,038 B1 | 2/2001 | Rossman |
| 6,197,181 B1 | 3/2001 | Chen |
| 6,197,364 B1 | 3/2001 | Paunovic et al. |
| 6,197,680 B1 | 3/2001 | Lin et al. |
| 6,197,688 B1 | 3/2001 | Simpson |
| 6,197,705 B1 | 3/2001 | Vassiliev |
| 6,198,616 B1 | 3/2001 | Dahimene et al. |
| 6,203,863 B1 | 3/2001 | Liu et al. |
| 6,204,200 B1 | 3/2001 | Shieh et al. |
| 6,210,486 B1 | 4/2001 | Mizukami et al. |
| 6,217,658 B1 | 4/2001 | Orczyk et al. |
| 6,220,201 B1 | 4/2001 | Nowak |
| 6,225,745 B1 | 5/2001 | Srivastava |
| 6,228,233 B1 | 5/2001 | Lakshmikanthan et al. |
| 6,228,751 B1 | 5/2001 | Yamazaki et al. |
| 6,228,758 B1 | 5/2001 | Pellerin et al. |
| 6,235,643 B1 | 5/2001 | Mui et al. |
| 6,237,527 B1 | 5/2001 | Kellerman et al. |
| 6,238,513 B1 | 5/2001 | Arnold et al. |
| 6,238,582 B1 | 5/2001 | Williams et al. |
| 6,197,151 B1 | 6/2001 | Kaji et al. |
| 6,241,845 B1 | 6/2001 | Gadgil et al. |
| 6,242,349 B1 | 6/2001 | Nogami et al. |
| 6,244,211 B1 | 6/2001 | Nishikawa et al. |
| 6,245,396 B1 | 6/2001 | Nogami |
| 6,245,670 B1 | 6/2001 | Cheung et al. |
| 6,251,236 B1 | 6/2001 | Stevens |
| 6,251,802 B1 | 6/2001 | Moore et al. |
| 6,258,170 B1 | 7/2001 | Somekh et al. |
| 6,258,220 B1 | 7/2001 | Dordi et al. |
| 6,258,223 B1 | 7/2001 | Cheung et al. |
| 6,258,270 B1 | 7/2001 | Hilgendorff et al. |
| 6,261,637 B1 | 7/2001 | Oberle |
| 6,277,733 B1 | 8/2001 | Smith |
| 6,277,752 B1 | 8/2001 | Chen |
| 6,277,763 B1 | 8/2001 | Kugimiya et al. |
| 6,281,072 B1 | 8/2001 | Li et al. |
| 6,281,135 B1 | 8/2001 | Han et al. |
| 6,284,146 B1 | 9/2001 | Kim et al. |
| 6,291,282 B1 | 9/2001 | Wilk et al. |
| 6,291,348 B1 | 9/2001 | Lopatin et al. |
| 6,303,044 B1 | 10/2001 | Koemtzopoulos |
| 6,303,418 B1 | 10/2001 | Cha et al. |
| 6,306,772 B1 | 10/2001 | Lin |
| 6,308,654 B1 | 10/2001 | Schneider et al. |
| 6,308,776 B1 | 10/2001 | Sloan et al. |
| 6,310,755 B1 | 10/2001 | Busato et al. |
| 6,312,554 B1 | 11/2001 | Ye |
| 6,312,995 B1 | 11/2001 | Yu |
| 6,319,387 B1 | 11/2001 | Krishnamoorthy et al. |
| 6,321,587 B1 | 11/2001 | Laush |
| 6,322,716 B1 | 11/2001 | Qiao et al. |
| 6,323,128 B1 | 11/2001 | Sambucetti et al. |
| 6,335,288 B1 | 1/2002 | Kwan et al. |
| 6,340,435 B1 | 1/2002 | Bjorkman et al. |
| 6,342,733 B1 | 1/2002 | Hu et al. |
| RE37,546 E | 2/2002 | Mahawill |
| 6,344,410 B1 | 2/2002 | Lopatin et al. |
| 6,348,407 B1 | 2/2002 | Gupta et al. |
| 6,350,320 B1 | 2/2002 | Sherstinsky et al. |
| 6,350,697 B1 | 2/2002 | Richardson |
| 6,351,013 B1 | 2/2002 | Luning et al. |
| 6,352,081 B1 | 3/2002 | Lu et al. |
| 6,355,573 B1 | 3/2002 | Okumura |
| 6,364,949 B1 | 4/2002 | Or et al. |
| 6,364,954 B2 | 4/2002 | Umotoy et al. |
| 6,364,957 B1 | 4/2002 | Schneider et al. |
| 6,375,748 B1 | 4/2002 | Yudovsky et al. |
| 6,376,386 B1 | 4/2002 | Oshima |
| 6,379,575 B1 | 4/2002 | Yin et al. |
| 6,383,896 B1 | 5/2002 | Kirimura et al. |
| 6,383,951 B1 | 5/2002 | Li |
| 6,387,207 B1 | 5/2002 | Janakiraman et al. |
| 6,391,753 B1 | 5/2002 | Yu |
| 6,395,150 B1 | 5/2002 | Van Cleemput et al. |
| 6,403,491 B1 | 6/2002 | Liu et al. |
| 6,415,736 B1 | 7/2002 | Hao et al. |
| 6,416,647 B1 | 7/2002 | Dordi et al. |
| 6,416,874 B1 | 7/2002 | Cox et al. |
| 6,423,284 B1 | 7/2002 | Arno |
| 6,427,623 B2 | 8/2002 | Ko |
| 6,429,465 B1 | 8/2002 | Yagi et al. |
| 6,432,819 B1 | 8/2002 | Pavate et al. |
| 6,432,831 B2 | 8/2002 | Dhindsa et al. |
| 6,436,193 B1 | 8/2002 | Kasai et al. |
| 6,436,816 B1 | 8/2002 | Lee et al. |
| 6,440,863 B1 | 8/2002 | Tsai et al. |
| 6,441,492 B1 | 8/2002 | Cunningham |
| 6,446,572 B1 | 9/2002 | Brcka |
| 6,448,537 B1 | 9/2002 | Nering |
| 6,458,718 B1 | 10/2002 | Todd |
| 6,461,974 B1 | 10/2002 | Ni et al. |
| 6,462,371 B1 | 10/2002 | Weimer et al. |
| 6,462,372 B1 | 10/2002 | Xia et al. |
| 6,465,051 B1 | 10/2002 | Sahin et al. |
| 6,465,350 B1 | 10/2002 | Taylor et al. |
| 6,465,366 B1 | 10/2002 | Nemani et al. |
| 6,477,980 B1 | 11/2002 | White et al. |

(56) References Cited

U.S. PATENT DOCUMENTS

| | | |
|---|---|---|
| 6,479,373 B2 | 11/2002 | Dreybrodt et al. |
| 6,488,984 B1 | 12/2002 | Wada et al. |
| 6,494,959 B1 | 12/2002 | Samoilov et al. |
| 6,499,425 B1 | 12/2002 | Sandhu et al. |
| 6,500,728 B1 | 12/2002 | Wang |
| 6,503,843 B1 | 1/2003 | Xia et al. |
| 6,506,291 B2 | 1/2003 | Tsai et al. |
| 6,509,283 B1 | 1/2003 | Thomas |
| 6,509,623 B2 | 1/2003 | Zhao |
| 6,516,815 B1 | 2/2003 | Stevens et al. |
| 6,518,548 B2 | 2/2003 | Sugaya et al. |
| 6,527,968 B1 | 3/2003 | Wang et al. |
| 6,528,409 B1 | 3/2003 | Lopatin et al. |
| 6,528,751 B1 | 3/2003 | Hoffman et al. |
| 6,537,707 B1 | 3/2003 | Lee |
| 6,537,733 B2 | 3/2003 | Campana et al. |
| 6,541,397 B1 | 4/2003 | Bencher |
| 6,541,671 B1 | 4/2003 | Martinez et al. |
| 6,544,340 B2 | 4/2003 | Yudovsky |
| 6,547,977 B1 | 4/2003 | Yan et al. |
| 6,551,924 B1 | 4/2003 | Dalton et al. |
| 6,558,564 B1 | 5/2003 | Loewenhardt |
| 6,565,661 B1 | 5/2003 | Nguyen |
| 6,565,729 B2 | 5/2003 | Chen et al. |
| 6,569,773 B1 | 5/2003 | Gellrich et al. |
| 6,572,937 B2 | 6/2003 | Hakovirta et al. |
| 6,573,030 B1 | 6/2003 | Fairbairn et al. |
| 6,573,606 B2 | 6/2003 | Sambucetti et al. |
| 6,585,851 B1 | 7/2003 | Ohmi et al. |
| 6,586,163 B1 | 7/2003 | Okabe et al. |
| 6,596,599 B1 | 7/2003 | Guo |
| 6,596,654 B1 | 7/2003 | Bayman et al. |
| 6,602,434 B1 | 8/2003 | Hung et al. |
| 6,602,806 B1 | 8/2003 | Xia et al. |
| 6,603,269 B1 | 8/2003 | Vo et al. |
| 6,605,874 B2 | 8/2003 | Leu et al. |
| 6,616,967 B1 | 9/2003 | Test |
| 6,627,532 B1 | 9/2003 | Gaillard et al. |
| 6,635,575 B1 | 10/2003 | Xia et al. |
| 6,635,578 B1 | 10/2003 | Xu et al. |
| 6,638,810 B2 | 10/2003 | Bakli et al. |
| 6,645,301 B2 | 11/2003 | Sainty et al. |
| 6,645,550 B1 | 11/2003 | Cheung et al. |
| 6,656,831 B1 | 12/2003 | Lee et al. |
| 6,656,837 B2 | 12/2003 | Xu et al. |
| 6,656,848 B1 | 12/2003 | Scanlan et al. |
| 6,663,715 B1 | 12/2003 | Yuda et al. |
| 6,677,242 B1 | 1/2004 | Liu et al. |
| 6,679,981 B1 | 1/2004 | Pan et al. |
| 6,688,375 B1 | 2/2004 | Turner |
| 6,713,356 B1 | 3/2004 | Skotnicki et al. |
| 6,713,835 B1 | 3/2004 | Horak et al. |
| 6,717,189 B2 | 4/2004 | Inoue et al. |
| 6,720,213 B1 | 4/2004 | Gambino et al. |
| 6,736,147 B2 | 5/2004 | Satoh et al. |
| 6,736,987 B1 | 5/2004 | Cho |
| 6,740,247 B1 | 5/2004 | Han et al. |
| 6,740,585 B2 | 5/2004 | Yoon et al. |
| 6,740,977 B2 | 5/2004 | Ahn et al. |
| 6,743,473 B1 | 6/2004 | Parkhe et al. |
| 6,743,732 B1 | 6/2004 | Lin et al. |
| 6,756,235 B1 | 6/2004 | Liu et al. |
| 6,759,261 B2 | 7/2004 | Shimokohbe et al. |
| 6,762,127 B2 | 7/2004 | Boiteux et al. |
| 6,762,435 B2 | 7/2004 | Towle |
| 6,764,958 B1 | 7/2004 | Nemani et al. |
| 6,765,273 B1 | 7/2004 | Chau et al. |
| 6,767,834 B2 | 7/2004 | Chung et al. |
| 6,768,079 B2 | 7/2004 | Kosakai |
| 6,770,166 B1 | 8/2004 | Fischer |
| 6,772,827 B2 | 8/2004 | Keller et al. |
| 6,792,889 B2 | 9/2004 | Nakano et al. |
| 6,794,290 B1 | 9/2004 | Papasouliotis et al. |
| 6,794,311 B2 | 9/2004 | Huang et al. |
| 6,796,314 B1 | 9/2004 | Graff et al. |
| 6,797,189 B2 | 9/2004 | Hung et al. |
| 6,800,336 B1 | 10/2004 | Fornsel et al. |
| 6,800,830 B2 | 10/2004 | Mahawili |
| 6,802,944 B2 | 10/2004 | Ahmad et al. |
| 6,808,564 B2 | 10/2004 | Dietze |
| 6,808,747 B1 | 10/2004 | Shih et al. |
| 6,808,748 B2 | 10/2004 | Kapoor et al. |
| 6,815,633 B1 | 11/2004 | Chen et al. |
| 6,821,571 B2 | 11/2004 | Huang |
| 6,823,589 B2 | 11/2004 | White et al. |
| 6,828,241 B2 | 12/2004 | Kholodenko et al. |
| 6,830,624 B2 | 12/2004 | Janakiraman et al. |
| 6,835,995 B2 | 12/2004 | Li |
| 6,846,745 B1 | 1/2005 | Papasouliotis et al. |
| 6,849,854 B2 | 2/2005 | Sainty |
| 6,852,550 B2 | 2/2005 | Tuttle et al. |
| 6,852,584 B1 | 2/2005 | Chen et al. |
| 6,853,533 B2 | 2/2005 | Parkhe et al. |
| 6,858,153 B2 | 2/2005 | Bjorkman et al. |
| 6,861,097 B1 | 3/2005 | Goosey et al. |
| 6,861,332 B2 | 3/2005 | Park et al. |
| 6,869,880 B2 | 3/2005 | Krishnaraj et al. |
| 6,875,280 B2 | 4/2005 | Ikeda et al. |
| 6,878,206 B2 | 4/2005 | Tzu et al. |
| 6,879,981 B2 | 4/2005 | Rothschild et al. |
| 6,886,491 B2 | 5/2005 | Kim et al. |
| 6,892,669 B2 | 5/2005 | Xu et al. |
| 6,893,967 B1 | 5/2005 | Wright et al. |
| 6,897,532 B1 | 5/2005 | Schwarz et al. |
| 6,900,596 B2 | 5/2005 | Yang et al. |
| 6,903,511 B2 | 6/2005 | Chistyakov |
| 6,908,862 B2 | 6/2005 | Li et al. |
| 6,911,112 B2 | 6/2005 | An |
| 6,911,401 B2 | 6/2005 | Khandan et al. |
| 6,916,399 B1 | 7/2005 | Rozenzon et al. |
| 6,921,556 B2 | 7/2005 | Shimizu et al. |
| 6,924,191 B2 | 8/2005 | Liu et al. |
| 6,930,047 B2 | 8/2005 | Yamazaki |
| 6,935,269 B2 | 8/2005 | Lee et al. |
| 6,942,753 B2 | 9/2005 | Choi et al. |
| 6,946,033 B2 | 9/2005 | Tsuei et al. |
| 6,951,821 B2 | 10/2005 | Hamelin et al. |
| 6,958,175 B2 | 10/2005 | Sakamoto et al. |
| 6,958,286 B2 | 10/2005 | Chen et al. |
| 6,969,619 B1 | 11/2005 | Winniczek |
| 6,995,073 B2 | 2/2006 | Liou |
| 7,017,269 B2 | 3/2006 | White et al. |
| 7,018,941 B2 | 3/2006 | Cui et al. |
| 7,030,034 B2 | 4/2006 | Fucsko et al. |
| 7,037,846 B2 | 5/2006 | Srivastava et al. |
| 7,049,200 B2 | 5/2006 | Arghavani et al. |
| 7,052,553 B1 | 5/2006 | Shih et al. |
| 7,071,532 B2 | 7/2006 | Geffken et al. |
| 7,084,070 B1 | 8/2006 | Lee et al. |
| 7,115,525 B2 | 10/2006 | Abatchev et al. |
| 7,122,949 B2 | 10/2006 | Strikovski |
| 7,138,767 B2 | 11/2006 | Chen et al. |
| 7,145,725 B2 | 12/2006 | Hasel et al. |
| 7,148,155 B1 | 12/2006 | Tarafdar et al. |
| 7,166,233 B2 | 1/2007 | Johnson et al. |
| 7,183,214 B2 | 2/2007 | Nam et al. |
| 7,196,342 B2 | 3/2007 | Ershov et al. |
| 7,226,805 B2 | 6/2007 | Hallin et al. |
| 7,235,137 B2 | 6/2007 | Kitayama et al. |
| 7,244,474 B2 | 7/2007 | Hanawa et al. |
| 7,252,011 B2 | 8/2007 | Traverso |
| 7,252,716 B2 | 8/2007 | Kim et al. |
| 7,253,123 B2 | 8/2007 | Arghavani et al. |
| 7,256,370 B2 | 8/2007 | Guiver |
| 7,274,004 B2 | 9/2007 | Benjamin et al. |
| 7,288,482 B2 | 10/2007 | Panda et al. |
| 7,291,360 B2 | 11/2007 | Hanawa et al. |
| 7,316,761 B2 | 1/2008 | Doan et al. |
| 7,329,608 B2 | 2/2008 | Babayan et al. |
| 7,341,633 B2 | 3/2008 | Lubomirsky et al. |
| 7,344,912 B1 | 3/2008 | Okoroanyanwu |
| 7,358,192 B2 | 4/2008 | Merry et al. |
| 7,361,865 B2 | 4/2008 | Maki et al. |
| 7,364,956 B2 | 4/2008 | Saito |

(56) References Cited

U.S. PATENT DOCUMENTS

| | | |
|---|---|---|
| 7,365,016 B2 | 4/2008 | Ouellet et al. |
| 7,396,480 B2 | 7/2008 | Kao et al. |
| 7,396,773 B1 | 7/2008 | Blosse et al. |
| 7,416,989 B1 | 8/2008 | Liu et al. |
| 7,465,358 B2 | 12/2008 | Weidman et al. |
| 7,465,953 B1 | 12/2008 | Koh et al. |
| 7,468,319 B2 | 12/2008 | Lee |
| 7,479,303 B2 | 1/2009 | Byun et al. |
| 7,484,473 B2 | 2/2009 | Keller et al. |
| 7,488,688 B2 | 2/2009 | Seung-Pil et al. |
| 7,494,545 B2 | 2/2009 | Lam et al. |
| 7,500,445 B2 | 3/2009 | Zhao et al. |
| 7,513,214 B2 | 4/2009 | Okumura et al. |
| 7,520,957 B2 | 4/2009 | Kao et al. |
| 7,553,756 B2 | 6/2009 | Hayashi et al. |
| 7,575,007 B2 | 8/2009 | Tang et al. |
| 7,581,511 B2 | 9/2009 | Mardian et al. |
| 7,604,708 B2 | 10/2009 | Wood et al. |
| 7,611,980 B2 | 11/2009 | Wells |
| 7,628,897 B2 | 12/2009 | Mungekar et al. |
| 7,658,799 B2 | 2/2010 | Ishikawa et al. |
| 7,682,518 B2 | 3/2010 | Chandrachood et al. |
| 7,695,590 B2 | 4/2010 | Hanawa et al. |
| 7,708,859 B2 | 5/2010 | Huang et al. |
| 7,722,925 B2 | 5/2010 | White et al. |
| 7,723,221 B2 | 5/2010 | Hayashi |
| 7,749,326 B2 | 7/2010 | Kim et al. |
| 7,780,790 B2 | 8/2010 | Nogami |
| 7,785,672 B2 | 8/2010 | Choi et al. |
| 7,790,634 B2 | 9/2010 | Munro et al. |
| 7,806,077 B2 | 10/2010 | Lee et al. |
| 7,806,078 B2 | 10/2010 | Yoshida |
| 7,807,578 B2 | 10/2010 | Bencher et al. |
| 7,825,038 B2 | 11/2010 | Ingle et al. |
| 7,837,828 B2 | 11/2010 | Ikeda et al. |
| 7,845,309 B2 | 12/2010 | Condrashoff et al. |
| 7,867,926 B2 | 1/2011 | Satoh et al. |
| 7,915,139 B1 | 3/2011 | Lang et al. |
| 7,922,863 B2 | 4/2011 | Ripley |
| 7,932,181 B2 | 4/2011 | Singh et al. |
| 7,976,631 B2 | 4/2011 | Burrows |
| 7,939,422 B2 | 5/2011 | Ingle et al. |
| 7,968,441 B2 | 6/2011 | Xu |
| 7,977,249 B1 | 7/2011 | Liu |
| 7,981,806 B2 | 7/2011 | Jung |
| 7,989,365 B2 | 8/2011 | Park et al. |
| 8,008,166 B2 | 8/2011 | Sanchez et al. |
| 8,048,811 B2 | 11/2011 | Feustel et al. |
| 8,058,179 B1 | 11/2011 | Draeger et al. |
| 8,071,482 B2 | 12/2011 | Kawada |
| 8,074,599 B2 | 12/2011 | Choi et al. |
| 8,076,198 B2 | 12/2011 | Lee et al. |
| 8,083,853 B2 | 12/2011 | Choi et al. |
| 8,114,245 B2 | 2/2012 | Ohmi et al. |
| 8,119,530 B2 | 2/2012 | Hori et al. |
| 8,133,349 B1 | 3/2012 | Panagopoulos |
| 8,173,228 B2 | 5/2012 | Choi et al. |
| 8,187,486 B1 | 5/2012 | Liu et al. |
| 8,211,808 B2 | 7/2012 | Sapre et al. |
| 8,216,486 B2 | 7/2012 | Dhindsa |
| 8,222,128 B2 | 7/2012 | Sasaki et al. |
| 8,252,194 B2 | 8/2012 | Kiehlbauch et al. |
| 8,272,346 B2 | 9/2012 | Bettencourt et al. |
| 8,295,089 B2 | 10/2012 | Jeong et al. |
| 8,298,627 B2 | 10/2012 | Minami et al. |
| 8,298,959 B2 | 10/2012 | Cheshire |
| 8,309,440 B2 | 11/2012 | Sanchez et al. |
| 8,312,839 B2 | 11/2012 | Baek |
| 8,313,610 B2 | 11/2012 | Dhindsa |
| 8,328,939 B2 | 12/2012 | Choi et al. |
| 8,329,262 B2 | 12/2012 | Miller et al. |
| 8,336,188 B2 | 12/2012 | Monteen |
| 8,357,435 B2 | 1/2013 | Lubomirsky |
| 8,368,308 B2 | 2/2013 | Banna et al. |
| 8,390,980 B2 | 3/2013 | Sansoni et al. |
| 8,427,067 B2 | 4/2013 | Espiau et al. |
| 8,435,902 B2 | 5/2013 | Tang et al. |
| 8,440,523 B1 | 5/2013 | Guillorn et al. |
| 8,466,073 B2 | 6/2013 | Wang et al. |
| 8,475,674 B2 | 7/2013 | Thadani et al. |
| 8,480,850 B2 | 7/2013 | Tyler et al. |
| 8,491,805 B2 | 7/2013 | Kushibiki et al. |
| 8,501,629 B2 | 8/2013 | Tang et al. |
| 8,506,713 B2 | 8/2013 | Takagi |
| 8,512,509 B2 | 8/2013 | Bera et al. |
| 8,528,889 B2 | 9/2013 | Sansoni et al. |
| 8,540,844 B2 | 9/2013 | Hudson et al. |
| 8,551,891 B2 | 10/2013 | Liang |
| 8,573,152 B2 | 11/2013 | De La Llera |
| 8,622,021 B2 | 1/2014 | Taylor et al. |
| 8,623,148 B2 | 1/2014 | Mitchell et al. |
| 8,623,471 B2 | 1/2014 | Tyler et al. |
| 8,633,423 B2 | 1/2014 | Lin et al. |
| 8,642,481 B2 | 2/2014 | Wang et al. |
| 8,652,298 B2 | 2/2014 | Dhindsa et al. |
| 8,668,836 B2 | 3/2014 | Mizukami et al. |
| 8,679,982 B2 | 3/2014 | Wang et al. |
| 8,679,983 B2 | 3/2014 | Wang et al. |
| 8,691,023 B2 | 4/2014 | Bao et al. |
| 8,702,902 B2 | 4/2014 | Blom et al. |
| 8,741,778 B2 | 6/2014 | Yang et al. |
| 8,747,680 B1 | 6/2014 | Deshpande |
| 8,748,322 B1 | 6/2014 | Fung et al. |
| 8,765,574 B2 | 7/2014 | Zhang et al. |
| 8,771,536 B2 | 7/2014 | Zhang et al. |
| 8,771,539 B2 | 7/2014 | Zhang et al. |
| 8,772,888 B2 | 7/2014 | Jung et al. |
| 8,778,079 B2 | 7/2014 | Begarney et al. |
| 8,801,952 B1 | 8/2014 | Wang et al. |
| 8,802,572 B2 | 8/2014 | Nemani et al. |
| 8,808,563 B2 | 8/2014 | Wang et al. |
| 8,815,720 B2 | 8/2014 | Godet et al. |
| 8,846,163 B2 | 9/2014 | Kao et al. |
| 8,869,742 B2 | 10/2014 | Dhindsa |
| 8,871,651 B1 | 10/2014 | Choi et al. |
| 8,888,087 B2 | 11/2014 | Okabe et al. |
| 8,894,767 B2 | 11/2014 | Goradia et al. |
| 8,895,449 B1 | 11/2014 | Zhu et al. |
| 8,900,364 B2 | 12/2014 | Wright |
| 8,921,234 B2 | 12/2014 | Liu et al. |
| 8,927,390 B2 | 1/2015 | Sapre et al. |
| 8,932,947 B1 | 1/2015 | Han et al. |
| 8,937,017 B2 | 1/2015 | Cheshire et al. |
| 8,951,429 B1 | 2/2015 | Liu et al. |
| 8,956,980 B1 | 2/2015 | Chen et al. |
| 8,969,212 B2 | 3/2015 | Ren et al. |
| 8,970,114 B2 | 3/2015 | Busche et al. |
| 8,980,005 B2 | 3/2015 | Carlson et al. |
| 8,980,758 B1 | 3/2015 | Ling et al. |
| 8,980,763 B2 | 3/2015 | Wang et al. |
| 8,992,733 B2 | 3/2015 | Sorensen et al. |
| 8,999,656 B2 | 4/2015 | Zhang et al. |
| 8,999,839 B2 | 4/2015 | Su et al. |
| 8,999,856 B2 | 4/2015 | Zhang |
| 9,012,302 B2 | 4/2015 | Sapre et al. |
| 9,017,481 B1 | 4/2015 | Pettinger et al. |
| 9,023,732 B2 | 5/2015 | Wang et al. |
| 9,023,734 B2 | 5/2015 | Chen et al. |
| 9,034,770 B2 | 5/2015 | Park et al. |
| 9,040,422 B2 | 5/2015 | Wang et al. |
| 9,064,815 B2 | 6/2015 | Zhang et al. |
| 9,064,816 B2 | 6/2015 | Kim et al. |
| 9,072,158 B2 | 6/2015 | Ikeda et al. |
| 9,093,371 B2 | 7/2015 | Wang et al. |
| 9,093,389 B2 | 7/2015 | Nemani |
| 9,093,390 B2 | 7/2015 | Wang et al. |
| 9,111,877 B2 | 8/2015 | Chen et al. |
| 9,111,907 B2 | 8/2015 | Kamineni |
| 9,114,438 B2 | 8/2015 | Hoinkis et al. |
| 9,117,855 B2 | 8/2015 | Cho et al. |
| 9,132,436 B2 | 9/2015 | Liang et al. |
| 9,136,273 B1 | 9/2015 | Purayath et al. |
| 9,144,147 B2 | 9/2015 | Yang et al. |
| 9,153,442 B2 | 10/2015 | Wang et al. |

(56) References Cited

U.S. PATENT DOCUMENTS

| | | |
|---|---|---|
| 9,159,606 B1 | 10/2015 | Purayath et al. |
| 9,165,783 B2 | 10/2015 | Nemani et al. |
| 9,165,786 B1 | 10/2015 | Purayath et al. |
| 9,184,055 B2 | 11/2015 | Wang et al. |
| 9,190,290 B2 | 11/2015 | Xue et al. |
| 9,190,293 B2 | 11/2015 | Wang et al. |
| 9,190,302 B2 | 11/2015 | Ni |
| 9,202,708 B1 | 12/2015 | Chen et al. |
| 9,209,012 B2 | 12/2015 | Chen et al. |
| 9,236,265 B2 | 1/2016 | Korolik et al. |
| 9,236,266 B2 | 1/2016 | Zhang et al. |
| 9,240,315 B1 | 1/2016 | Hsieh et al. |
| 9,245,762 B2 | 1/2016 | Zhang et al. |
| 9,263,278 B2 | 2/2016 | Purayath et al. |
| 9,269,590 B2 | 2/2016 | Luere et al. |
| 9,275,834 B1 | 3/2016 | Park et al. |
| 9,287,095 B2 | 3/2016 | Nguyen et al. |
| 9,287,134 B2 | 3/2016 | Wang et al. |
| 9,293,568 B2 | 3/2016 | Ko |
| 9,299,537 B2 | 3/2016 | Kobayashi et al. |
| 9,299,538 B2 | 3/2016 | Kobayashi et al. |
| 9,299,575 B2 | 3/2016 | Park et al. |
| 9,299,582 B2 | 3/2016 | Ingle et al. |
| 9,299,583 B1 | 3/2016 | Wang et al. |
| 9,309,598 B2 | 4/2016 | Wang et al. |
| 9,324,576 B2 | 4/2016 | Zhang et al. |
| 9,343,272 B1 | 5/2016 | Pandit et al. |
| 9,343,327 B2 | 5/2016 | Zhange et al. |
| 9,349,605 B1 | 5/2016 | Xu et al. |
| 9,355,856 B2 | 5/2016 | Wang et al. |
| 9,355,862 B2 | 5/2016 | Pandit et al. |
| 9,355,922 B2 | 5/2016 | Park et al. |
| 9,362,163 B2 | 6/2016 | Danek et al. |
| 9,368,364 B2 | 6/2016 | Park et al. |
| 9,373,522 B1 | 6/2016 | Wang et al. |
| 9,378,969 B2 | 6/2016 | Hsu et al. |
| 9,384,997 B2 | 7/2016 | Ren et al. |
| 9,396,961 B2 | 7/2016 | Arghavani et al. |
| 9,418,858 B2 | 8/2016 | Wang et al. |
| 9,425,041 B2 | 8/2016 | Berry et al. |
| 9,425,058 B2 | 8/2016 | Kim et al. |
| 9,431,268 B2 | 8/2016 | Lill et al. |
| 9,343,358 B1 | 9/2016 | Montgomery |
| 9,437,451 B2 | 9/2016 | Chen et al. |
| 9,443,749 B2 | 9/2016 | Smith |
| 9,449,845 B2 | 9/2016 | Liu et al. |
| 9,449,846 B2 | 9/2016 | Liu et al. |
| 9,449,850 B2 | 9/2016 | Wang et al. |
| 9,460,959 B1 | 10/2016 | Xie et al. |
| 9,466,469 B2 | 10/2016 | Khaja |
| 9,472,412 B2 | 10/2016 | Zhang et al. |
| 9,472,417 B2 | 10/2016 | Ingle et al. |
| 9,478,432 B2 | 10/2016 | Chen et al. |
| 9,478,433 B1 | 10/2016 | Zhou et al. |
| 9,478,434 B2 | 10/2016 | Wang et al. |
| 9,493,879 B2 | 11/2016 | Hoinkis et al. |
| 9,496,167 B2 | 11/2016 | Purayath et al. |
| 9,499,898 B2 | 11/2016 | Nguyen et al. |
| 9,502,258 B2 | 11/2016 | Xue et al. |
| 9,508,529 B2 | 11/2016 | Valcore et al. |
| 9,520,303 B2 | 12/2016 | Wang et al. |
| 9,543,163 B2 | 1/2017 | Ling et al. |
| 9,564,296 B2 | 2/2017 | Kobayashi et al. |
| 9,564,338 B1 | 2/2017 | Zhang et al. |
| 9,576,788 B2 | 2/2017 | Liu et al. |
| 9,576,809 B2 | 2/2017 | Korolik et al. |
| 9,607,856 B2 | 3/2017 | Wang et al. |
| 9,613,822 B2 | 4/2017 | Chen et al. |
| 9,659,753 B2 | 5/2017 | Cho et al. |
| 9,659,791 B2 | 5/2017 | Wang et al. |
| 9,659,792 B2 | 5/2017 | Wang et al. |
| 9,666,449 B2 | 5/2017 | Koval et al. |
| 9,691,645 B2 | 6/2017 | Ayers |
| 9,704,723 B2 | 7/2017 | Wang et al. |
| 9,711,366 B2 | 7/2017 | Ingle et al. |
| 9,721,789 B1 | 8/2017 | Yang et al. |
| 9,728,437 B2 | 8/2017 | Tran et al. |
| 9,741,593 B2 | 8/2017 | Benjaminson et al. |
| 9,768,034 B1 | 9/2017 | Xu et al. |
| 9,773,695 B2 | 9/2017 | Purayath et al. |
| 9,779,956 B1 | 10/2017 | Zhang et al. |
| 9,822,009 B2 | 11/2017 | Kagaya et al. |
| 9,831,097 B2 | 11/2017 | Ingle et al. |
| 9,837,249 B2 | 12/2017 | Kobayashi et al. |
| 9,837,284 B2 | 12/2017 | Chen et al. |
| 9,837,286 B2 | 12/2017 | Yang et al. |
| 9,842,744 B2 | 12/2017 | Zhang et al. |
| 9,865,484 B1 | 1/2018 | Citla et al. |
| 9,881,805 B2 | 1/2018 | Li et al. |
| 9,885,117 B2 | 2/2018 | Lubomirsky et al. |
| 9,887,096 B2 | 2/2018 | Park et al. |
| 9,903,020 B2 | 2/2018 | Kim et al. |
| 9,934,942 B1 | 4/2018 | Lubomirsky |
| 9,947,549 B1 | 4/2018 | Park et al. |
| 9,966,240 B2 | 5/2018 | Park et al. |
| 9,978,564 B2 | 5/2018 | Liang et al. |
| 9,991,134 B2 | 6/2018 | Wang et al. |
| 10,026,621 B2 | 7/2018 | Ko et al. |
| 10,032,606 B2 | 7/2018 | Yang et al. |
| 10,043,674 B1 | 8/2018 | Korolik et al. |
| 10,043,684 B1 | 8/2018 | Arnepalli et al. |
| 10,049,891 B1 | 8/2018 | Wang et al. |
| 10,062,578 B2 | 8/2018 | Zhang et al. |
| 10,062,579 B2 | 8/2018 | Chen et al. |
| 10,062,585 B2 | 8/2018 | Lubomirsky |
| 10,062,587 B2 | 8/2018 | Chen et al. |
| 2001/0006093 A1* | 7/2001 | Tabuchi ............... C23C 16/24 156/345.43 |
| 2001/0008803 A1 | 7/2001 | Takamatsu et al. |
| 2001/0015175 A1 | 8/2001 | Masuda et al. |
| 2001/0015261 A1 | 8/2001 | Kobayashi et al. |
| 2001/0028093 A1 | 10/2001 | Yamazaki et al. |
| 2001/0028922 A1 | 10/2001 | Sandhu |
| 2001/0029891 A1 | 10/2001 | Oh et al. |
| 2001/0030366 A1 | 10/2001 | Nakano et al. |
| 2001/0034106 A1 | 10/2001 | Moise et al. |
| 2001/0034121 A1 | 10/2001 | Fu et al. |
| 2001/0035124 A1 | 11/2001 | Okayama et al. |
| 2001/0036706 A1 | 11/2001 | Kitamura |
| 2001/0037856 A1 | 11/2001 | Park |
| 2001/0037941 A1 | 11/2001 | Thompson |
| 2001/0039921 A1 | 11/2001 | Rolfson et al. |
| 2001/0041444 A1 | 11/2001 | Shields et al. |
| 2001/0042512 A1 | 11/2001 | Xu et al. |
| 2001/0047760 A1 | 12/2001 | Moslehi |
| 2001/0053585 A1 | 12/2001 | Kikuchi et al. |
| 2001/0053610 A1 | 12/2001 | Athavale |
| 2001/0054381 A1 | 12/2001 | Umotoy et al. |
| 2001/0054387 A1 | 12/2001 | Frankel et al. |
| 2001/0055842 A1 | 12/2001 | Uh et al. |
| 2002/0000202 A1 | 1/2002 | Yuda et al. |
| 2002/0001778 A1 | 1/2002 | Latchford et al. |
| 2002/0009560 A1 | 1/2002 | Ozono |
| 2002/0009885 A1 | 1/2002 | Brankner et al. |
| 2002/0011210 A1 | 1/2002 | Satoh et al. |
| 2002/0011214 A1 | 1/2002 | Kamarehi et al. |
| 2002/0016080 A1 | 2/2002 | Khan et al. |
| 2002/0016085 A1 | 2/2002 | Huang et al. |
| 2002/0023899 A1 | 2/2002 | Khater et al. |
| 2002/0028582 A1 | 3/2002 | Nallan et al. |
| 2002/0028585 A1 | 3/2002 | Chung et al. |
| 2002/0029747 A1 | 3/2002 | Powell et al. |
| 2002/0033233 A1 | 3/2002 | Savas |
| 2002/0036143 A1 | 3/2002 | Segawa et al. |
| 2002/0040764 A1 | 4/2002 | Kwan et al. |
| 2002/0040766 A1 | 4/2002 | Takahashi |
| 2002/0043690 A1 | 4/2002 | Doyle et al. |
| 2002/0045966 A1 | 4/2002 | Lee et al. |
| 2002/0046991 A1* | 4/2002 | Smith ............... H01J 37/321 219/121.57 |
| 2002/0054962 A1 | 5/2002 | Huang |
| 2002/0062954 A1 | 5/2002 | Getchel et al. |
| 2002/0069820 A1 | 6/2002 | Yudovsky |
| 2002/0070414 A1 | 6/2002 | Drescher et al. |

(56) References Cited

U.S. PATENT DOCUMENTS

| | | |
|---|---|---|
| 2002/0074573 A1 | 6/2002 | Takeuchi et al. |
| 2002/0086501 A1 | 7/2002 | O'Donnell et al. |
| 2002/0090781 A1 | 7/2002 | Skotnicki et al. |
| 2002/0090835 A1 | 7/2002 | Chakravarti et al. |
| 2002/0094378 A1 | 7/2002 | O'Donnell |
| 2002/0094591 A1 | 7/2002 | Sill et al. |
| 2002/0096493 A1 | 7/2002 | Hattori |
| 2002/0098681 A1 | 7/2002 | Hu et al. |
| 2002/0106845 A1 | 8/2002 | Chao et al. |
| 2002/0112819 A1 | 8/2002 | Kamarehi et al. |
| 2002/0124867 A1 | 9/2002 | Kim et al. |
| 2002/0129769 A1 | 9/2002 | Kim et al. |
| 2002/0129902 A1 | 9/2002 | Babayan et al. |
| 2002/0144657 A1 | 10/2002 | Chiang et al. |
| 2002/0153808 A1 | 10/2002 | Skotnicki et al. |
| 2002/0164885 A1 | 11/2002 | Lill et al. |
| 2002/0170678 A1 | 11/2002 | Hayashi et al. |
| 2002/0177322 A1 | 11/2002 | Li et al. |
| 2002/0179248 A1 | 12/2002 | Kabansky et al. |
| 2002/0182878 A1 | 12/2002 | Hirose et al. |
| 2002/0187280 A1 | 12/2002 | Johnson et al. |
| 2002/0187655 A1 | 12/2002 | Tan et al. |
| 2003/0000647 A1 | 1/2003 | Yudovsky et al. |
| 2003/0003757 A1 | 1/2003 | Naltan et al. |
| 2003/0007910 A1 | 1/2003 | Lazarovich et al. |
| 2003/0010645 A1 | 1/2003 | Ting et al. |
| 2003/0019428 A1 | 1/2003 | Ku et al. |
| 2003/0019580 A1 | 1/2003 | Strang |
| 2003/0026060 A1 | 2/2003 | Hiramatsu et al. |
| 2003/0029566 A1 | 2/2003 | Roth |
| 2003/0029567 A1 | 2/2003 | Dhindsa et al. |
| 2003/0029715 A1 | 2/2003 | Yu et al. |
| 2003/0031905 A1 | 2/2003 | Saito et al. |
| 2003/0032284 A1 | 2/2003 | Enomoto et al. |
| 2003/0038127 A1 | 2/2003 | Liu et al. |
| 2003/0038305 A1 | 2/2003 | Wasshuber |
| 2003/0054608 A1 | 3/2003 | Tseng et al. |
| 2003/0066482 A1 | 4/2003 | Pokharna et al. |
| 2003/0071035 A1 | 4/2003 | Brailove |
| 2003/0072639 A1 | 4/2003 | White et al. |
| 2003/0075808 A1 | 4/2003 | Inoue et al. |
| 2003/0077857 A1 | 4/2003 | Xia et al. |
| 2003/0077909 A1 | 4/2003 | Jiwari |
| 2003/0079686 A1 | 5/2003 | Chen et al. |
| 2003/0087488 A1 | 5/2003 | Fink |
| 2003/0087531 A1 | 5/2003 | Kang et al. |
| 2003/0091938 A1 | 5/2003 | Fairbairn et al. |
| 2003/0094134 A1 | 5/2003 | Minami et al. |
| 2003/0098125 A1 | 5/2003 | An |
| 2003/0109143 A1 | 6/2003 | Hsieh et al. |
| 2003/0116087 A1 | 6/2003 | Nguyen et al. |
| 2003/0116439 A1 | 6/2003 | Seo et al. |
| 2003/0121608 A1 | 7/2003 | Chen et al. |
| 2003/0121609 A1 | 7/2003 | Ohmi et al. |
| 2003/0124465 A1 | 7/2003 | Lee et al. |
| 2003/0124842 A1 | 7/2003 | Hytros et al. |
| 2003/0127049 A1 | 7/2003 | Han et al. |
| 2003/0127740 A1 | 7/2003 | Hsu et al. |
| 2003/0129106 A1 | 7/2003 | Sorensen et al. |
| 2003/0129827 A1 | 7/2003 | Lee et al. |
| 2003/0129850 A1 | 7/2003 | Olgado et al. |
| 2003/0132319 A1 | 7/2003 | Hytros et al. |
| 2003/0140844 A1 | 7/2003 | Maa et al. |
| 2003/0141018 A1 | 7/2003 | Stevens et al. |
| 2003/0143328 A1 | 7/2003 | Chen et al. |
| 2003/0148035 A1 | 8/2003 | Lingampalli |
| 2003/0150530 A1 | 8/2003 | Lin et al. |
| 2003/0152691 A1 | 8/2003 | Baude |
| 2003/0159307 A1 | 8/2003 | Sago et al. |
| 2003/0164226 A1 | 9/2003 | Kanno et al. |
| 2003/0168439 A1 | 9/2003 | Kanno et al. |
| 2003/0170945 A1 | 9/2003 | Igeta et al. |
| 2003/0173333 A1 | 9/2003 | Wang et al. |
| 2003/0173347 A1 | 9/2003 | Guiver |
| 2003/0173675 A1 | 9/2003 | Watanabe |
| 2003/0181040 A1 | 9/2003 | Ivanov et al. |
| 2003/0183244 A1 | 10/2003 | Rossman |
| 2003/0190426 A1 | 10/2003 | Padhi et al. |
| 2003/0196760 A1 | 10/2003 | Tyler et al. |
| 2003/0199170 A1 | 10/2003 | Li |
| 2003/0200929 A1 | 10/2003 | Otsuki |
| 2003/0205329 A1 | 11/2003 | Gujer et al. |
| 2003/0205479 A1 | 11/2003 | Lin et al. |
| 2003/0209323 A1 | 11/2003 | Yokogaki et al. |
| 2003/0215570 A1 | 11/2003 | Seutter et al. |
| 2003/0215963 A1 | 11/2003 | AmRhein et al. |
| 2003/0216044 A1 | 11/2003 | Lin et al. |
| 2003/0221780 A1 | 12/2003 | Lei et al. |
| 2003/0224217 A1 | 12/2003 | Byun et al. |
| 2003/0224617 A1 | 12/2003 | Baek et al. |
| 2003/0230385 A1 | 12/2003 | Bach et al. |
| 2004/0003828 A1 | 1/2004 | Jackson |
| 2004/0005726 A1 | 1/2004 | Huang |
| 2004/0018304 A1 | 1/2004 | Chung et al. |
| 2004/0020801 A1 | 2/2004 | Zhao et al. |
| 2004/0026371 A1 | 2/2004 | Nguyen et al. |
| 2004/0033678 A1 | 2/2004 | Arghavani et al. |
| 2004/0033684 A1 | 2/2004 | Li |
| 2004/0050328 A1 | 3/2004 | Kumagai et al. |
| 2004/0058070 A1 | 3/2004 | Takeuchi et al. |
| 2004/0058293 A1 | 3/2004 | Nguyen et al. |
| 2004/0060514 A1 | 4/2004 | Janakiraman et al. |
| 2004/0061447 A1 | 4/2004 | Saigusa et al. |
| 2004/0069225 A1 | 4/2004 | Fairbairn et al. |
| 2004/0070346 A1 | 4/2004 | Choi |
| 2004/0072446 A1 | 4/2004 | Liu et al. |
| 2004/0076529 A1 | 4/2004 | Gnauck et al. |
| 2004/0083967 A1 | 5/2004 | Yuda et al. |
| 2004/0087139 A1 | 5/2004 | Yeh et al. |
| 2004/0092063 A1 | 5/2004 | Okumura |
| 2004/0099285 A1 | 5/2004 | Wange et al. |
| 2004/0099378 A1 | 5/2004 | Kim et al. |
| 2004/0101667 A1 | 5/2004 | O'Loughlin et al. |
| 2004/0107908 A1* | 6/2004 | Collins .............. H01J 37/32082 118/723 I |
| 2004/0108067 A1 | 6/2004 | Fischione et al. |
| 2004/0108068 A1 | 6/2004 | Senzaki et al. |
| 2004/0115876 A1 | 6/2004 | Goundar et al. |
| 2004/0124280 A1 | 7/2004 | Shih et al. |
| 2004/0129671 A1 | 7/2004 | Ji et al. |
| 2004/0137161 A1 | 7/2004 | Segawa et al. |
| 2004/0140053 A1 | 7/2004 | Srivastava et al. |
| 2004/0144311 A1 | 7/2004 | Chen et al. |
| 2004/0144490 A1 | 7/2004 | Zhao et al. |
| 2004/0147126 A1 | 7/2004 | Yamashita et al. |
| 2004/0149223 A1 | 8/2004 | Collison et al. |
| 2004/0149394 A1 | 8/2004 | Doan et al. |
| 2004/0152342 A1 | 8/2004 | Li |
| 2004/0154535 A1 | 8/2004 | Chen et al. |
| 2004/0157444 A1 | 8/2004 | Chiu |
| 2004/0161921 A1 | 8/2004 | Ryu |
| 2004/0175913 A1 | 9/2004 | Johnson et al. |
| 2004/0175929 A1 | 9/2004 | Schmitt et al. |
| 2004/0182315 A1 | 9/2004 | Laflamme et al. |
| 2004/0187787 A1 | 9/2004 | Dawson |
| 2004/0192032 A1 | 9/2004 | Ohmori et al. |
| 2004/0194799 A1 | 10/2004 | Kim et al. |
| 2004/0195216 A1 | 10/2004 | Strang |
| 2004/0200499 A1 | 10/2004 | Harvey |
| 2004/0211357 A1 | 10/2004 | Gadgil et al. |
| 2004/0219723 A1 | 11/2004 | Peng et al. |
| 2004/0219737 A1 | 11/2004 | Quon |
| 2004/0219789 A1 | 11/2004 | Wood et al. |
| 2004/0221809 A1 | 11/2004 | Ohmi et al. |
| 2004/0231706 A1 | 11/2004 | Bhatnagar et al. |
| 2004/0237897 A1 | 12/2004 | Hanawa et al. |
| 2004/0263827 A1 | 12/2004 | Xu |
| 2005/0001276 A1 | 1/2005 | Gao et al. |
| 2005/0003676 A1 | 1/2005 | Ho et al. |
| 2005/0009340 A1 | 1/2005 | Saijo et al. |
| 2005/0009358 A1 | 1/2005 | Choi et al. |
| 2005/0026430 A1 | 2/2005 | Kim et al. |
| 2005/0026431 A1 | 2/2005 | Kazumi et al. |
| 2005/0035455 A1 | 2/2005 | Hu et al. |

(56) References Cited

U.S. PATENT DOCUMENTS

| | | |
|---|---|---|
| 2005/0039679 A1 | 2/2005 | Kleshock |
| 2005/0051094 A1 | 3/2005 | Schaepkens et al. |
| 2005/0056218 A1 | 3/2005 | Sun et al. |
| 2005/0073051 A1 | 4/2005 | Yamamoto et al. |
| 2005/0079706 A1 | 4/2005 | Kumar et al. |
| 2005/0085031 A1 | 4/2005 | Lopatin et al. |
| 2005/0087517 A1 | 4/2005 | Ott et al. |
| 2005/0090078 A1 | 4/2005 | Ishihara |
| 2005/0090120 A1 | 4/2005 | Hasegawa et al. |
| 2005/0098111 A1 | 5/2005 | Shimizu et al. |
| 2005/0101130 A1 | 5/2005 | Lopatin et al. |
| 2005/0103267 A1 | 5/2005 | Hur et al. |
| 2005/0105991 A1 | 5/2005 | Hofmeister et al. |
| 2005/0109279 A1 | 5/2005 | Suzuki |
| 2005/0112876 A1 | 5/2005 | Wu |
| 2005/0112901 A1 | 5/2005 | Ji et al. |
| 2005/0123690 A1 | 6/2005 | Derderian et al. |
| 2005/0136188 A1 | 6/2005 | Chang |
| 2005/0145341 A1 | 7/2005 | Suzuki |
| 2005/0164479 A1 | 7/2005 | Perng et al. |
| 2005/0167394 A1 | 8/2005 | Liu et al. |
| 2005/0176258 A1 | 8/2005 | Hirose et al. |
| 2005/0178746 A1 | 8/2005 | Gorin |
| 2005/0181588 A1 | 8/2005 | Kim |
| 2005/0183666 A1 | 8/2005 | Tsuji et al. |
| 2005/0194094 A1 | 9/2005 | Yasaka |
| 2005/0196967 A1 | 9/2005 | Savas et al. |
| 2005/0199489 A1 | 9/2005 | Stevens et al. |
| 2005/0205110 A1 | 9/2005 | Kao et al. |
| 2005/0205862 A1 | 9/2005 | Koemtzopoulos et al. |
| 2005/0208215 A1 | 9/2005 | Eguchi et al. |
| 2005/0208217 A1 | 9/2005 | Shinriki et al. |
| 2005/0214477 A1 | 9/2005 | Hanawa et al. |
| 2005/0218507 A1 | 10/2005 | Kao et al. |
| 2005/0219786 A1 | 10/2005 | Brown et al. |
| 2005/0221552 A1 | 10/2005 | Kao et al. |
| 2005/0224181 A1 | 10/2005 | Merry et al. |
| 2005/0229848 A1 | 10/2005 | Shinriki et al. |
| 2005/0230350 A1 | 10/2005 | Kao et al. |
| 2005/0236694 A1 | 10/2005 | Wu et al. |
| 2005/0238807 A1 | 10/2005 | Lin et al. |
| 2005/0239282 A1 | 10/2005 | Chen et al. |
| 2005/0251990 A1 | 11/2005 | Choi et al. |
| 2005/0266622 A1 | 12/2005 | Arghavani et al. |
| 2005/0266650 A1 | 12/2005 | Ahn et al. |
| 2005/0266691 A1 | 12/2005 | Gu et al. |
| 2005/0269030 A1 | 12/2005 | Kent et al. |
| 2005/0274324 A1 | 12/2005 | Takahashi et al. |
| 2005/0279454 A1 | 12/2005 | Snijders |
| 2005/0283321 A1 | 12/2005 | Yue et al. |
| 2005/0287688 A1 | 12/2005 | Won et al. |
| 2005/0287771 A1 | 12/2005 | Seamons et al. |
| 2006/0000802 A1 | 1/2006 | Kumar et al. |
| 2006/0000805 A1 | 1/2006 | Todorow et al. |
| 2006/0005856 A1 | 1/2006 | Sun et al. |
| 2006/0005930 A1 | 1/2006 | Ikeda et al. |
| 2006/0006057 A1 | 1/2006 | Laermer |
| 2006/0008676 A1 | 1/2006 | Ebata et al. |
| 2006/0011298 A1 | 1/2006 | Lim et al. |
| 2006/0011299 A1 | 1/2006 | Condrashoff et al. |
| 2006/0016783 A1 | 1/2006 | Wu et al. |
| 2006/0019456 A1 | 1/2006 | Bu et al. |
| 2006/0019477 A1 | 1/2006 | Hanawa et al. |
| 2006/0019486 A1 | 1/2006 | Yu et al. |
| 2006/0021574 A1 | 2/2006 | Armour et al. |
| 2006/0021701 A1 | 2/2006 | Tobe et al. |
| 2006/0021703 A1 | 2/2006 | Umotoy et al. |
| 2006/0024954 A1 | 2/2006 | Wu et al. |
| 2006/0024956 A1 | 2/2006 | Zhijian et al. |
| 2006/0033678 A1 | 2/2006 | Lubomirsky et al. |
| 2006/0040055 A1 | 2/2006 | Nguyen et al. |
| 2006/0043066 A1 | 3/2006 | Kamp |
| 2006/0046412 A1 | 3/2006 | Nguyen et al. |
| 2006/0046419 A1 | 3/2006 | Sandhu et al. |
| 2006/0046470 A1 | 3/2006 | Becknell et al. |
| 2006/0051966 A1 | 3/2006 | Or et al. |
| 2006/0051968 A1 | 3/2006 | Joshi et al. |
| 2006/0054184 A1 | 3/2006 | Mozetic et al. |
| 2006/0057828 A1 | 3/2006 | Omura et al. |
| 2006/0060942 A1 | 3/2006 | Minixhofer et al. |
| 2006/0065629 A1 | 3/2006 | Chen et al. |
| 2006/0073349 A1 | 4/2006 | Aihara et al. |
| 2006/0076108 A1 | 4/2006 | Holland et al. |
| 2006/0087644 A1 | 4/2006 | McMillin et al. |
| 2006/0090700 A1 | 5/2006 | Satoh et al. |
| 2006/0093756 A1 | 5/2006 | Rajagopalan et al. |
| 2006/0097397 A1 | 5/2006 | Russell et al. |
| 2006/0102076 A1 | 5/2006 | Smith et al. |
| 2006/0102587 A1 | 5/2006 | Kimura |
| 2006/0118178 A1 | 6/2006 | Desbiolles et al. |
| 2006/0118240 A1 | 6/2006 | Holber et al. |
| 2006/0121724 A1 | 6/2006 | Yue et al. |
| 2006/0124151 A1 | 6/2006 | Yamasaki et al. |
| 2006/0124242 A1 | 6/2006 | Kanarik et al. |
| 2006/0130971 A1 | 6/2006 | Chang et al. |
| 2006/0151115 A1 | 7/2006 | Kim et al. |
| 2006/0157449 A1 | 7/2006 | Takahashi et al. |
| 2006/0162661 A1 | 7/2006 | Jung et al. |
| 2006/0166107 A1 | 7/2006 | Chen et al. |
| 2006/0166515 A1 | 7/2006 | Karim et al. |
| 2006/0169327 A1 | 8/2006 | Shajii et al. |
| 2006/0169410 A1 | 8/2006 | Maeda et al. |
| 2006/0178008 A1 | 8/2006 | Yeh et al. |
| 2006/0183270 A1 | 8/2006 | Humpston |
| 2006/0185592 A1 | 8/2006 | Matsuura |
| 2006/0191479 A1 | 8/2006 | Mizukami et al. |
| 2006/0191637 A1 | 8/2006 | Zajac et al. |
| 2006/0207504 A1 | 9/2006 | Hasebe et al. |
| 2006/0207595 A1 | 9/2006 | Ohmi et al. |
| 2006/0207971 A1 | 9/2006 | Moriya et al. |
| 2006/0210723 A1 | 9/2006 | Ishizaka |
| 2006/0215347 A1 | 9/2006 | Wakabayashi et al. |
| 2006/0216878 A1 | 9/2006 | Lee |
| 2006/0219360 A1 | 10/2006 | Iwasaki |
| 2006/0222481 A1 | 10/2006 | Foree |
| 2006/0226121 A1 | 10/2006 | Aoi |
| 2006/0228889 A1 | 10/2006 | Edelberg et al. |
| 2006/0240661 A1 | 10/2006 | Annapragada et al. |
| 2006/0244107 A1 | 11/2006 | Sugihara |
| 2006/0245852 A1 | 11/2006 | Iwabuchi |
| 2006/0246717 A1 | 11/2006 | Weidman et al. |
| 2006/0251800 A1 | 11/2006 | Weidman et al. |
| 2006/0251801 A1 | 11/2006 | Weidman et al. |
| 2006/0252252 A1 | 11/2006 | Zhu et al. |
| 2006/0252265 A1 | 11/2006 | Jin et al. |
| 2006/0254716 A1 | 11/2006 | Mosden et al. |
| 2006/0260750 A1 | 11/2006 | Rueger |
| 2006/0261490 A1 | 11/2006 | Su et al. |
| 2006/0264043 A1 | 11/2006 | Stewart et al. |
| 2006/0266288 A1 | 11/2006 | Choi |
| 2006/0286774 A1 | 12/2006 | Singh et al. |
| 2006/0289384 A1 | 12/2006 | Pavel et al. |
| 2006/0292846 A1 | 12/2006 | Pinto et al. |
| 2007/0004201 A1 | 1/2007 | Lubomirsky et al. |
| 2007/0022952 A1 | 2/2007 | Ritchie et al. |
| 2007/0025907 A1 | 2/2007 | Rezeq |
| 2007/0039548 A1 | 2/2007 | Johnson |
| 2007/0048977 A1 | 3/2007 | Lee et al. |
| 2007/0051471 A1 | 3/2007 | Kawaguchi et al. |
| 2007/0056925 A1 | 3/2007 | Liu et al. |
| 2007/0062453 A1 | 3/2007 | Ishikawa |
| 2007/0066084 A1 | 3/2007 | Wajda et al. |
| 2007/0071888 A1 | 3/2007 | Shanmugasundram et al. |
| 2007/0072408 A1 | 3/2007 | Enomoto et al. |
| 2007/0077737 A1 | 4/2007 | Kobayashi |
| 2007/0079758 A1 | 4/2007 | Holland et al. |
| 2007/0090325 A1 | 4/2007 | Hwang et al. |
| 2007/0099428 A1 | 5/2007 | Shamiryan et al. |
| 2007/0099431 A1 | 5/2007 | Li |
| 2007/0099438 A1 | 5/2007 | Ye et al. |
| 2007/0107750 A1 | 5/2007 | Sawin et al. |
| 2007/0108404 A1 | 5/2007 | Stewart et al. |
| 2007/0111519 A1 | 5/2007 | Lubomirsky et al. |
| 2007/0117396 A1 | 5/2007 | Wu et al. |

(56) References Cited

U.S. PATENT DOCUMENTS

| | | |
|---|---|---|
| 2007/0119370 A1 | 5/2007 | Ma et al. |
| 2007/0119371 A1 | 5/2007 | Ma et al. |
| 2007/0123051 A1 | 5/2007 | Arghavani et al. |
| 2007/0128864 A1 | 6/2007 | Ma |
| 2007/0131274 A1 | 6/2007 | Stollwerck et al. |
| 2007/0145023 A1 | 6/2007 | Holber et al. |
| 2007/0154838 A1 | 7/2007 | Lee |
| 2007/0163440 A1 | 7/2007 | Kim et al. |
| 2007/0175861 A1 | 8/2007 | Hwang et al. |
| 2007/0181057 A1 | 8/2007 | Lam et al. |
| 2007/0193515 A1 | 8/2007 | Jeon et al. |
| 2007/0197028 A1 | 8/2007 | Byun et al. |
| 2007/0207275 A1 | 9/2007 | Nowak et al. |
| 2007/0212288 A1 | 9/2007 | Holst |
| 2007/0221620 A1 | 9/2007 | Sakthivel et al. |
| 2007/0227554 A1 | 10/2007 | Satoh et al. |
| 2007/0231109 A1 | 10/2007 | Pak et al. |
| 2007/0232071 A1 | 10/2007 | Balseanu et al. |
| 2007/0238199 A1 | 10/2007 | Yamashita |
| 2007/0238321 A1 | 10/2007 | Futase et al. |
| 2007/0243685 A1 | 10/2007 | Jiang et al. |
| 2007/0243714 A1 | 10/2007 | Shin et al. |
| 2007/0235134 A1 | 11/2007 | Iimuro |
| 2007/0254169 A1 | 11/2007 | Kamins et al. |
| 2007/0259467 A1 | 11/2007 | Tweet et al. |
| 2007/0264820 A1 | 11/2007 | Liu |
| 2007/0266946 A1 | 11/2007 | Choi |
| 2007/0277734 A1 | 12/2007 | Lubomirsky et al. |
| 2007/0280816 A1 | 12/2007 | Kurita et al. |
| 2007/0281106 A1 | 12/2007 | Lubomirsky et al. |
| 2007/0287292 A1 | 12/2007 | Li et al. |
| 2007/0289534 A1 | 12/2007 | Lubomirsky et al. |
| 2007/0296967 A1 | 12/2007 | Gupta et al. |
| 2007/0298585 A1 | 12/2007 | Lubomirsky et al. |
| 2008/0003836 A1 | 1/2008 | Nishimura et al. |
| 2008/0017104 A1 | 1/2008 | Matyushkin et al. |
| 2008/0020570 A1 | 1/2008 | Naik |
| 2008/0035608 A1 | 2/2008 | Thomas et al. |
| 2008/0044593 A1 | 2/2008 | Seo et al. |
| 2008/0044990 A1 | 2/2008 | Lee |
| 2008/0050538 A1 | 2/2008 | Hirata |
| 2008/0063810 A1 | 3/2008 | Park et al. |
| 2008/0075668 A1 | 3/2008 | Goldstein |
| 2008/0081483 A1 | 4/2008 | Wu |
| 2008/0085604 A1 | 4/2008 | Hoshino et al. |
| 2008/0099147 A1 | 5/2008 | Myo et al. |
| 2008/0099431 A1 | 5/2008 | Kumar et al. |
| 2008/0099876 A1 | 5/2008 | Seto |
| 2008/0100222 A1 | 5/2008 | Lewington et al. |
| 2008/0102570 A1 | 5/2008 | Fisher et al. |
| 2008/0102640 A1 | 5/2008 | Hassan et al. |
| 2008/0104782 A1 | 5/2008 | Hughes |
| 2008/0105555 A1 | 5/2008 | Iwazaki et al. |
| 2008/0115726 A1 | 5/2008 | Ingle et al. |
| 2008/0121970 A1 | 5/2008 | Aritome |
| 2008/0124937 A1 | 5/2008 | Xu et al. |
| 2008/0142831 A1 | 6/2008 | Hua et al. |
| 2008/0153306 A1 | 6/2008 | Cho et al. |
| 2008/0156771 A1 | 7/2008 | Jeon et al. |
| 2008/0157225 A1 | 7/2008 | Datta et al. |
| 2008/0160210 A1 | 7/2008 | Yang et al. |
| 2008/0169588 A1 | 7/2008 | Shih et al. |
| 2008/0171407 A1 | 7/2008 | Nakabayashi et al. |
| 2008/0173906 A1 | 7/2008 | Zhu |
| 2008/0176412 A1 | 7/2008 | Komeda |
| 2008/0178797 A1 | 7/2008 | Fodor et al. |
| 2008/0178805 A1 | 7/2008 | Paterson et al. |
| 2008/0182381 A1 | 7/2008 | Kiyotoshi |
| 2008/0182382 A1 | 7/2008 | Ingle et al. |
| 2008/0182383 A1 | 7/2008 | Lee et al. |
| 2008/0185284 A1 | 8/2008 | Chen et al. |
| 2008/0188090 A1 | 8/2008 | Chen et al. |
| 2008/0196666 A1 | 8/2008 | Toshima |
| 2008/0202688 A1 | 8/2008 | Wu et al. |
| 2008/0202892 A1 | 8/2008 | Smith et al. |
| 2008/0216901 A1 | 9/2008 | Chamberlain et al. |
| 2008/0216958 A1 | 9/2008 | Goto et al. |
| 2008/0230519 A1 | 9/2008 | Takahashi |
| 2008/0233709 A1 | 9/2008 | Conti et al. |
| 2008/0236751 A1 | 10/2008 | Aramaki et al. |
| 2008/0254635 A1 | 10/2008 | Benzel et al. |
| 2008/0261404 A1 | 10/2008 | Kozuka et al. |
| 2008/0264337 A1 | 10/2008 | Sano et al. |
| 2008/0268645 A1 | 10/2008 | Kao et al. |
| 2008/0292798 A1 | 11/2008 | Huh et al. |
| 2008/0293248 A1 | 11/2008 | Park et al. |
| 2009/0000743 A1 | 1/2009 | Iizuka |
| 2009/0001480 A1 | 1/2009 | Cheng |
| 2009/0004849 A1 | 1/2009 | Eun |
| 2009/0004873 A1 | 1/2009 | Yang |
| 2009/0014127 A1 | 1/2009 | Shah et al. |
| 2009/0014323 A1 | 1/2009 | Yendler et al. |
| 2009/0014324 A1 | 1/2009 | Kawaguchi et al. |
| 2009/0017227 A1 | 1/2009 | Fu et al. |
| 2009/0034147 A1 | 2/2009 | Narendrnath et al. |
| 2009/0034148 A1 | 2/2009 | Lubomirsky et al. |
| 2009/0034149 A1 | 2/2009 | Lubomirsky et al. |
| 2009/0036292 A1 | 2/2009 | Sun et al. |
| 2009/0045167 A1 | 2/2009 | Maruyama |
| 2009/0072401 A1 | 3/2009 | Arnold et al. |
| 2009/0081878 A1 | 3/2009 | Dhindsa |
| 2009/0084317 A1 | 4/2009 | Wu et al. |
| 2009/0087960 A1 | 4/2009 | Cho et al. |
| 2009/0087979 A1 | 4/2009 | Raghuram |
| 2009/0095222 A1 | 4/2009 | Tam et al. |
| 2009/0095621 A1 | 4/2009 | Kao et al. |
| 2009/0098276 A1 | 4/2009 | Burrows |
| 2009/0098706 A1 | 4/2009 | Kim et al. |
| 2009/0104738 A1 | 4/2009 | Ring et al. |
| 2009/0104782 A1 | 4/2009 | Lu et al. |
| 2009/0104789 A1 | 4/2009 | Mallick et al. |
| 2009/0111280 A1 | 4/2009 | Kao et al. |
| 2009/0117270 A1 | 5/2009 | Yamasaki et al. |
| 2009/0120368 A1 | 5/2009 | Lubomirsky et al. |
| 2009/0120464 A1 | 5/2009 | Rasheed et al. |
| 2009/0120584 A1 | 5/2009 | Lubomirsky et al. |
| 2009/0162647 A1 | 6/2009 | Sun et al. |
| 2009/0170221 A1 | 7/2009 | Jacques et al. |
| 2009/0170331 A1 | 7/2009 | Cheng et al. |
| 2009/0179300 A1 | 7/2009 | Arai |
| 2009/0189246 A1 | 7/2009 | Wu et al. |
| 2009/0189287 A1 | 7/2009 | Yang et al. |
| 2009/0191711 A1 | 7/2009 | Rui et al. |
| 2009/0194233 A1 | 8/2009 | Tamura |
| 2009/0194810 A1 | 8/2009 | Kiyotoshi et al. |
| 2009/0197418 A1 | 8/2009 | Sago et al. |
| 2009/0202721 A1 | 8/2009 | Nogami et al. |
| 2009/0214825 A1 | 8/2009 | Sun et al. |
| 2009/0223928 A1 | 9/2009 | Colpo |
| 2009/0236314 A1 | 9/2009 | Chen |
| 2009/0255902 A1 | 10/2009 | Satoh et al. |
| 2009/0258162 A1 | 10/2009 | Furuta et al. |
| 2009/0261276 A1 | 10/2009 | Lubomirsky et al. |
| 2009/0266299 A1 | 10/2009 | Rasheed et al. |
| 2009/0269934 A1 | 10/2009 | Kao et al. |
| 2009/0274590 A1 | 11/2009 | Willwerth et al. |
| 2009/0275146 A1 | 11/2009 | Takano et al. |
| 2009/0275205 A1 | 11/2009 | Kiehlbauch et al. |
| 2009/0275206 A1 | 11/2009 | Katz et al. |
| 2009/0277587 A1 | 11/2009 | Lubomirsky et al. |
| 2009/0277874 A1 | 11/2009 | Rui et al. |
| 2009/0280650 A1 | 11/2009 | Lubomirsky et al. |
| 2009/0283217 A1 | 11/2009 | Lubomirsky et al. |
| 2009/0286400 A1 | 11/2009 | Heo et al. |
| 2009/0286405 A1 | 11/2009 | Okesaku et al. |
| 2009/0317978 A1 | 11/2009 | Higashi |
| 2009/0293809 A1 | 12/2009 | Cho et al. |
| 2009/0294898 A1 | 12/2009 | Feustel et al. |
| 2009/0320756 A1 | 12/2009 | Tanaka |
| 2010/0000683 A1 | 1/2010 | Kadkhodayan et al. |
| 2010/0003824 A1 | 1/2010 | Kadkhodayan et al. |
| 2010/0006032 A1 | 1/2010 | Hinckley et al. |
| 2010/0006543 A1 | 1/2010 | Sawada et al. |
| 2010/0022030 A1 | 1/2010 | Ditizio |

(56) References Cited

U.S. PATENT DOCUMENTS

| | | |
|---|---|---|
| 2010/0025370 A1 | 2/2010 | Dieguez-Campo et al. |
| 2010/0039747 A1 | 2/2010 | Sansoni |
| 2010/0041207 A1 | 2/2010 | Lee et al. |
| 2010/0047080 A1 | 2/2010 | Bruce |
| 2010/0048027 A1 | 2/2010 | Cheng et al. |
| 2010/0048028 A1 | 2/2010 | Rasheed et al. |
| 2010/0055408 A1 | 3/2010 | Lee et al. |
| 2010/0055917 A1 | 3/2010 | Kim |
| 2010/0059889 A1 | 3/2010 | Gosset et al. |
| 2010/0062603 A1 | 3/2010 | Ganguly et al. |
| 2010/0075503 A1 | 3/2010 | Bencher |
| 2010/0081285 A1 | 4/2010 | Chen et al. |
| 2010/0093151 A1 | 4/2010 | Arghavani et al. |
| 2010/0093168 A1 | 4/2010 | Naik |
| 2010/0096367 A1 | 4/2010 | Jeon et al. |
| 2010/0098882 A1 | 4/2010 | Lubomirsky et al. |
| 2010/0099236 A1 | 4/2010 | Kwon et al. |
| 2010/0099263 A1 | 4/2010 | Kao et al. |
| 2010/0101727 A1 | 4/2010 | Ji |
| 2010/0105209 A1 | 4/2010 | Winniczek et al. |
| 2010/0116788 A1 | 5/2010 | Singh et al. |
| 2010/0119843 A1 | 5/2010 | Sun et al. |
| 2010/0129974 A1 | 5/2010 | Futase et al. |
| 2010/0130001 A1 | 5/2010 | Noguchi |
| 2010/0139889 A1 | 6/2010 | Kurita et al. |
| 2010/0144140 A1 | 6/2010 | Chandrashekar et al. |
| 2010/0147219 A1 | 6/2010 | Hsieh et al. |
| 2010/0151149 A1 | 6/2010 | Ovshinsky |
| 2010/0164422 A1 | 7/2010 | Shu et al. |
| 2010/0173499 A1 | 7/2010 | Tao et al. |
| 2010/0178748 A1 | 7/2010 | Subramanian |
| 2010/0178755 A1 | 7/2010 | Lee et al. |
| 2010/0180819 A1 | 7/2010 | Hatanaka et al. |
| 2010/0183825 A1 | 7/2010 | Becker et al. |
| 2010/0187534 A1 | 7/2010 | Nishi et al. |
| 2010/0187588 A1 | 7/2010 | Gil-Sub et al. |
| 2010/0187694 A1 | 7/2010 | Yu et al. |
| 2010/0190352 A1 | 7/2010 | Jaiswal |
| 2010/0197143 A1 | 8/2010 | Nishimura |
| 2010/0203739 A1 | 8/2010 | Becker et al. |
| 2010/0207205 A1 | 8/2010 | Grebs et al. |
| 2010/0240205 A1 | 9/2010 | Son |
| 2010/0243165 A1 | 9/2010 | Um |
| 2010/0243606 A1 | 9/2010 | Koshimizu |
| 2010/0244204 A1 | 9/2010 | Matsuoka et al. |
| 2010/0252068 A1 | 10/2010 | Kannan et al. |
| 2010/0258913 A1 | 10/2010 | Lue |
| 2010/0267224 A1 | 10/2010 | Choi et al. |
| 2010/0267248 A1 | 10/2010 | Ma et al. |
| 2010/0273290 A1 | 10/2010 | Kryliouk |
| 2010/0273291 A1 | 10/2010 | Kryliouk et al. |
| 2010/0288369 A1 | 11/2010 | Chang et al. |
| 2010/0294199 A1 | 11/2010 | Tran et al. |
| 2010/0310785 A1 | 12/2010 | Sasakawa et al. |
| 2010/0314005 A1 | 12/2010 | Saito et al. |
| 2010/0330814 A1 | 12/2010 | Yokota et al. |
| 2011/0005607 A1 | 1/2011 | Desbiolles et al. |
| 2011/0005684 A1 | 1/2011 | Hayami et al. |
| 2011/0008950 A1 | 1/2011 | Xu |
| 2011/0011338 A1 | 1/2011 | Chuc et al. |
| 2011/0034035 A1 | 2/2011 | Liang et al. |
| 2011/0039407 A1 | 2/2011 | Nishizuka |
| 2011/0042799 A1 | 2/2011 | Kang et al. |
| 2011/0045676 A1 | 2/2011 | Park |
| 2011/0053380 A1 | 3/2011 | Sapre et al. |
| 2011/0058303 A1 | 3/2011 | Migita |
| 2011/0061810 A1 | 3/2011 | Ganguly et al. |
| 2011/0061812 A1 | 3/2011 | Ganguly et al. |
| 2011/0065276 A1 | 3/2011 | Ganguly et al. |
| 2011/0076401 A1 | 3/2011 | Chao et al. |
| 2011/0081782 A1 | 4/2011 | Liang et al. |
| 2011/0100489 A1 | 5/2011 | Orito |
| 2011/0111596 A1 | 5/2011 | Kanakasabapathy |
| 2011/0114601 A1 | 5/2011 | Lubomirsky et al. |
| 2011/0115378 A1 | 5/2011 | Lubomirsky et al. |
| 2011/0124144 A1 | 5/2011 | Schlemm et al. |
| 2011/0127156 A1 | 6/2011 | Foad et al. |
| 2011/0133650 A1 | 6/2011 | Kim |
| 2011/0136347 A1 | 6/2011 | Kovarsky et al. |
| 2011/0140229 A1 | 6/2011 | Rachmady et al. |
| 2011/0143542 A1 | 6/2011 | Feurprier et al. |
| 2011/0147363 A1 | 6/2011 | Yap et al. |
| 2011/0151674 A1 | 6/2011 | Tang et al. |
| 2011/0151677 A1 | 6/2011 | Wang et al. |
| 2011/0151678 A1 | 6/2011 | Ashtiani et al. |
| 2011/0155181 A1 | 6/2011 | Inatomi |
| 2011/0159690 A1 | 6/2011 | Chandrashekar et al. |
| 2011/0165057 A1 | 7/2011 | Honda et al. |
| 2011/0165347 A1 | 7/2011 | Miller et al. |
| 2011/0165771 A1 | 7/2011 | Ring et al. |
| 2011/0174778 A1 | 7/2011 | Sawada et al. |
| 2011/0180847 A1 | 7/2011 | Ikeda et al. |
| 2011/0195575 A1 | 8/2011 | Wang |
| 2011/0198034 A1 | 8/2011 | Sun et al. |
| 2011/0204025 A1 | 8/2011 | Tahara |
| 2011/0207332 A1 | 8/2011 | Liu et al. |
| 2011/0217851 A1 | 9/2011 | Liang et al. |
| 2011/0226734 A1 | 9/2011 | Sumiya et al. |
| 2011/0227028 A1 | 9/2011 | Sekar et al. |
| 2011/0230008 A1 | 9/2011 | Lakshmanan et al. |
| 2011/0230052 A1 | 9/2011 | Tang et al. |
| 2011/0232737 A1 | 9/2011 | Ruletzki et al. |
| 2011/0232845 A1 | 9/2011 | Riker et al. |
| 2011/0244693 A1 | 10/2011 | Tamura et al. |
| 2011/0256421 A1 | 10/2011 | Bose et al. |
| 2011/0265884 A1 | 11/2011 | Xu et al. |
| 2011/0265951 A1 | 11/2011 | Xu |
| 2011/0266252 A1 | 11/2011 | Thadani et al. |
| 2011/0266256 A1 | 11/2011 | Cruse et al. |
| 2011/0266682 A1 | 11/2011 | Edelstein et al. |
| 2011/0278260 A1 | 11/2011 | Lai et al. |
| 2011/0287633 A1 | 11/2011 | Lee et al. |
| 2011/0294300 A1 | 12/2011 | Zhang et al. |
| 2011/0298061 A1 | 12/2011 | Siddiqui et al. |
| 2011/0304078 A1 | 12/2011 | Lee et al. |
| 2012/0003782 A1 | 1/2012 | Byun et al. |
| 2012/0009796 A1 | 1/2012 | Cui et al. |
| 2012/0025289 A1 | 2/2012 | Liang et al. |
| 2012/0031559 A1* | 2/2012 | Dhindsa ............ H01J 37/32091 156/345.26 |
| 2012/0034786 A1 | 2/2012 | Dhindsa et al. |
| 2012/0035766 A1* | 2/2012 | Shajii ................... H01J 37/321 700/274 |
| 2012/0037596 A1 | 2/2012 | Eto et al. |
| 2012/0052683 A1 | 3/2012 | Kim et al. |
| 2012/0055402 A1 | 3/2012 | Moriya et al. |
| 2012/0068242 A1 | 3/2012 | Shin et al. |
| 2012/0070982 A1 | 3/2012 | Yu et al. |
| 2012/0070996 A1 | 3/2012 | Hao |
| 2012/0073501 A1 | 3/2012 | Lubomirsky et al. |
| 2012/0074126 A1 | 3/2012 | Bang et al. |
| 2012/0091108 A1 | 4/2012 | Lin et al. |
| 2012/0097330 A1 | 4/2012 | Iyengar et al. |
| 2012/0103518 A1 | 5/2012 | Kakimoto |
| 2012/0104564 A1 | 5/2012 | Won et al. |
| 2012/0119225 A1 | 5/2012 | Shiomi et al. |
| 2012/0122319 A1 | 5/2012 | Shimizu |
| 2012/0129354 A1 | 5/2012 | Luong |
| 2012/0135576 A1 | 5/2012 | Lee et al. |
| 2012/0145079 A1 | 6/2012 | Lubomirsky et al. |
| 2012/0148369 A1 | 6/2012 | Michalski et al. |
| 2012/0149200 A1 | 6/2012 | Culp et al. |
| 2012/0161405 A1 | 6/2012 | Mohn et al. |
| 2012/0164839 A1 | 6/2012 | Nishimura |
| 2012/0171852 A1 | 7/2012 | Yuan et al. |
| 2012/0180954 A1 | 7/2012 | Yang et al. |
| 2012/0181599 A1 | 7/2012 | Lung |
| 2012/0182808 A1 | 7/2012 | Lue et al. |
| 2012/0187844 A1 | 7/2012 | Hoffman et al. |
| 2012/0193456 A1 | 8/2012 | Lubomirsky et al. |
| 2012/0196447 A1 | 8/2012 | Yang et al. |
| 2012/0196451 A1 | 8/2012 | Mallick |
| 2012/0202408 A1 | 8/2012 | Shajii et al. |
| 2012/0208361 A1 | 8/2012 | Ha |

(56) References Cited

U.S. PATENT DOCUMENTS

| | | |
|---|---|---|
| 2012/0211462 A1 | 8/2012 | Zhang et al. |
| 2012/0211722 A1 | 8/2012 | Kellam et al. |
| 2012/0222815 A1 | 9/2012 | Sabri et al. |
| 2012/0223048 A1 | 9/2012 | Paranjpe et al. |
| 2012/0223418 A1 | 9/2012 | Stowers et al. |
| 2012/0225557 A1 | 9/2012 | Serry et al. |
| 2012/0228642 A1 | 9/2012 | Aube et al. |
| 2012/0238102 A1 | 9/2012 | Zhang et al. |
| 2012/0238103 A1 | 9/2012 | Zhang et al. |
| 2012/0238108 A1 | 9/2012 | Chen et al. |
| 2012/0241411 A1 | 9/2012 | Darling et al. |
| 2012/0247390 A1 | 10/2012 | Sawada et al. |
| 2012/0247670 A1 | 10/2012 | Dobashi et al. |
| 2012/0247671 A1 | 10/2012 | Sugawara |
| 2012/0247677 A1 | 10/2012 | Himori et al. |
| 2012/0255491 A1 | 10/2012 | Hahidi |
| 2012/0258600 A1 | 10/2012 | Godet et al. |
| 2012/0267346 A1 | 10/2012 | Kao et al. |
| 2012/0269968 A1 | 10/2012 | Rayner |
| 2012/0282779 A1 | 11/2012 | Arnold et al. |
| 2012/0285619 A1 | 11/2012 | Matyushkin et al. |
| 2012/0285621 A1 | 11/2012 | Tan |
| 2012/0291696 A1 | 11/2012 | Clarke |
| 2012/0292664 A1 | 11/2012 | Kanike |
| 2012/0304933 A1 | 12/2012 | Mai et al. |
| 2012/0309204 A1 | 12/2012 | Kang et al. |
| 2012/0309205 A1 | 12/2012 | Wang et al. |
| 2012/0322015 A1 | 12/2012 | Kim |
| 2013/0001899 A1 | 1/2013 | Hwang et al. |
| 2013/0005103 A1 | 1/2013 | Liu et al. |
| 2013/0005140 A1 | 1/2013 | Jeng et al. |
| 2013/0012032 A1 | 1/2013 | Liu et al. |
| 2013/0023062 A1 | 1/2013 | Masuda et al. |
| 2013/0023124 A1 | 1/2013 | Nemani et al. |
| 2013/0026135 A1 | 1/2013 | Kim |
| 2013/0032574 A1 | 2/2013 | Liu et al. |
| 2013/0034666 A1 | 2/2013 | Liang et al. |
| 2013/0034968 A1 | 2/2013 | Zhang et al. |
| 2013/0037919 A1 | 2/2013 | Sapra et al. |
| 2013/0045605 A1 | 2/2013 | Wang et al. |
| 2013/0052804 A1 | 2/2013 | Song |
| 2013/0052827 A1 | 2/2013 | Wang et al. |
| 2013/0052833 A1 | 2/2013 | Ranjan et al. |
| 2013/0059440 A1 | 3/2013 | Wang et al. |
| 2013/0062675 A1 | 3/2013 | Thomas |
| 2013/0065398 A1 | 3/2013 | Ohsawa et al. |
| 2013/0082197 A1 | 4/2013 | Yang et al. |
| 2013/0084654 A1 | 4/2013 | Gaylord et al. |
| 2013/0087309 A1 | 4/2013 | Volfovski |
| 2013/0089988 A1 | 4/2013 | Wang et al. |
| 2013/0098868 A1 | 4/2013 | Nishimura et al. |
| 2013/0105085 A1 | 5/2013 | Yousif et al. |
| 2013/0105086 A1 | 5/2013 | Banna et al. |
| 2013/0105088 A1 | 5/2013 | Pal et al. |
| 2013/0105303 A1 | 5/2013 | Lubomirsky et al. |
| 2013/0105948 A1 | 5/2013 | Kewley |
| 2013/0107415 A1 | 5/2013 | Banna et al. |
| 2013/0115372 A1 | 5/2013 | Pavol et al. |
| 2013/0118686 A1 | 5/2013 | Carducci et al. |
| 2013/0119016 A1 | 5/2013 | Kagoshima |
| 2013/0119457 A1 | 5/2013 | Lue et al. |
| 2013/0119483 A1 | 5/2013 | Alptekin et al. |
| 2013/0130507 A1 | 5/2013 | Wang et al. |
| 2013/0150303 A1 | 6/2013 | Kungl et al. |
| 2013/0153148 A1 | 6/2013 | Yang et al. |
| 2013/0155568 A1 | 6/2013 | Todorow et al. |
| 2013/0161726 A1 | 6/2013 | Kim et al. |
| 2013/0171810 A1 | 7/2013 | Sun et al. |
| 2013/0175654 A1 | 7/2013 | Muckenhirn et al. |
| 2013/0187220 A1 | 7/2013 | Surthi |
| 2013/0193108 A1 | 8/2013 | Zheng |
| 2013/0213935 A1 | 8/2013 | Liao et al. |
| 2013/0216821 A1 | 8/2013 | Sun et al. |
| 2013/0217243 A1 | 8/2013 | Underwood et al. |
| 2013/0224960 A1 | 8/2013 | Payyapilly et al. |
| 2013/0260533 A1 | 10/2013 | Sapre et al. |
| 2013/0260564 A1 | 10/2013 | Sapre et al. |
| 2013/0273313 A1 | 10/2013 | Sun et al. |
| 2013/0273327 A1 | 10/2013 | Sun et al. |
| 2013/0279066 A1 | 10/2013 | Lubomirsky et al. |
| 2013/0284369 A1 | 10/2013 | Kobayashi et al. |
| 2013/0284370 A1 | 10/2013 | Kobayashi et al. |
| 2013/0284373 A1 | 10/2013 | Sun et al. |
| 2013/0284374 A1 | 10/2013 | Lubomirsky et al. |
| 2013/0286530 A1 | 10/2013 | Lin et al. |
| 2013/0295297 A1 | 11/2013 | Chou et al. |
| 2013/0298942 A1 | 11/2013 | Ren et al. |
| 2013/0302980 A1 | 11/2013 | Chandrashekar et al. |
| 2013/0337655 A1 | 12/2013 | Lee et al. |
| 2013/0343829 A1 | 12/2013 | Benedetti et al. |
| 2014/0004707 A1 | 1/2014 | Thedjoisworo et al. |
| 2014/0004708 A1 | 1/2014 | Thedjoisworo |
| 2014/0008880 A1 | 1/2014 | Miura et al. |
| 2014/0020708 A1 | 1/2014 | Kim et al. |
| 2014/0021673 A1 | 1/2014 | Chen et al. |
| 2014/0026813 A1 | 1/2014 | Wang et al. |
| 2014/0030486 A1 | 1/2014 | Sun et al. |
| 2014/0030533 A1 | 1/2014 | Sun et al. |
| 2014/0053866 A1 | 2/2014 | Baluja et al. |
| 2014/0057447 A1 | 2/2014 | Yang et al. |
| 2014/0062285 A1 | 3/2014 | Chen |
| 2014/0065827 A1 | 3/2014 | Kang et al. |
| 2014/0065842 A1 | 3/2014 | Anthis et al. |
| 2014/0080308 A1 | 3/2014 | Chen et al. |
| 2014/0080309 A1 | 3/2014 | Park |
| 2014/0080310 A1 | 3/2014 | Chen et al. |
| 2014/0083362 A1 | 3/2014 | Lubomirsky et al. |
| 2014/0087488 A1 | 3/2014 | Nam et al. |
| 2014/0097270 A1 | 4/2014 | Liang et al. |
| 2014/0099794 A1 | 4/2014 | Ingle et al. |
| 2014/0102367 A1 | 4/2014 | Ishibashi |
| 2014/0124364 A1 | 5/2014 | Yoo et al. |
| 2014/0134842 A1 | 5/2014 | Zhange et al. |
| 2014/0134847 A1 | 5/2014 | Seya |
| 2014/0141621 A1 | 5/2014 | Ren et al. |
| 2014/0147126 A1 | 5/2014 | Linnartz et al. |
| 2014/0152312 A1 | 6/2014 | Snow et al. |
| 2014/0154668 A1 | 6/2014 | Chou et al. |
| 2014/0165912 A1 | 6/2014 | Kao et al. |
| 2014/0166617 A1 | 6/2014 | Chen |
| 2014/0166618 A1 | 6/2014 | Tadigadapa et al. |
| 2014/0177123 A1 | 6/2014 | Thach et al. |
| 2014/0186772 A1 | 7/2014 | Pohlers et al. |
| 2014/0190410 A1 | 7/2014 | Kim |
| 2014/0191388 A1 | 7/2014 | Chen |
| 2014/0199850 A1 | 7/2014 | Kim et al. |
| 2014/0199851 A1 | 7/2014 | Nemani et al. |
| 2014/0209245 A1 | 7/2014 | Yamamoto et al. |
| 2014/0209596 A1 | 7/2014 | Lubomirsky et al. |
| 2014/0216337 A1 | 8/2014 | Swaminathan et al. |
| 2014/0225504 A1 | 8/2014 | Kaneko et al. |
| 2014/0227881 A1 | 8/2014 | Lubomirsky et al. |
| 2014/0234466 A1 | 8/2014 | Gao et al. |
| 2014/0248773 A1 | 9/2014 | Tsai et al. |
| 2014/0248780 A1 | 9/2014 | Ingle et al. |
| 2014/0252134 A1 | 9/2014 | Chen et al. |
| 2014/0256131 A1 | 9/2014 | Wang et al. |
| 2014/0256145 A1 | 9/2014 | Abdallah et al. |
| 2014/0262031 A1 | 9/2014 | Belostotskiy et al. |
| 2014/0262038 A1 | 9/2014 | Wang et al. |
| 2014/0263172 A1 | 9/2014 | Xie et al. |
| 2014/0263173 A1 | 9/2014 | Rosslee et al. |
| 2014/0263272 A1 | 9/2014 | Duan et al. |
| 2014/0264533 A1 | 9/2014 | Simsek-Ege |
| 2014/0271097 A1 | 9/2014 | Wang et al. |
| 2014/0273373 A1 | 9/2014 | Makala et al. |
| 2014/0273406 A1 | 9/2014 | Wang et al. |
| 2014/0273451 A1 | 9/2014 | Wang et al. |
| 2014/0273462 A1 | 9/2014 | Simsek-Ege et al. |
| 2014/0273481 A1 | 9/2014 | Wang et al. |
| 2014/0273488 A1 | 9/2014 | Wang et al. |
| 2014/0273489 A1 | 9/2014 | Wang et al. |
| 2014/0273491 A1 | 9/2014 | Zhang et al. |
| 2014/0273492 A1 | 9/2014 | Anthis et al. |

(56) References Cited

U.S. PATENT DOCUMENTS

| | | |
|---|---|---|
| 2014/0273496 A1 | 9/2014 | Kao |
| 2014/0288528 A1 | 9/2014 | Py et al. |
| 2014/0302678 A1 | 10/2014 | Paterson et al. |
| 2014/0302680 A1 | 10/2014 | Singh |
| 2014/0308758 A1 | 10/2014 | Nemani et al. |
| 2014/0308816 A1 | 10/2014 | Wang et al. |
| 2014/0311581 A1 | 10/2014 | Belostotskiy et al. |
| 2014/0342532 A1 | 11/2014 | Zhu |
| 2014/0342569 A1 | 11/2014 | Zhu et al. |
| 2014/0349477 A1 | 11/2014 | Chandrashekar et al. |
| 2014/0357083 A1 | 12/2014 | Ling et al. |
| 2014/0361684 A1 | 12/2014 | Ikeda et al. |
| 2014/0363979 A1 | 12/2014 | Or et al. |
| 2014/0366953 A1 | 12/2014 | Lee et al. |
| 2015/0011096 A1 | 1/2015 | Chandrasekharan et al. |
| 2015/0014152 A1 | 1/2015 | Hoinkis et al. |
| 2015/0031211 A1 | 1/2015 | Sapre et al. |
| 2015/0037980 A1 | 2/2015 | Rha |
| 2015/0041430 A1 | 2/2015 | Yoshino et al. |
| 2015/0050812 A1 | 2/2015 | Smith |
| 2015/0060265 A1 | 3/2015 | Cho et al. |
| 2015/0064918 A1 | 3/2015 | Ranjan et al. |
| 2015/0072508 A1 | 3/2015 | Or et al. |
| 2015/0076110 A1 | 3/2015 | Wu et al. |
| 2015/0076586 A1 | 3/2015 | Rabkin et al. |
| 2015/0079797 A1 | 3/2015 | Chen et al. |
| 2015/0093891 A1 | 4/2015 | Zope |
| 2015/0118858 A1 | 4/2015 | Takaba |
| 2015/0126035 A1 | 5/2015 | Diao et al. |
| 2015/0126039 A1 | 5/2015 | Korolik et al. |
| 2015/0126040 A1 | 5/2015 | Korolik et al. |
| 2015/0129541 A1 | 5/2015 | Wang et al. |
| 2015/0129545 A1 | 5/2015 | Ingle et al. |
| 2015/0129546 A1 | 5/2015 | Ingle et al. |
| 2015/0132953 A1 | 5/2015 | Nowling et al. |
| 2015/0132968 A1 | 5/2015 | Ren et al. |
| 2015/0152072 A1 | 6/2015 | Cantat et al. |
| 2015/0155177 A1 | 6/2015 | Zhang et al. |
| 2015/0170879 A1 | 6/2015 | Nguyen et al. |
| 2015/0170920 A1 | 6/2015 | Purayath et al. |
| 2015/0170924 A1 | 6/2015 | Nguyen et al. |
| 2015/0170926 A1 | 6/2015 | Michalak |
| 2015/0170935 A1 | 6/2015 | Wang et al. |
| 2015/0170943 A1 | 6/2015 | Nguyen et al. |
| 2015/0171008 A1 | 6/2015 | Luo |
| 2015/0179464 A1 | 6/2015 | Wang et al. |
| 2015/0187625 A1 | 7/2015 | Busche et al. |
| 2015/0200042 A1 | 7/2015 | Ling et al. |
| 2015/0206764 A1 | 7/2015 | Wang et al. |
| 2015/0214066 A1 | 7/2015 | Luere et al. |
| 2015/0214067 A1 | 7/2015 | Zhang et al. |
| 2015/0214092 A1 | 7/2015 | Purayath et al. |
| 2015/0214337 A1 | 7/2015 | Ko et al. |
| 2015/0221479 A1 | 8/2015 | Chen et al. |
| 2015/0221541 A1 | 8/2015 | Nemani et al. |
| 2015/0228456 A1 | 8/2015 | Ye et al. |
| 2015/0235809 A1 | 8/2015 | Ito et al. |
| 2015/0235860 A1 | 8/2015 | Tomura et al. |
| 2015/0235863 A1 | 8/2015 | Chen |
| 2015/0235865 A1 | 8/2015 | Wang et al. |
| 2015/0235867 A1 | 8/2015 | Nishizuka |
| 2015/0247231 A1 | 9/2015 | Nguyen et al. |
| 2015/0249018 A1 | 9/2015 | Park et al. |
| 2015/0270105 A1 | 9/2015 | Kobayashi et al. |
| 2015/0270106 A1 | 9/2015 | Kobayashi et al. |
| 2015/0270140 A1 | 9/2015 | Gupta et al. |
| 2015/0275361 A1 | 10/2015 | Lubomirsky et al. |
| 2015/0275375 A1 | 10/2015 | Kim et al. |
| 2015/0279687 A1 | 10/2015 | Xue et al. |
| 2015/0294980 A1 | 10/2015 | Lee et al. |
| 2015/0332930 A1 | 11/2015 | Wang et al. |
| 2015/0340225 A1 | 11/2015 | Kim et al. |
| 2015/0357201 A1 | 12/2015 | Chen et al. |
| 2015/0357205 A1 | 12/2015 | Wang et al. |
| 2015/0371861 A1 | 12/2015 | Li et al. |
| 2015/0371864 A1 | 12/2015 | Hsu et al. |
| 2015/0371865 A1 | 12/2015 | Chen et al. |
| 2015/0371866 A1 | 12/2015 | Chen et al. |
| 2015/0380431 A1 | 12/2015 | Kanamori et al. |
| 2016/0005572 A1 | 1/2016 | Liang et al. |
| 2016/0005833 A1 | 1/2016 | Collins et al. |
| 2016/0027654 A1 | 1/2016 | Kim et al. |
| 2016/0027673 A1 | 1/2016 | Wang et al. |
| 2016/0035586 A1 | 2/2016 | Purayath et al. |
| 2016/0035614 A1 | 2/2016 | Purayath et al. |
| 2016/0042968 A1 | 2/2016 | Purayath et al. |
| 2016/0043099 A1 | 2/2016 | Purayath et al. |
| 2016/0056167 A1 | 2/2016 | Wang et al. |
| 2016/0064212 A1 | 3/2016 | Thedjoisworo et al. |
| 2016/0064233 A1 | 3/2016 | Wang et al. |
| 2016/0079072 A1 | 3/2016 | Wang et al. |
| 2016/0086772 A1 | 3/2016 | Khaja |
| 2016/0086807 A1 | 3/2016 | Park et al. |
| 2016/0086808 A1 | 3/2016 | Zhang et al. |
| 2016/0086815 A1 | 3/2016 | Pandit et al. |
| 2016/0086816 A1 | 3/2016 | Wang et al. |
| 2016/0093505 A1 | 3/2016 | Chen et al. |
| 2016/0093506 A1 | 3/2016 | Chen et al. |
| 2016/0093737 A1 | 3/2016 | Li et al. |
| 2016/0104606 A1 | 4/2016 | Park et al. |
| 2016/0109863 A1 | 4/2016 | Valcore et al. |
| 2016/0117425 A1 | 4/2016 | Povolny et al. |
| 2016/0118227 A1 | 4/2016 | Valcore et al. |
| 2016/0118268 A1 | 4/2016 | Ingle et al. |
| 2016/0126118 A1 | 5/2016 | Chen et al. |
| 2016/0133480 A1 | 5/2016 | Ko et al. |
| 2016/0148805 A1 | 5/2016 | Jongbloed et al. |
| 2016/0148821 A1 | 5/2016 | Singh et al. |
| 2016/0163512 A1 | 6/2016 | Lubomirsky |
| 2016/0181112 A1 | 6/2016 | Xue et al. |
| 2016/0181116 A1 | 6/2016 | Berry et al. |
| 2016/0189933 A1 | 6/2016 | Kobayashi et al. |
| 2016/0196969 A1 | 7/2016 | Berry et al. |
| 2016/0196984 A1 | 7/2016 | Lill et al. |
| 2016/0196985 A1 | 7/2016 | Tan et al. |
| 2016/0204009 A1 | 7/2016 | Nguyen et al. |
| 2016/0222522 A1 | 8/2016 | Wang et al. |
| 2016/0225651 A1 | 8/2016 | Tran et al. |
| 2016/0225652 A1 | 8/2016 | Tran et al. |
| 2016/0237570 A1 | 8/2016 | Tan et al. |
| 2016/0240389 A1 | 8/2016 | Zhang et al. |
| 2016/0240402 A1 | 8/2016 | Park et al. |
| 2016/0260588 A1 | 9/2016 | Park et al. |
| 2016/0260616 A1 | 9/2016 | Li et al. |
| 2016/0260619 A1 | 9/2016 | Zhang et al. |
| 2016/0284556 A1 | 9/2016 | Ingle et al. |
| 2016/0293438 A1 | 10/2016 | Zhou et al. |
| 2016/0300694 A1 | 10/2016 | Yang et al. |
| 2016/0307772 A1 | 10/2016 | Choi et al. |
| 2016/0307773 A1 | 10/2016 | Lee et al. |
| 2016/0314961 A1 | 10/2016 | Liu et al. |
| 2016/0314985 A1 | 10/2016 | Yang et al. |
| 2016/0319452 A1 | 11/2016 | Eidschun et al. |
| 2016/0343548 A1 | 11/2016 | Howald et al. |
| 2017/0040175 A1 | 2/2017 | Xu et al. |
| 2017/0040190 A1 | 2/2017 | Benjaminson et al. |
| 2017/0040191 A1 | 2/2017 | Benjaminson et al. |
| 2017/0040207 A1 | 2/2017 | Purayath |
| 2017/0040214 A1 | 2/2017 | Lai et al. |
| 2017/0062184 A1 | 3/2017 | Tran et al. |
| 2017/0110290 A1 | 4/2017 | Kobayashi et al. |
| 2017/0110335 A1 | 4/2017 | Yang et al. |
| 2017/0110475 A1 | 4/2017 | Liu et al. |
| 2017/0133202 A1 | 5/2017 | Berry |
| 2017/0178894 A1 | 6/2017 | Stone et al. |
| 2017/0178924 A1 | 6/2017 | Chen et al. |
| 2017/0226637 A1 | 8/2017 | Lubomirsky et al. |
| 2017/0229287 A1 | 8/2017 | Xu et al. |
| 2017/0229289 A1 | 8/2017 | Lubomirsky et al. |
| 2017/0229291 A1 | 8/2017 | Singh et al. |
| 2017/0229293 A1 | 8/2017 | Park et al. |
| 2017/0229326 A1 | 8/2017 | Tran et al. |
| 2017/0229328 A1 | 8/2017 | Benjaminson et al. |
| 2017/0229329 A1 | 8/2017 | Benjaminson et al. |

(56) References Cited

U.S. PATENT DOCUMENTS

| | | |
|---|---|---|
| 2017/0236694 A1 | 8/2017 | Eason et al. |
| 2017/0309509 A1 | 10/2017 | Tran et al. |
| 2017/0338133 A1 | 11/2017 | Tan et al. |
| 2017/0338134 A1 | 11/2017 | Tan et al. |
| 2018/0005850 A1 | 1/2018 | Citla et al. |
| 2018/0025900 A1 | 1/2018 | Park et al. |
| 2018/0076031 A1 | 3/2018 | Yan et al. |
| 2018/0076044 A1 | 3/2018 | Choi et al. |
| 2018/0076083 A1 | 3/2018 | Ko et al. |
| 2018/0082861 A1 | 3/2018 | Citla et al. |
| 2018/0096818 A1 | 4/2018 | Lubomirsky |
| 2018/0096819 A1 | 4/2018 | Lubomirsky et al. |
| 2018/0096821 A1 | 4/2018 | Lubomirsky et al. |
| 2018/0096865 A1 | 4/2018 | Lubomirsky et al. |
| 2018/0102255 A1 | 4/2018 | Chen et al. |
| 2018/0102256 A1 | 4/2018 | Chen et al. |
| 2018/0102259 A1 | 4/2018 | Wang et al. |
| 2018/0138049 A1 | 5/2018 | Ko et al. |
| 2018/0138055 A1 | 5/2018 | Xu et al. |
| 2018/0138075 A1 | 5/2018 | Kang et al. |
| 2018/0138085 A1 | 5/2018 | Wang et al. |
| 2018/0182633 A1 | 6/2018 | Pandit et al. |
| 2018/0226223 A1 | 8/2018 | Lubomirsky |
| 2018/0226230 A1 | 8/2018 | Kobayashi et al. |
| 2018/0226259 A1 | 8/2018 | Choi et al. |
| 2018/0226278 A1 | 8/2018 | Arnepalli et al. |
| 2018/0226425 A1 | 8/2018 | Purayath |
| 2018/0226426 A1 | 8/2018 | Purayath |
| 2018/0261516 A1 | 9/2018 | Lin et al. |
| 2018/0261686 A1 | 9/2018 | Lin et al. |

FOREIGN PATENT DOCUMENTS

| | | |
|---|---|---|
| CN | 101236893 A | 8/2008 |
| CN | 101378850 A | 3/2009 |
| CN | 102893705 | 1/2013 |
| EP | 1675160 A1 | 6/2006 |
| JP | S59-126778 A | 7/1984 |
| JP | S62-45119 A | 2/1987 |
| JP | 63301051 A | 12/1988 |
| JP | H01-200627 A | 8/1989 |
| JP | H02-114525 A | 4/1990 |
| JP | H07-153739 A | 6/1995 |
| JP | H8-31755 A | 2/1996 |
| JP | H08-107101 A | 4/1996 |
| JP | H08-264510 A | 10/1996 |
| JP | H09-260356 A | 10/1997 |
| JP | 2001-313282 A | 11/2001 |
| JP | 2001-332608 A | 11/2001 |
| JP | 2002-075972 A | 3/2002 |
| JP | 2002-083869 A | 3/2002 |
| JP | 2003-174020 A | 6/2003 |
| JP | 2003-282591 A | 10/2003 |
| JP | 2004-508709 A | 3/2004 |
| JP | 2004-296467 A | 10/2004 |
| JP | 2005-050908 A | 2/2005 |
| JP | 2006-041039 A | 2/2006 |
| JP | 2006-066408 A | 3/2006 |
| JP | 2008-288560 A | 11/2008 |
| JP | 4191137 B2 | 12/2008 |
| JP | 2009-141343 A | 6/2009 |
| JP | 2009-530871 A | 8/2009 |
| JP | 2009-239056 A | 10/2009 |
| JP | 2010-180458 | 8/2010 |
| JP | 2011-508436 A | 3/2011 |
| JP | 2011-518408 A | 6/2011 |
| JP | 4763293 B2 | 8/2011 |
| JP | 2011-171378 A | 9/2011 |
| JP | 2012-19164 A | 1/2012 |
| JP | 2012-019194 A | 1/2012 |
| JP | 2012-512531 A | 5/2012 |
| JP | 2013-243418 A | 12/2013 |
| JP | 5802323 B2 | 10/2015 |
| JP | 2016-111177 A | 6/2016 |
| KR | 10-2000-008278 A | 2/2000 |
| KR | 10-2000-0064946 A | 11/2000 |
| KR | 10-2001-0056735 A | 7/2001 |
| KR | 2003-0023964 A | 3/2003 |
| KR | 10-2003-0054726 A | 7/2003 |
| KR | 10-2003-0083663 A | 10/2003 |
| KR | 100441297 B1 | 7/2004 |
| KR | 10-2005-0007143 A | 1/2005 |
| KR | 10-2005-0042701 A | 5/2005 |
| KR | 2005-0049903 A | 5/2005 |
| KR | 10-2006-0080509 A | 7/2006 |
| KR | 1006-41762 B1 | 11/2006 |
| KR | 10-2006-0127173 A | 12/2006 |
| KR | 663668 B1 * | 1/2007 |
| KR | 100663668 B1 | 1/2007 |
| KR | 100678696 B1 | 1/2007 |
| KR | 100678696 B1 * | 1/2007 |
| KR | 100712727 B1 | 4/2007 |
| KR | 20070079870 A * | 8/2007 |
| KR | 10-2008-0063988 A | 7/2008 |
| KR | 10-0843236 B1 | 7/2008 |
| KR | 10-2009-0040869 A | 4/2009 |
| KR | 10-2009-0128913 A | 12/2009 |
| KR | 10-2010-0013980 A | 2/2010 |
| KR | 10-2010-0093358 A | 8/2010 |
| KR | 10-2011-0086540 A | 7/2011 |
| KR | 10-2011-0114538 A | 10/2011 |
| KR | 10-2011-0126675 A | 11/2011 |
| KR | 10-2012-0022251 A | 3/2012 |
| KR | 10-2012-0082640 A | 7/2012 |
| KR | 10-2016-0002543 A | 1/2016 |
| TW | 2006-12480 A | 4/2006 |
| TW | 200709256 A | 3/2007 |
| TW | 2007-35196 A | 9/2007 |
| TW | 2011-27983 A1 | 8/2011 |
| TW | 2012-07919 | 2/2012 |
| TW | 2012-13594 A | 4/2012 |
| TW | 2012-33842 A | 8/2012 |
| WO | 2008-112673 A2 | 9/2008 |
| WO | 2009-084194 A1 | 7/2009 |
| WO | 2010-010706 | 1/2010 |
| WO | 2010-113946 A1 | 10/2010 |
| WO | 2011-027515 A | 3/2011 |
| WO | 2011-031556 A | 3/2011 |
| WO | 2011070945 A1 | 6/2011 |
| WO | 2011-095846 A1 | 8/2011 |
| WO | 2011-149638 A | 12/2011 |
| WO | 2012-050321 A | 4/2012 |
| WO | 2012-118987 A1 | 9/2012 |
| WO | 2012-125656 A2 | 9/2012 |
| WO | 2012-148568 A1 | 11/2012 |
| WO | 2013-118260 A1 | 8/2013 |

OTHER PUBLICATIONS

International Search Report and Written Opinion of PCT/US2015/061372 dated Jun. 16, 2016, all pages.
international Search Report and Written Opinion of PCT/US2015/061246 dated Mar. 31, 2016, all pages.
International Search Report and Written Opinion of PCT/US2016/045551 dated Nov. 17, 2016, all pages.
International Search Report and Written Opinion of PCT/US2016/045543 dated Nov. 17, 2016, all pages.
H. Xiao, Introduction to Semiconductor Manufacturing Technology, published by Prentice Hall, 2001, ISBN 0-13-022404-9, pp. 354-356.
Instrument Manual: Vacuum Gauge Model MM200, Rev D. TELEVAC (website: www.televac.com), A Division of the Fredericks Company, Huntingdonvalley, PA, US. 2008. pp. 162.
J.J. Wang and et al., "Inductively cooupled plasma etching of bulk 1-20 6H—SiC and thin-film SiCN in NF3 chemistries," Journal of Vacuum Science and Technology A: Vacuum, Surfaces, and Films 16, 2204 (1998).
"Liang et al. Industrial Application of Plasma Process vol. 3, pp. 61-74, 2010".
International Search Report and Written Opinion of PCT/US2017/060696 dated Jan. 25, 2018, all pages.

(56) References Cited

OTHER PUBLICATIONS

International Search Report and Written Opinion of PCT/US2017/055431 dated Jan. 19, 2018, all pages.
Won et al. Derwent 2006-065772; Sep. 7, 2014, 10 pages.
International Search Report and Written Opinion of PCT/US2017/047209 dated Nov. 24, 2017, all pages.
International Search Report and Written Opinion of PCT/US2017/033362 dated Aug. 24, 2017, all pages.
International Search Report and Written Opinion of PCT/US2018/016261 dated May 21, 2018, all pages.
International Search Report and Written Opinion of PCT/US2018/016648 dated May 18, 2018, all pages.

\* cited by examiner

PLASMA PROCESSING SYSTEM WITH DIRECT OUTLET TOROIDAL PLASMA SOURCE

TECHNICAL FIELD

The present disclosure applies broadly to the field of plasma processing equipment. More specifically, systems and methods for providing spatially uniform plasma products are disclosed.

BACKGROUND

Semiconductor processing often utilizes plasma processing to etch, clean or deposit material on semiconductor wafers. All such processes are advantageously highly uniform over the entire surface of a processed wafer. Wafer sizes have increased while feature sizes have decreased, significantly over the years, so that more integrated circuits can be harvested per wafer processed. Typical wafer diameters increased from about 2 or 3 inches in the 1970s to 12 inches or more in the 2010s. Over the same time frame, typical minimum feature sizes of commercial integrated circuits decreased from about 5 microns to about 0.015 microns. Processing smaller features while wafers grow larger requires significant improvements in processing uniformity. Plasma processing of workpieces other than wafers may also benefit from improved processing uniformity.

SUMMARY

In an embodiment, a plasma processing system includes a process chamber and a plasma source that generates a plasma in a plasma cavity. The plasma cavity is substantially symmetric about a toroidal axis. The plasma source defines a plurality of outlet apertures on a first axial side of the plasma cavity Plasma products produced by the plasma pass in the axial direction, through the plurality of outlet apertures, from the plasma cavity toward the process chamber.

In an embodiment, a plasma processing system includes a process chamber that is substantially radially symmetric about a chamber axis, an outer plasma source that generates a first plasma in an outer plasma cavity, and an inner plasma source that generates a second plasma in an inner plasma cavity. The outer plasma cavity and the inner plasma cavity are radially symmetric about a toroidal axis that is coincident with the chamber axis. The inner plasma cavity is radially inward from the outer plasma cavity. The outer and inner plasma cavities are in fluid communication with the process chamber through respective outer and inner outlet openings along a first axial side of the outer plasma source, such that plasma products produced by the first plasma pass in the axial direction, through the outer and inner outlet openings, from the outer and inner plasma cavities toward the process chamber.

In an embodiment, a method of plasma processing includes generating a plasma within a substantially toroidal plasma cavity that defines a toroidal axis, to form plasma products, and distributing the plasma products to a process chamber through a plurality of outlet openings substantially azimuthally distributed about a first axial side of the plasma cavity, directly into a process chamber.

DETAILED DESCRIPTION

Figure 1:
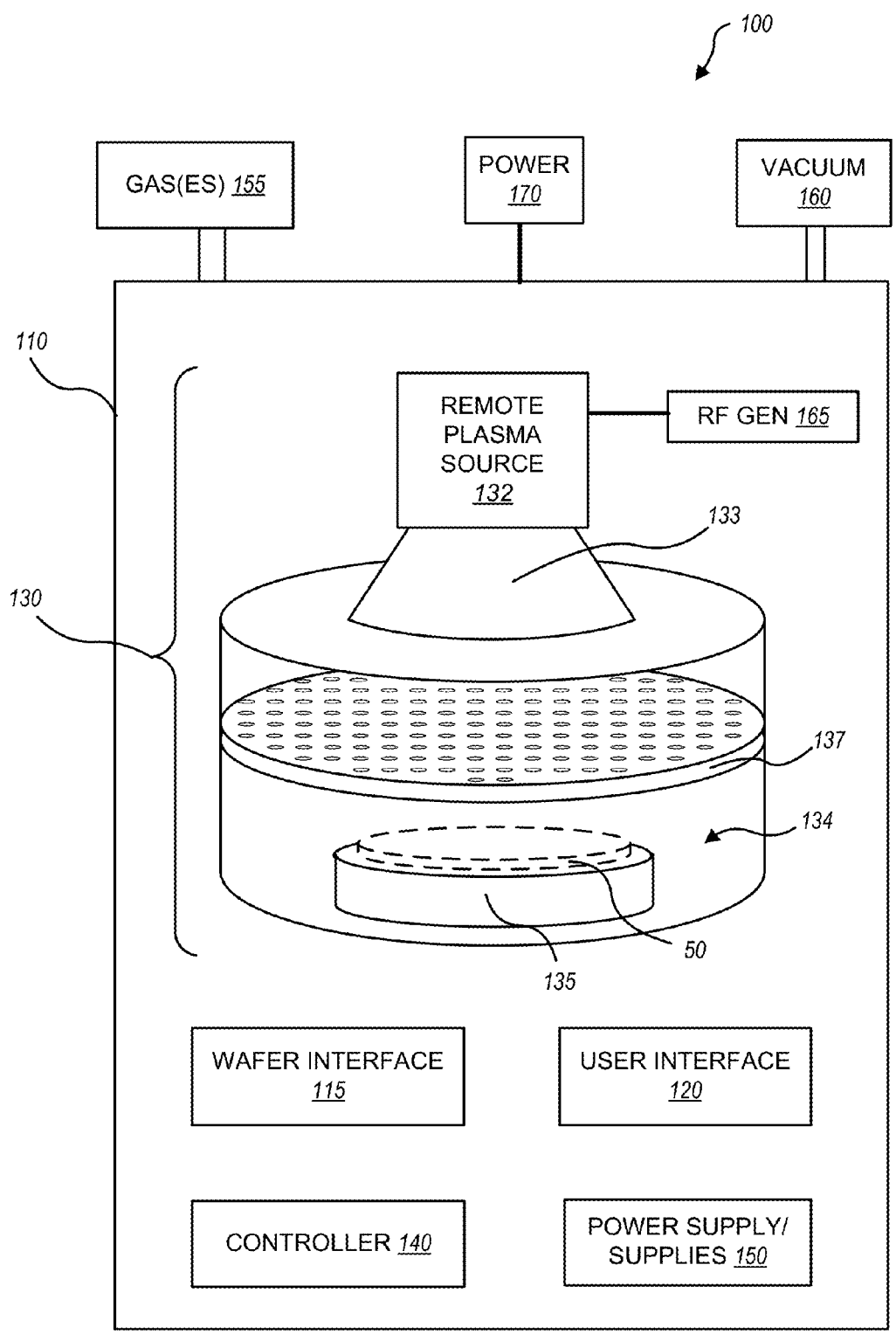
FIG. 1 schematically illustrates major elements of a plasma processing system, according to an embodiment.

The present disclosure may be understood by reference to the following detailed description taken in conjunction with the drawings described below, wherein like reference numerals are used throughout the several drawings to refer to similar components. It is noted that, for purposes of illustrative clarity, certain elements in the drawings may not be drawn to scale. Specific instances of an item may be referred to by use of a numeral in parentheses (e.g., plasma blocks 210(1), 210(2), etc.) while numerals without parentheses refer to any such item (e.g., plasma blocks 210). In instances where multiple instances of an item are shown, only some of the instances may be labeled, for clarity of illustration.

FIG. 1 schematically illustrates major elements of a plasma processing system 100, according to an embodiment. System 100 is depicted as a single wafer, semiconductor wafer plasma processing system, but it will be apparent to one skilled in the art that the techniques and principles herein are applicable to plasma generation systems of any type (e.g., systems that do not necessarily process wafers or semiconductors). It should also be understood that FIG. 1 is a simplified diagram illustrating only selected, major elements of system 100; an actual processing system will accordingly look different and likely contain additional elements as compared with system 100.

Processing system 100 includes a housing 110 for a wafer interface 115, a user interface 120, a plasma processing unit 130, a controller 140 and one or more power supplies 150. Processing system 100 is supported by various utilities that may include gas(es) 155, electrical power 170, vacuum 160 and optionally others. Internal plumbing and electrical connections within processing system 100 are not shown, for clarity of illustration.

Processing system 100 is illustrated as a so-called indirect, or remote, plasma processing system that generates a plasma in a first location and directs the plasma and/or plasma products (e.g., ions, molecular fragments, free radicals, energized species and the like) to a second location where processing occurs. Thus, in FIG. 1, plasma processing unit 130 includes a remote plasma source 132 that supplies plasma and/or plasma products for a process chamber 134. Process chamber 134 includes one or more wafer pedestals 135, upon which wafer interface 115 places a workpiece 50 for processing. Workpiece 50 is, for example, a semiconductor wafer, but could any other type of workpiece to be subjected to plasma processing. In operation, gas(es) 155 are introduced into plasma source 132 and a radio frequency generator (RF Gen) 165 supplies power to ignite a plasma within plasma source 132. Plasma and/or plasma products pass from plasma source 132 to process chamber 134, where workpiece 50 is processed. Typical present day systems may, for example, transfer the plasma and/or plasma products through a nozzle 133 and/or a diffuser plate 137 in an attempt to spread and apply them uniformly. An actual plasma system may provide many other optional features or subsystems through which plasma, plasma products and/or carrier or additional processing gases flow and/or mix between plasma source 132 and process chamber 134.

The elements illustrated as part of system 100 are listed by way of example and are not exhaustive. Many other possible elements, such as: pressure and/or flow controllers; gas or plasma manifolds or distribution apparatus; ion suppression plates; electrodes, magnetic cores and/or other electromagnetic apparatus; mechanical, pressure, temperature, chemical, optical and/or electronic sensors; wafer or other workpiece handling mechanisms; viewing and/or other access ports; and the like may also be included, but are not shown for clarity of illustration. Various control schemes affecting conditions in process chamber 134 are possible. For example, a pressure may be maintained by monitoring the pressure in process chamber 134 and adjusting all gas flows upwards or downwards until the measured pressure is within some tolerance of a desired pressure. Temperatures can be controlled by adding heaters and temperature sensors. Optical sensors may detect emission peaks of plasmas as-generated and/or as they interact with workpieces.

Internal connections and cooperation of the elements illustrated within system 100 are also not shown for clarity of illustration. In addition to RF generator 165 and gases 155, other representative utilities such as vacuum 160 and/or general purpose electrical power 170 may connect with system 100. Like the elements illustrated in system 100, the utilities illustrated as connected with system 100 are intended as illustrative rather than exhaustive; other types of utilities such as heating or cooling fluids, pressurized air, network capabilities, waste disposal systems and the like may also be connected with system 100, but are not shown for clarity of illustration. Similarly, while the above description mentions that plasma is ignited within remote plasma source 132, the principles discussed below are equally applicable to so-called "direct" plasma systems that create a plasma in a the actual location of workpiece processing.

Although an indirect plasma processing system is illustrated in FIG. 1 and elsewhere in this disclosure, it should be clear to one skilled in the art that the techniques, apparatus and methods disclosed herein may also be applicable to direct plasma processing systems—e.g., where a plasma is ignited at the location of the workpiece(s). Similarly, in embodiments, the components of processing system 100 may be reorganized, redistributed and/or duplicated, for example: (1) to provide a single processing system with multiple process chambers; (2) to provide multiple remote plasma sources for a single process chamber; (3) to provide multiple workpiece fixtures (e.g., wafer pedestals 135) within a single process chamber; (4) to utilize a single remote plasma source to supply plasma products to multiple process chambers; and/or (5) to provide plasma and gas sources in serial/parallel combinations such that various source gases may be activated (e.g., exist at least temporarily as part of a plasma) zero, one, two or more times, and mixed with other source gases before or after they enter a process chamber, and the like. Gases that have not been part of a plasma are sometimes referred to as "un-activated" gases herein.

Figure 2:
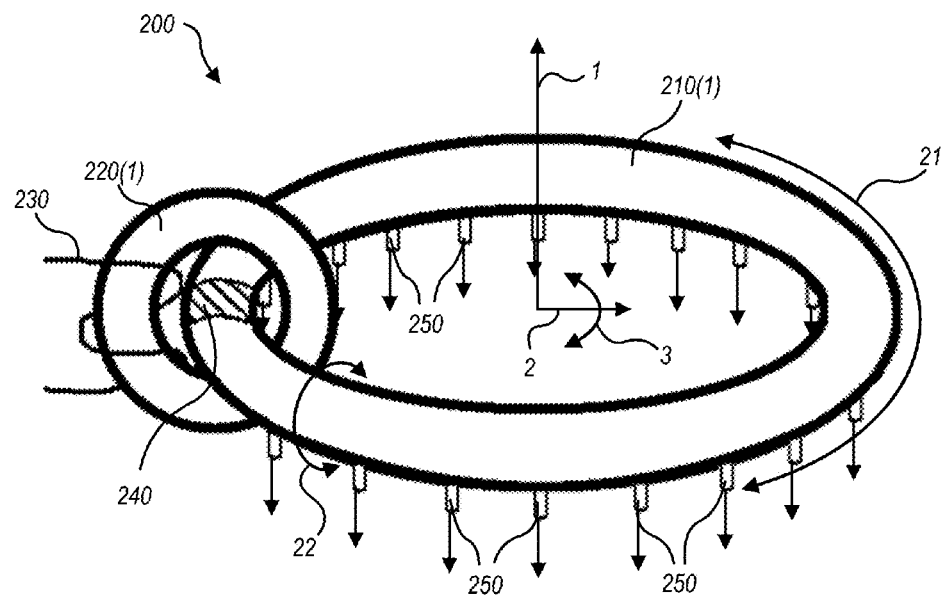
FIG. 2 schematically illustrates selected elements of a direct outlet toroidal plasma source, according to an embodiment.

FIG. 2 schematically illustrates selected elements of a direct outlet toroidal plasma source 200, according to an embodiment. Plasma source 200 is an example of remote plasma source 132, FIG. 1. A useful coordinate system that will be used herein for describing the features shown in FIG. 2 and elsewhere defines axial positions as being along a toroidal axis 1, radial directions 2 as denoting distance from toroidal axis 1, and azimuthal directions 3 as denoting rotational direction about toroidal axis 1. Plasma sources disclosed herein will be considered to define a toroidal axis that passes through a centroid of the plasma source (not necessarily through a physical feature of the plasma source), with a plasma generation cavity of the plasma source being generally toroidal, radially symmetric with respect to the toroidal axis, and extending about the toroidal axis in a plane that is perpendicular to the toroidal axis. A major circumference 21 of a toroidal element is defined as extending azimuthally about the toroidal axis at its outer bound, e.g., as shown for plasma block 210(1) below; major circumference 21 is not shown extending all the way around plasma block 210(1) in FIG. 2, for clarity of illustration. A minor circumference extends about an element such as plasma block 210(1) at a single azimuthal location relative to the toroidal axis 1, e.g., as shown as minor circumference 22, FIG. 2.

Plasma source 200 includes plasma block 210(1), a magnetic element 220(1) and an induction coil 230. Magnetic element 220(1) extends at least partially about plasma block 210(1), and induction coil 230 winds at least partially about magnetic element 220(1). Although magnetic element 220(1) is shown in a toroidal shape, it is not necessary that magnetic elements 220 be toroidal, have a round cross section or extend completely about a plasma block 210. Plasma block 210(1) may be evacuated, and plasma source gases may be introduced into plasma block 210(1). With the plasma source gases within plasma block 210(1), current is passed through induction coil 230, inducing magnetic flux within magnetic element 220(1), which in turn induces an electric current within plasma block 210(1), igniting a plasma.

Plasma source 200 can thus be seen to resemble a transformer in which a primary current flows through induction coil 230 and a secondary current flows within plasma block 210(1). Advantageously, plasma source 200 confines the secondary current within the gases and/or plasma ignited within plasma block 210(1), thus, advantageously, plasma block 210(1) is not formed of a conductor that defines a complete azimuthal circuit. In certain embodiments, plasma block 210(1) is fabricated of a dielectric material, however, as discussed below, aluminum is often a convenient material from which to make at least portions of plasma block 210(1). When plasma block 210(1) is made from aluminum or another substantially conductive material, external fields can be coupled into plasma block 210(1) and the azimuthal circuit path can be interrupted by including one or more dielectric breaks 240 that extend about the minor circumference of plasma block 210(1).

Plasma block 210(1) defines a plurality of output apertures, at multiple azimuthal locations, but on a single axial side thereof, through which plasma products are distributed, for use in plasma processing. For example, in FIG. 2, the output apertures are not visible, but connect with outlets 250 to distribute the plasma products in the direction of the arrows shown. By providing output apertures at multiple azimuthal locations about one axial side of plasma block 210(1), plasma source 200 advantageously provides a circular distribution of outlets 250 such that plasma products provided therein are equally distant from the plasma that generates them. This allows direct coupling of a circular pattern of plasma products to a process chamber, such that the plasma products reach the process chamber in a circular and spatially broad pattern while all points of the pattern are at a substantially equal distance from the plasma.

One advantage of the direct outlet toroidal plasma source embodiments herein lies in providing plasma products across a wide and circularly symmetric pattern in which all points are substantially equidistant from the plasma. This minimizes differences in recombination effects and wall effects that would otherwise affect process results at differing locations. While typical inductive plasma systems may generate plasma products utilizing a toroidal plasma chamber, such systems typically distribute the plasma products through a single port or nozzle that provides differing distances from the plasma to various locations on the workpiece.

Another advantage of the embodiments herein lies in the ability to generate plasmas at relatively high pressures without excessive sputtering damage to internal surfaces due to ions being accelerated by high electric fields. Embodiments herein can be operated, for example in pressure regimes of 0.5 Torr or less to 100 Torr or more. Other types of inductively coupled plasma sources often expose plasma blocks to high electric fields, such fields typically arising from induction coils that are positioned near to the plasma block. Ions in the plasma that experience such fields are accelerated in the direction of the fields, often striking the internal plasma block walls and sputtering the material thereof. Sputtering damage results in reduced equipment lifetime and/or excessive maintenance requirements, incurring labor and material costs, and tool downtime. In contrast, the designs herein minimize exposure of plasma blocks to electric fields except along the direction of the toroidal plasma cavity, such that magnetic flux steered by magnetic elements generates secondary current within the plasma itself without introducing electric fields that would cause sputtering of the plasma block surfaces. This, in turn, enables at least some embodiments herein to use plasma blocks made primarily of aluminum with untreated surfaces, as opposed to more expensive materials, or aluminum with specially treated surfaces. Treated surfaces remain an option.

Magnetic elements 220 herein are typically formed of ferrite. Induction coils 230 are typically formed of copper, optionally plated with silver for decreased outer skin electrical resistivity. Both magnetic elements 220 and induction coils 230, and certain regions or parts of plasma blocks 210, may include channels for cooling gases or liquids, as discussed further herein, to remove heat generated by electrical and magnetic losses during operation. As noted above, plasma blocks 210 may be fabricated of aluminum with untreated surfaces, or with surface treatments such as anodization, or alumina, aluminum nitride or yttria coatings. Other material choices are also possible and may be made by considering cost, machinability, electrical conductivity, thermal expansion, heat dissipation characteristics, and compatibility with intended gases and plasma products.

Figure 3:
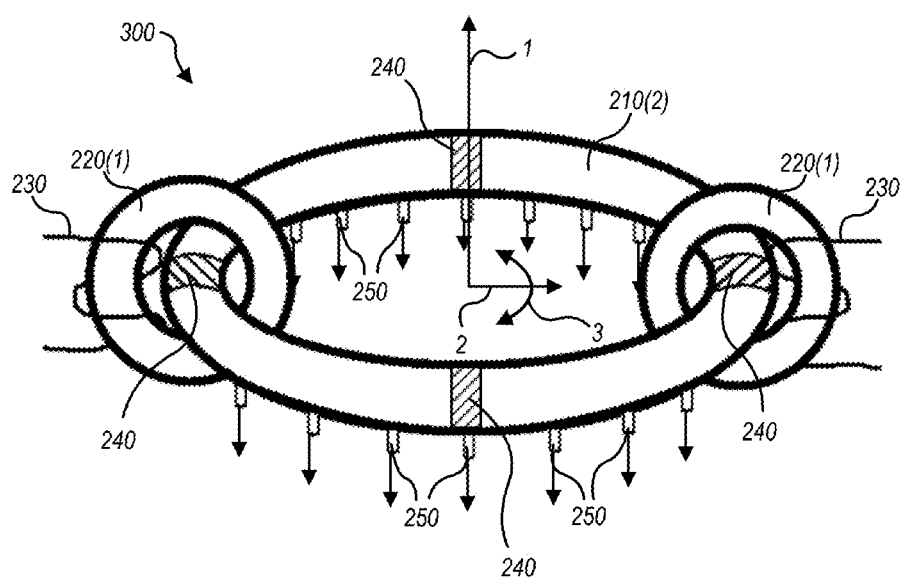
FIG. 3 schematically illustrates selected elements of a direct outlet toroidal plasma source, according to an embodiment.

FIG. 3 schematically illustrates selected elements of a direct outlet toroidal plasma source 300. Plasma source 300 shares many of the same elements with plasma source 200, FIG. 2, but includes a plasma block 210(2), two magnetic elements 220(1) with respective induction coils 230. The toroidal axis 1, radial direction 2 and azimuthal direction 3 are shown again in FIG. 3 for reference. For symmetric and efficient plasma generation, magnetic elements 220(1) are located azimuthally opposite one another about plasma block 210(2). Also, plasma block 210(2) of plasma source 300 includes four dielectric breaks 240; two dielectric breaks 240 are located near magnetic elements 220(1) while the other two are located at 90 degree intervals about the circumference of plasma block 210(2) from magnetic elements 220(1).

Figure 4:
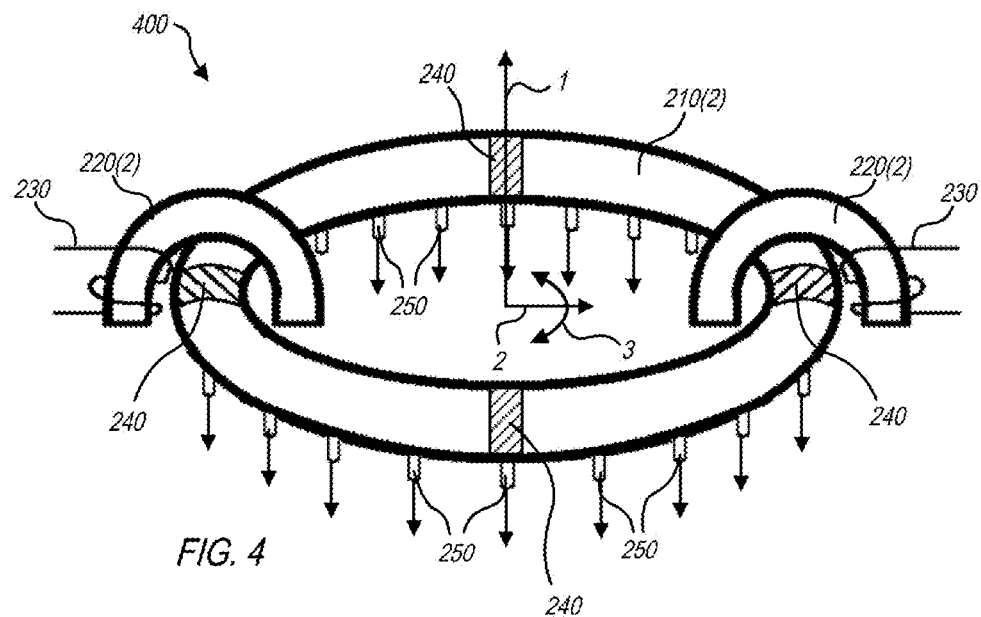
FIG. 4 schematically illustrates selected elements of a direct outlet toroidal plasma source, according to an embodiment.

FIG. 4 schematically illustrates selected elements of a direct outlet toroidal plasma source 400. Plasma source 400 shares many of the same elements with plasma source 200 and 300, but includes two magnetic elements 220(2) that are U- or horseshoe-shaped, instead of toroidal. Use of U- or horseshoe-shaped magnetic elements helps facilitate certain constructions of direct outlet toroidal plasma sources, as further described below.

Figure 5:
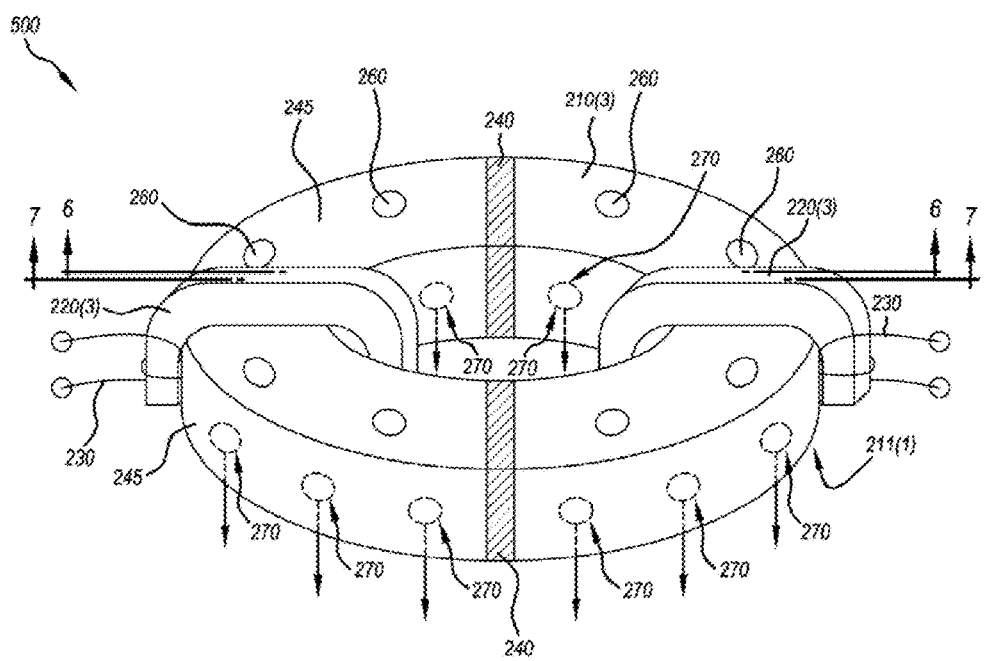
FIG. 5 schematically illustrates selected elements of a direct outlet toroidal plasma source, according to an embodiment.

FIG. 5 schematically illustrates selected elements of a direct outlet toroidal plasma source 500. Toroidal axis 1, radial direction 2 and azimuthal direction 3 are not shown again in FIG. 5, for clarity of illustration, but remain as defined in FIG. 2. Plasma source 500 shares many of the same elements with plasma source 200, 300 and 400. Plasma block 210(3) includes metal sections 245 with dielectric breaks 240 (two of which are hidden by magnetic elements 220(3) in the view of FIG. 5. Plasma block 210(3) is flattened on an axial side 211(1) (labeled, but hidden in the view of FIG. 5). Plasma block 210(3) defines inlet apertures 260 in sections 245. Plasma block 210(3) also defines outlet apertures 270 on axial side 211(2), as shown. The locations and numbers of inlet apertures 260 and outlet apertures 270 shown in FIG. 5 are merely illustrative; not all instances of such apertures are shown or labeled, for clarity of illustration. In practice, inlet apertures 260 may be located to provide uniform source gas introduction into plasma block 210(3), but may otherwise be arranged for convenient integration with other components of plasma source 500. Outlet apertures 270 are typically more numerous than shown in FIG. 5, are arranged to provide uniform plasma product distribution to an adjacent process chamber, and may be defined either in sections 245 or dielectric breaks 240 (see FIGS. 6 and 7). Broken lines 6-6 and 7-7 denote planes at which the cutaway views shown in FIGS. 6 and 7, respectively, are taken.

Figure 6:
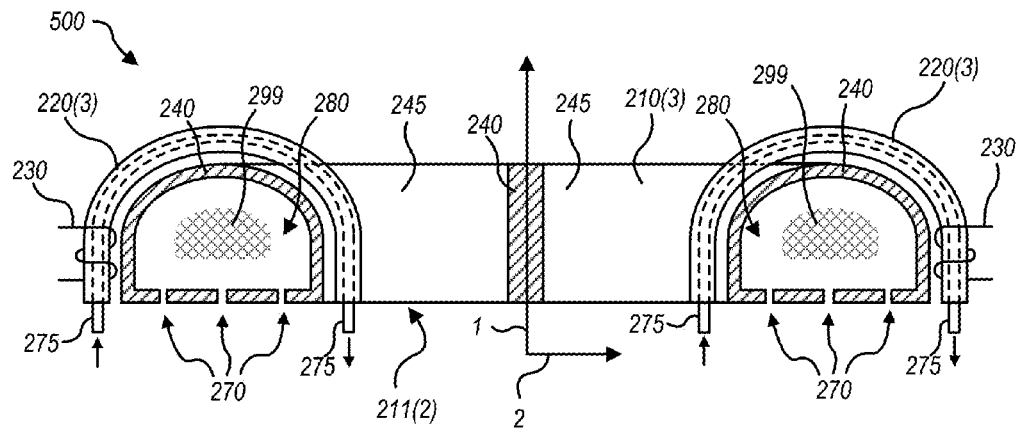
FIG. 6 is a schematic cutaway view of the direct outlet toroidal plasma source of FIG. 5, taken at broken line 6-6.
Figure 7:
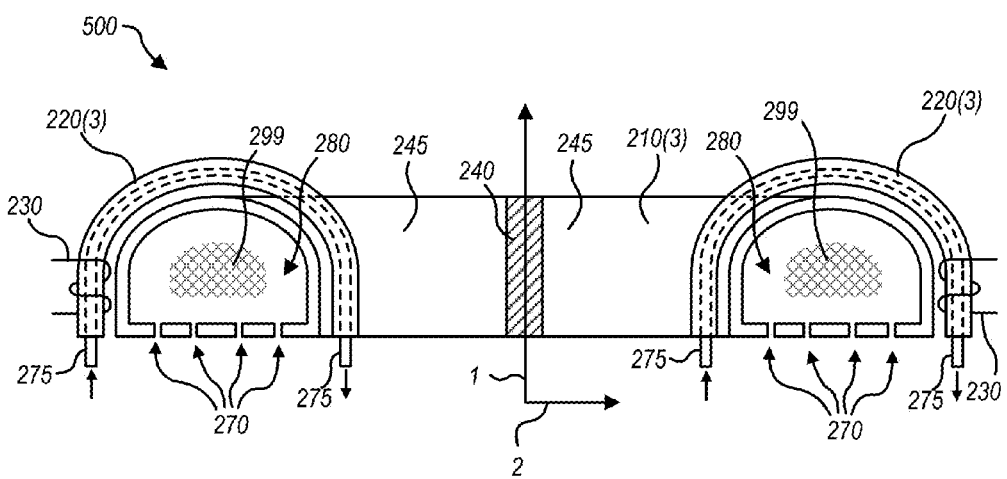
FIG. 7 is a schematic cutaway view of the direct outlet toroidal plasma source of FIG. 5, taken at broken line 7-7.

FIGS. 6 and 7 are schematic cutaway views of direct outlet toroidal plasma source 500 taken at broken lines 6-6 and 7-7, respectively, of FIG. 5. FIG. 6 shows the cutaway taken through one of dielectric breaks 240 (hidden beneath magnetic elements 220(3) in the view of FIG. 5). The toroidal axis 1 and radial direction 2 are shown again in FIGS. 6 and 7 for reference; azimuthal direction arcs in or out of the planes of FIGS. 6 and 7, changing sign from left to right of toroidal axis 1. Some outlet apertures 270 are defined by dielectric break 240 on axial side 211(2) of plasma block 210(3), as shown. A plasma cavity 280, and a plasma 299 formed therein, are also shown. FIG. 7 shows the cutaway taken through one of metal sections 245. Some outlet apertures 270 are defined by dielectric break 240 on axial side 211(2) of plasma block 210(3), as shown. Plasma cavity 280, and plasma 299 formed therein, are also shown.

FIGS. 6 and 7 also show cooling tubes 275 through magnetic elements 220(3). Cooling tubes 275 may provide fluid connections for gases or liquids to remove heat dissipated by magnetic elements 220(3); the feature of providing cooling channels is contemplated for any of the magnetic elements described herein, although not shown in many cases for clarity of illustration. Similarly, cooling tubes may be provided in induction coils 230 and/or various other plasma source components; some such arrangements are shown and described herein while others are not, for clarity of illustration.

Figure 8:
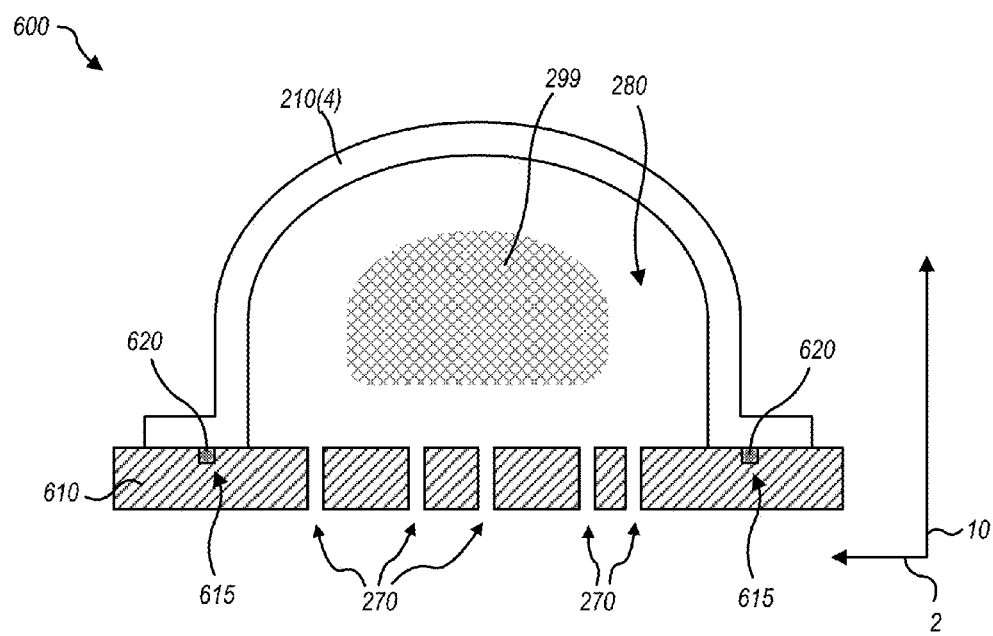
FIG. 8 schematically illustrates a direct outlet toroidal plasma source having a plasma cavity that is defined by disposing a plasma block adjacent a plate, according to an embodiment.

FIG. 8 schematically illustrates a portion of a direct outlet toroidal plasma source 600 in which a plasma cavity 280 is defined by disposing a plasma block 210(4) adjacent a plate 610. A direction 10 of the toroidal axis, and radial direction 2 are shown again in FIG. 8 for reference. The actual toroidal axis passes through a centroid of plasma cavity 280, outside the view of FIG. 8; an azimuthal direction arcs in and out of the plane of FIG. 8. For manufacturability and maintenance purposes, it may be advantageous to provide a plasma cavity defined by components that are easily machinable and interchangeable. Plasma source 600 thus defines plasma cavity 280 by providing plasma block 210(4) as a relatively simple shape, with the ability to seal plasma block 210(4) to plate 610 that defines outlet apertures 270 therein. The ability to seal plasma block 210(4) to plate 610 is provided by grooves 615 in plate 610 that accommodate one or more o-rings 620. When plasma cavity 280 is evacuated, external atmospheric pressure forces plasma block 210(4) against o-rings 620 to form the seal. In the embodiment shown in FIG. 8, plate 610 is formed of a dielectric material. Suitable materials for plate 610, as well as dielectric breaks 240, include ceramics, in particular aluminum nitride or aluminum oxide, or fused quartz. Forming plate 610 of a dielectric material allows dielectric breaks 240 of plasma block 210(4) to interrupt azimuthal currents so that plasma 299 can form; that is, if plate 610 were formed of metal and were electrically coupled to plasma block 210(4), electric currents induced by the magnetic elements would merely race around the azimuthal circuit thus formed, reducing the coupling of electric fields into plasma cavity 280. Dielectric breaks 240 extend completely around the minor circumference of plasma blocks 210 herein; in the azimuthal direction, dielectric breaks 240 need to be of sufficient width to inhibit electrical arcing of adjacent metal segments of the plasma block 210, such as about one quarter inch to one inch.

Figure 9:
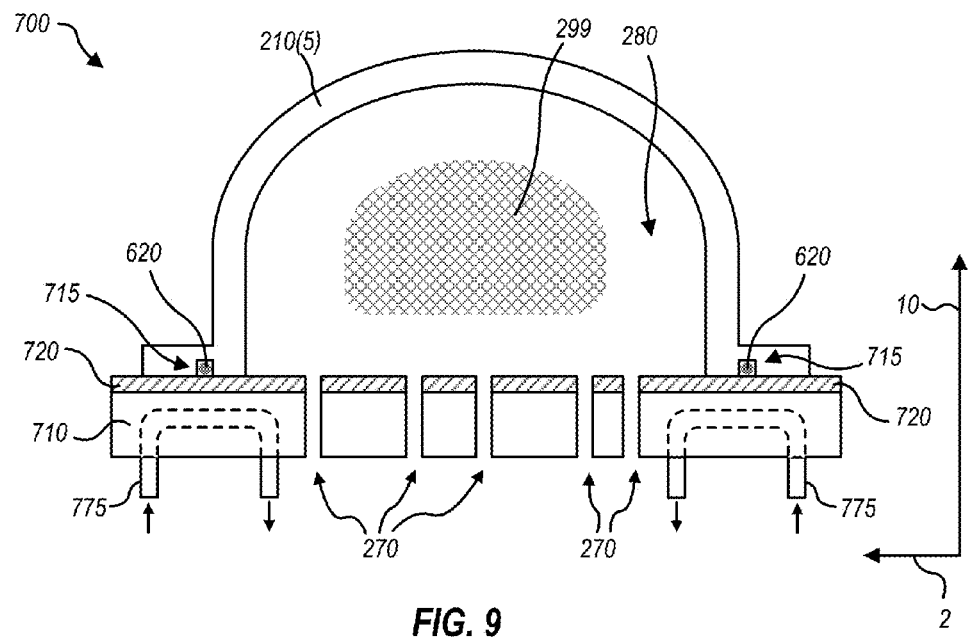
FIG. 9 schematically illustrates another direct outlet toroidal plasma source having a plasma cavity that is defined by disposing a plasma block adjacent a plate, according to an embodiment.

FIG. 9 schematically illustrates a direct outlet toroidal plasma source 700 having a plasma cavity 280 that is defined by disposing a plasma block 210(5) adjacent a plate 710. Direction 10 of the toroidal axis, and radial direction 2, are shown again in FIG. 9 for reference; azimuthal direction arcs in and out of the plane of FIG. 9. Plate 710 is formed of a conductor, and includes a dielectric barrier 720 at a surface thereof that contacts plasma block 210(5). Dielectric barrier 720 thus defeats shorting of plasma block 210(5) to the conductor forming plate 710, to interrupt the azimuthal currents that would otherwise form. Plasma source 700 thus defines plasma cavity 280 by providing plasma block 210(5) as a relatively simple shape, with the ability to seal plasma block 210(5) to plate 710 that defines outlet apertures 270 therein. The ability to seal plasma block 210(4) to plate 710 is provided by grooves 715 in plasma block 210(5) that accommodate one or more o-rings 620. When plasma cavity 280 is evacuated, external atmospheric pressure forces plate 710 against o-rings 620 to form the seal. The design illustrated in FIG. 9 enables plasma block 210(5) and plate 710 to be held at different potentials; this allows control of a ratio of radicals to ions within plasma products emitted through output apertures 270 toward a processing location. FIG. 9 also shows cooling tubes 775 that provide gas or liquid cooling of plate 710. Cooling tubes 775 may be provided in other components herein, such as plasma blocks, top or bottom plates of plasma sources or plasma chambers, or side walls of plasma chambers.

Figure 10:
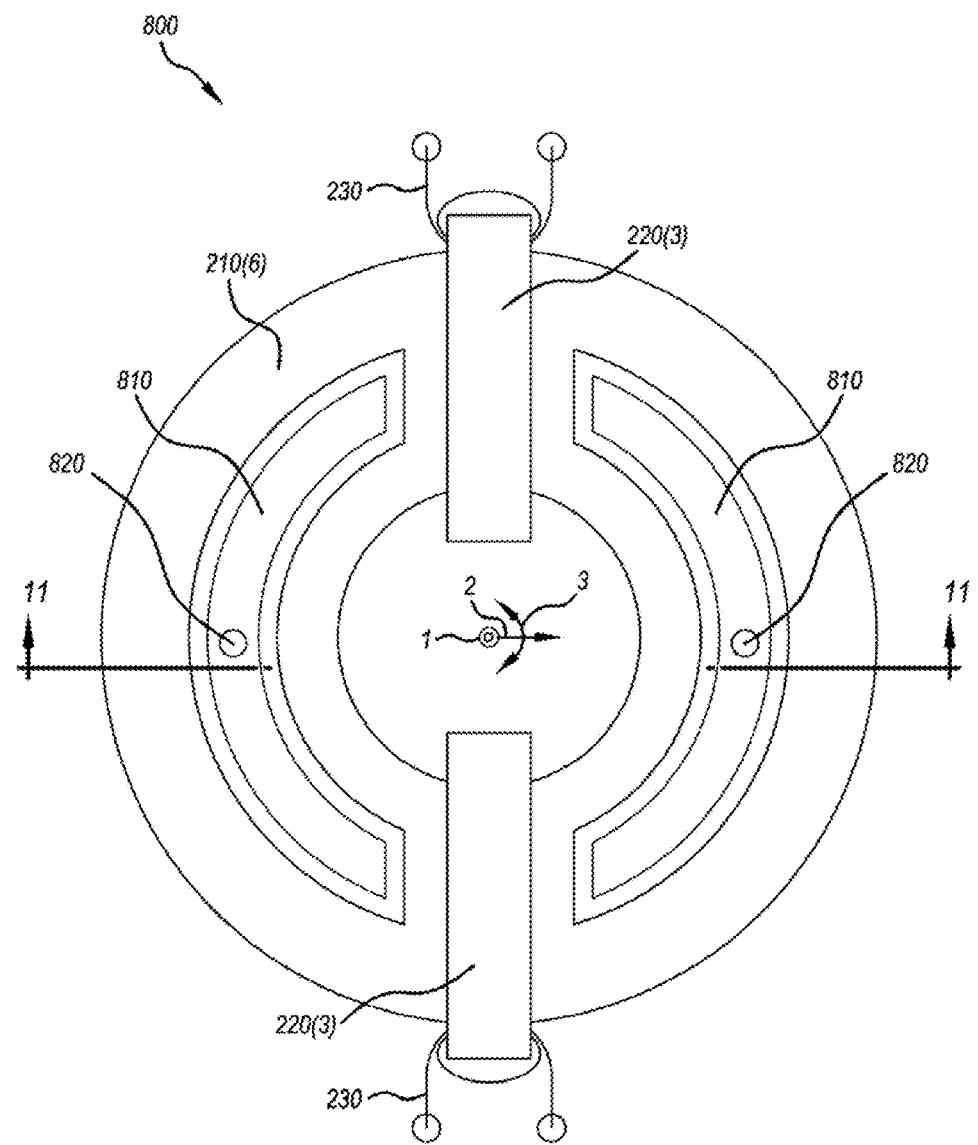
FIG. 10 schematically illustrates a direct outlet toroidal plasma source, showing an inlet gas manifold that supplies source gases to a plasma cavity therein, according to an embodiment.

FIG. 10 schematically illustrates a direct outlet toroidal plasma source 800, showing an inlet gas manifold 810 that supplies source gases to a plasma cavity therein. Radial direction 2 and azimuthal direction 3 are shown in FIG. 10 for reference; the toroidal axis 1 extends out of the plane of FIG. 10. The top view illustrated in FIG. 10 shows magnetic elements 220(3) on opposing sides of a plasma block 210(6), with a pair of gas manifolds 810 on either side. Each of gas manifolds 810 receives source gases through one or more inlets 820; although only one inlet 820 is illustrated in FIG. 10, it is understood that inlets 820 may vary in number and position. Gas manifold 810 distributes the source gases into plasma block 210(6) through apertures therein, as now discussed. A broken line 11-11 indicates a cross-sectional plane of plasma source 800 that is illustrated in further detail in FIG. 11.

Figure 11:
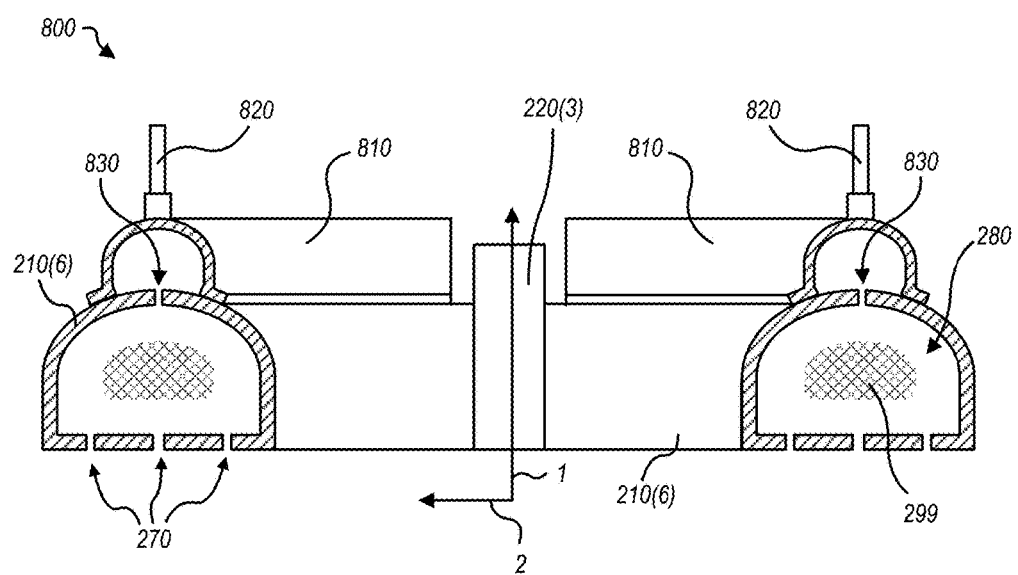
FIG. 11 is a schematic cutaway view along line 11-11 of FIG. 10.

FIG. 11 is a schematic cutaway view along broken line 11-11 of FIG. 10, illustrating direct outlet toroidal plasma source 800. The toroidal axis 1 and radial direction 2 are shown again in FIG. 11 for reference; azimuthal direction arcs in or out of the plane of FIG. 11, changing sign from left to right of toroidal axis 1. An inlet gas stream is introduced into gas manifolds 810 through inlet apertures 820, then passes into plasma cavity 280 through apertures 830 defined by plasma block 210(6). Inlet apertures 820 are shown as vertical (e.g., parallel with toroidal axis 1) in the view of FIG. 11, but may be defined at other angles to encourage mixing or other effects in plasma cavity 280 (see also FIGS. 12 and 13). Gas manifold 810 may be constructed to contain only a small gas volume so that changes in the source gas stream (e.g., introduced by upstream valves or other gas management equipment) rapidly transfer into plasma cavity 280. Gas manifold 810 may include a pressure sensor to provide information about pressure therein, to facilitate understanding of factors affecting plasma processing. Material choices for a gas manifold 810 are the same as for a plasma block 210 that it is associated with; for example metals such as aluminum, with or without treated surfaces, or dielectrics such as alumina, aluminum nitride, and other ceramics are possible choices. When gas manifold 810 and its associated plasma block 210 are both made of metal, it may be desirable to isolate gas manifold 810 from plasma block 210 and/or to provide dielectric breaks in gas manifold 810, to avoid completing an azimuthal electrical circuit, as discussed above.

Figure 12:
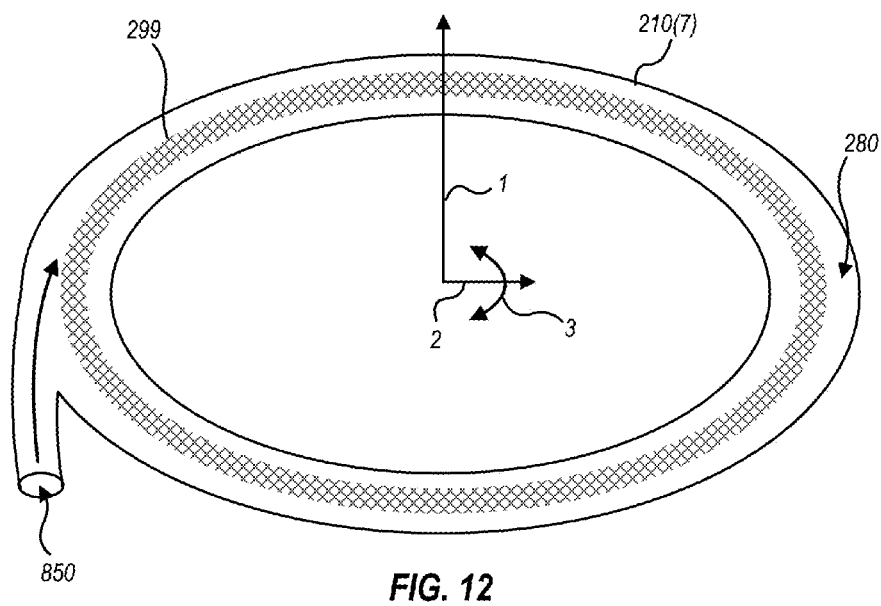
FIG. 12 schematically illustrates a plasma block of a direct outlet toroidal plasma source with an inline gas injection port for introducing source gases, according to an embodiment.

FIG. 12 schematically illustrates a plasma block 210(7) of a direct outlet toroidal plasma source with an inline gas inlet aperture 850 for introducing source gases. The toroidal axis 1, radial direction 2 and azimuthal direction 3 are shown again in FIG. 12 for reference. Inline gas inlet aperture 850 is substantially azimuthally aligned with plasma cavity 280, as shown. Introducing a source gas stream through gas inlet aperture 850 imparts an azimuthal velocity to the injected gas to encourage thorough mixing within plasma block 210(7). In embodiments, inline gas inlet aperture 850 may be exactly azimuthally aligned, as shown in FIG. 12, however in other embodiments an inline gas inlet aperture may be only partially aligned, for example defining an angle where it intersects plasma cavity 280. A source gas passing through an inline gas inlet aperture 850 at any angle having a nonzero azimuthal component relative to the toroidal axis will generate at least some azimuthal velocity in the gas as it is introduced into plasma cavity 280.

Figure 13:
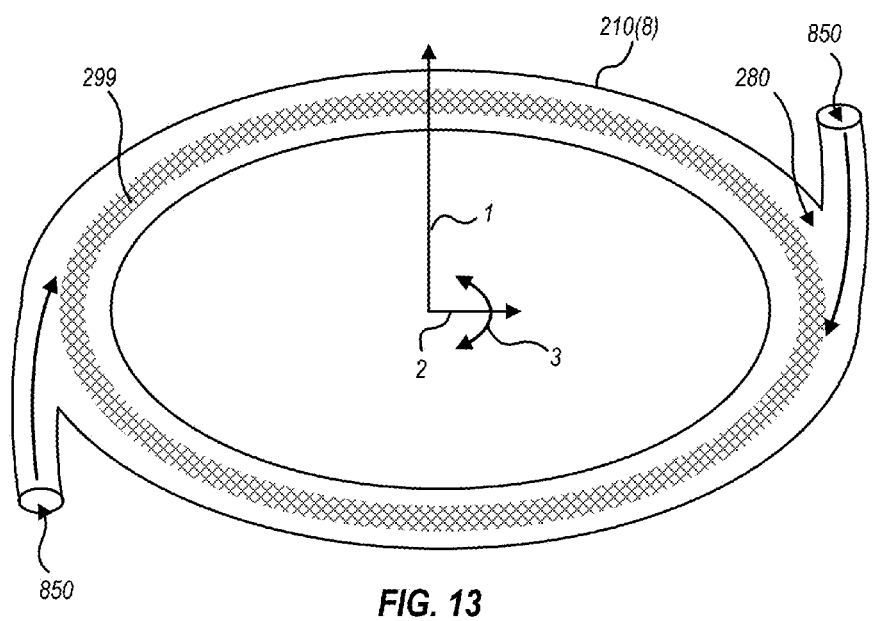
FIG. 13 schematically illustrates a plasma block of a direct outlet toroidal plasma source with a plurality of inline gas injection ports for introducing source gases, according to an embodiment.

FIG. 13 schematically illustrates a plasma block 210(8) of a direct outlet toroidal plasma source with a plurality of inline gas inlet apertures 850. The toroidal axis 1, radial direction 2 and azimuthal direction 3 are shown again in FIG. 13 for reference. It is contemplated that any number of inline gas inlet apertures 850 could be utilized, and that inline gas inlet apertures 850 could be used in combination with gas inlet apertures at other angles and/or with variations of gas manifold 810, as illustrated in FIGS. 10 and 11.

Figure 14:
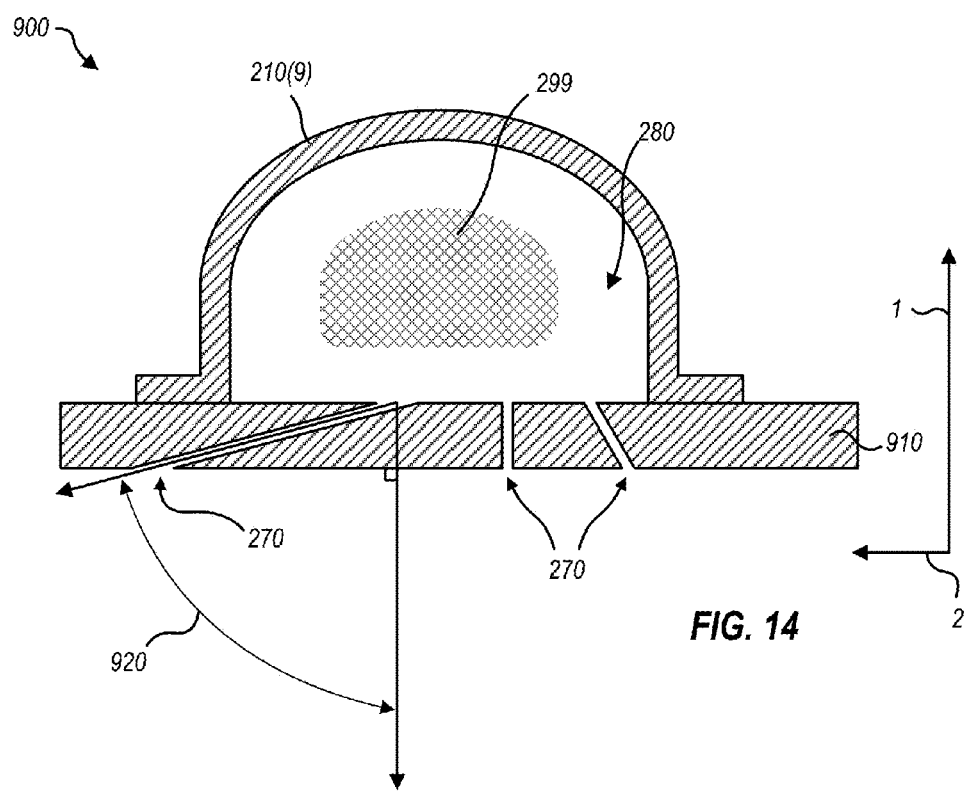
FIG. 14 schematically illustrates a plasma block of a direct outlet toroidal plasma source, showing how outlet apertures may be defined at a plurality of angles with respect to a surface normal of a plate that forms one axial side thereof, according to an embodiment.

FIG. 14 schematically illustrates a plasma block 210(9) of a direct outlet toroidal plasma source 900, showing how outlet apertures 270 may be defined at a plurality of angles 920 with respect to a surface normal of a plate 910 that forms one axial side thereof. Direction 10 of the toroidal axis, and radial direction 2, are shown again in FIG. 14 for reference; azimuthal direction arcs in and out of the plane of FIG. 14. Forming outlet apertures 270 at a plurality of angles can help in distributing plasma products broadly into an adjacent plasma processing apparatus, to facilitate uniform processing.

Figure 15A:
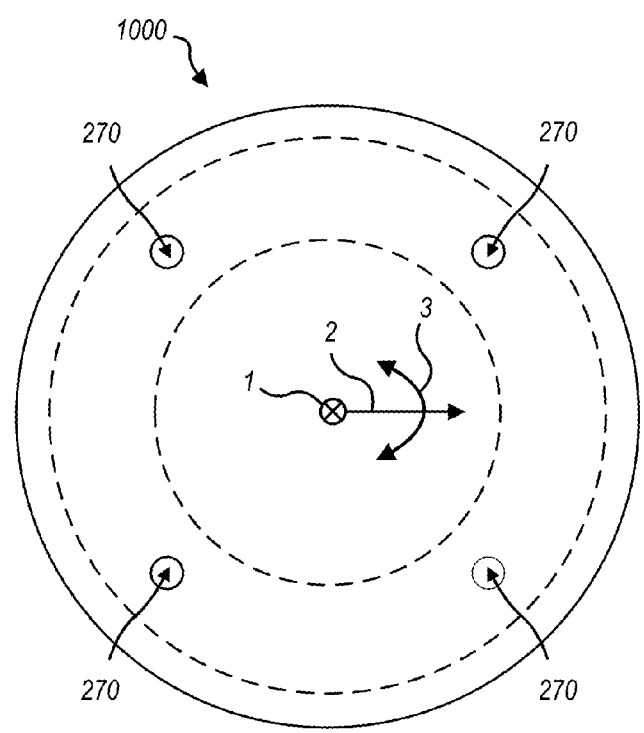
FIG. 15A is a schematic bottom view illustrating a direct outlet toroidal plasma sources in which four outlet apertures are defined, according to an embodiment.
Figure 15B:
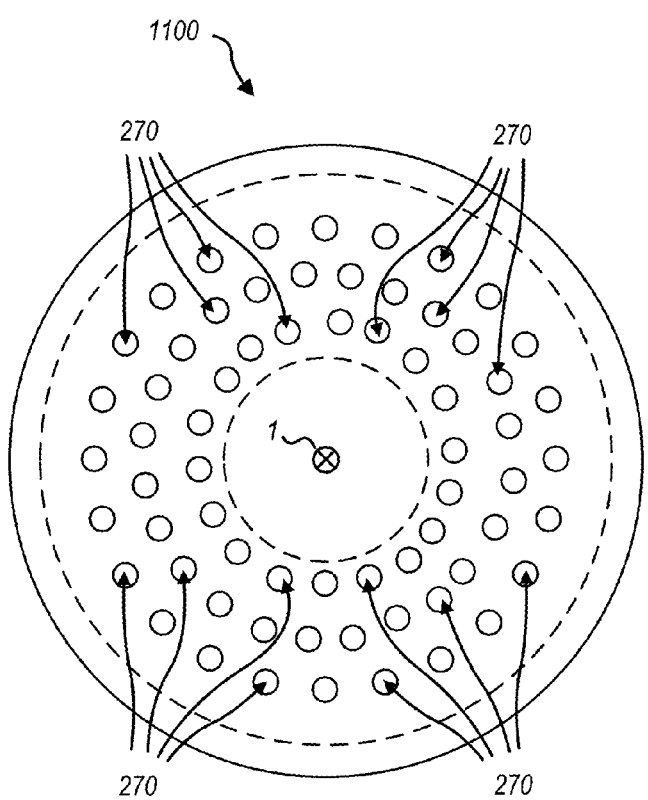
FIG. 15B is a schematic bottom view illustrating a direct outlet toroidal plasma sources in which over sixty outlet apertures are defined, according to an embodiment.

FIG. 15A is a schematic bottom view illustration of a direct outlet toroidal plasma source 1000 in which four outlet apertures 270 are defined. The view of FIG. 15 schematically depicts a bottom plate of direct outlet toroidal plasma source 1000, with approximate boundaries of a plasma block on the other side of the plate suggested by broken lines. Even with only four outlet apertures 270, plasma source 1000 may provide significantly more uniform processing than prior art remote plasma sources that extract output from only one aperture. Toroidal axis 1 extends into the planes of FIGS. 15A and 15B; radial direction 2 and azimuthal direction 3 are shown in FIG. 15A for reference but are omitted in FIG. 15B for clarity of illustration. FIG. 15B is a schematic bottom view illustration of a direct outlet toroidal plasma source 1100 in which over sixty outlet apertures 270 are defined. The view of FIG. 15B schematically depicts a bottom plate of direct outlet toroidal plasma source 1100, with approximate boundaries of a plasma block on the other side of the plate suggested by broken lines. Geometries and materials of the corresponding plasma block, number and placement of magnetic elements and induction coils may be optimized to generate a uniform plasma distribution within the plasma block such that plasma products extracted through outlet apertures 270 are spatially uniform across plasma source 1100. In embodiments, a direct toroidal plasma source may include hundreds or thousands of outlet apertures 270.

Figure 16:
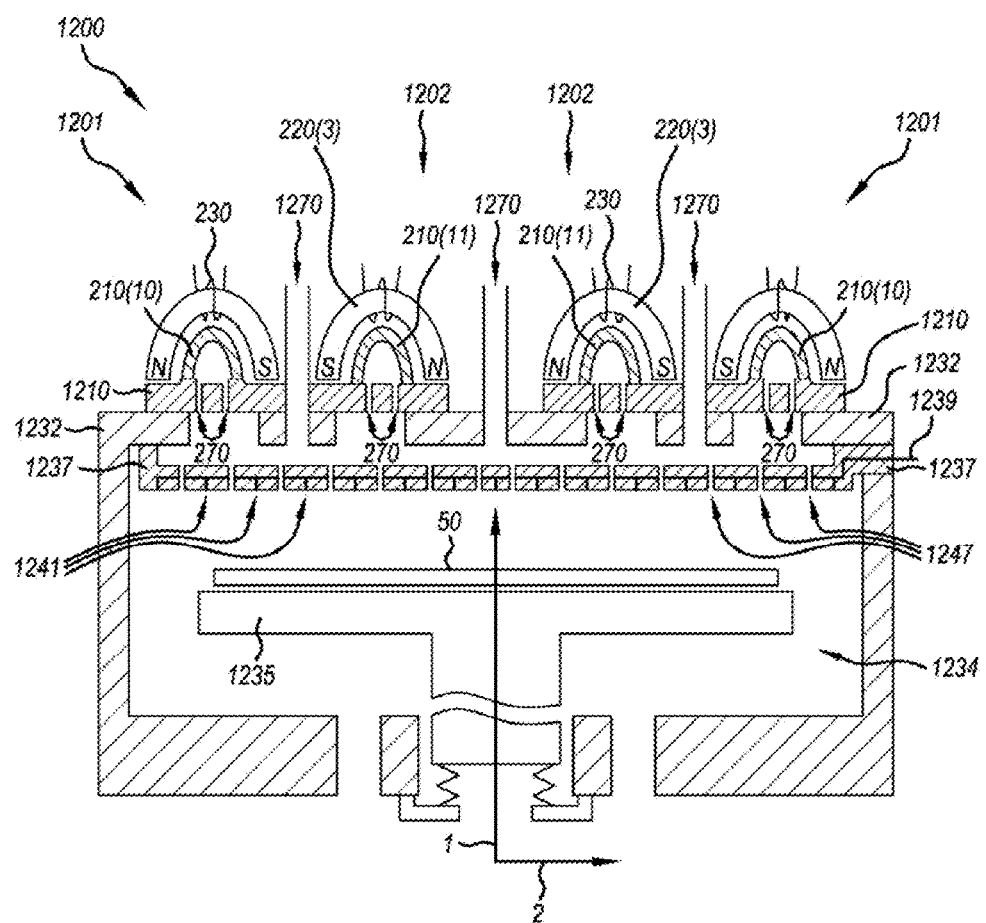
FIG. 16 schematically illustrates, in a cross-sectional view, a plasma wafer processing system that includes two direct outlet toroidal plasma sources, according to an embodiment.

FIG. 16 schematically illustrates, in a cross-sectional view, a plasma wafer processing system 1200 that includes two direct outlet toroidal plasma sources 1201 and 1202. Only representative components of processing system 1200 are labeled, and FIG. 16 is not drawn to scale, for clarity of illustration. The toroidal axis 1 and radial direction 2 are shown again in FIG. 16 for reference; azimuthal direction arcs in or out of the planes of FIG. 16, changing sign from left to right of toroidal axis 1. Plasma wafer processing system defines a process chamber 1234 that is radially symmetric about toroidal axis 1; thus plasma source 1201 may be considered an outer plasma source while plasma source 1202 may be considered an inner plasma source, with the toroidal axes of plasma sources 1201 and 1202, and an axis of symmetry of plasma chamber 1234, all being coincident. Again, although FIG. 16 is an embodiment directed to wafer processing, it is understood that other embodiments may utilize the same principles for processing of other workpieces.

Plasma wafer processing system 1200 utilizes plasma sources 1201 and 1202 to generate plasma products, and is configured for optional mixing of the plasma products with un-activated gases as they move from the location of the plasma to a workpiece 50 being processed. Plasma wafer processing system 1200 defines a process chamber 1234 in which a pedestal 1235 positions a workpiece 50 at a processing location, as shown. Plasma source 1201 forms an outer toroidal shape, and plasma source 1202 forms an inner toroidal shape, atop a top surface 1232 of chamber 1234. Plasma sources 1201 and 1202 may receive source gases from inlet apertures 260 or 830, as shown in FIGS. 5 and 11 respectively, with or without a gas manifold 810 as shown in FIGS. 10 and 11; such structures are not shown in the view of FIG. 16. Each of plasma sources 1201 and 1202 includes a respective plasma block 210(10) or 210(11), and utilizes induction coils 230 and magnetic elements 220(3) to generate a plasma from the source gases therein. Plasma sources 1201 and 1202 share a common bottom plate 1210 that defines apertures 270 for distributing plasma products toward process chamber 1234.

Apertures 270 in the bottom plate 1210 provide uniform, axial direction (e.g., in the direction of the toroidal axis) and short paths for plasma products to be distributed from the plasma where they originate, to workpiece 50 being processed. The use of two plasma sources 1201 and 1202, with plasma source 1201 defining an outer toroid and plasma source 1202 defining an inner toroid, provides a significant degree of freedom in optimizing center-to-edge uniformity of processing for workpiece 50. Process recipes may be optimized by varying process parameters particular to plasma sources 1201 and 1202 and measuring effects on test and/or product wafers processed in system 1200. Overall gas flows and RF energy provided to plasma sources 1201 and/or 1202 may be adjusted until the effects are uniform across each workpiece 50 processed. In embodiments, plasma sources 1201 and 1202 may run different ratios of reactive gases than one another, and/or may utilize entirely different source gases than one another.

Figure 17A:
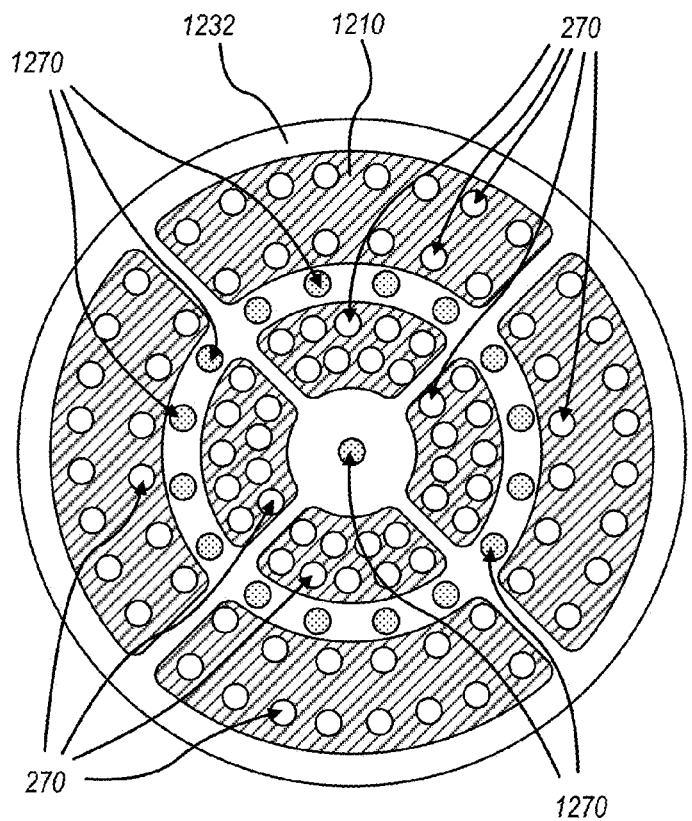
FIG. 17A schematically illustrates an upward facing, schematic plan view of a top surface of the plasma processing system of FIG. 16, with features of a bottom plate of the two direct toroidal plasma sources visible.

Processing system 1200 also provides gas inlets 1270 that pass through bottom plate 1210 and top surface 1232, for supplying un-activated gases to be mixed with the plasma products (see also FIG. 17A). The number and distribution of apertures 270 and/or gas inlets 1270 shown in FIGS. 16 and 17A are representative only, and may vary among embodiments.

Bottom plate 1210 is separate from top surface 1232 of chamber 1234 in embodiments, as shown, for ease of assembly and interchangeability of parts. That is, plasma sources 1201 and 1202 may be assembled with bottom plate 1210 and installed or removed from top surface 1232 as a single unit. However, in embodiments, the features of bottom plate 1210 and top surface 1232 may be combined in a single plate.

FIG. 16 also shows an optional diffuser plate 1237 that defines apertures 1247 for the plasma products to proceed into process chamber 1234. Diffuser plate 1237 can also include one or more gas passages 1239 to conduct un-activated gases that can mix with the plasma products. For example, as shown in FIG. 16, gas passage 1239 connects with output gas apertures 1241 defined in a chamber-facing side of diffuser plate 1237 (see also FIG. 17B). The number and distribution of apertures 1247 and/or output gas apertures 1241 shown in FIGS. 16 and 17B are representative only, and may vary among embodiments.

FIG. 17A schematically illustrates an upward facing, schematic plan view of top surface 1232 of plasma processing system 1200, FIG. 16, with features of bottom plate 1210 of direct toroidal plasma sources 1201 and 1202 visible. Only representative components of top surface 1232 and bottom plate 1210 are labeled, and FIG. 17A is not drawn to scale, for clarity of illustration. The toroidal axis, radial and azimuthal directions are not shown in FIGS. 17A and 17B, but can be determined from those shown in other drawings. The numerous apertures 270 provide paths for plasma products from plasma sources 1201 and 1202 that are very short and uniform in length, from the plasmas where they are generated, to the workpiece being processed, promoting uniform processing across chamber 1234. For example, paths from plasma within plasma sources 1201 and/or 1202, to any location on workpiece 50, may be less than four inches, in embodiments. Providing gas inlets 1270 interspersed with apertures 270 enables mixing un-activated gases with the plasma products. Certain embodiments advantageously process wafers with plasma products and un-activated gases as they emerge from the structures shown in FIG. 17A, that is, in processing systems 1200 that do not include diffuser 1237. Other embodiments may benefit from the additional gas and plasma product mixing provided by diffuser plate 1237.

Figure 17B:
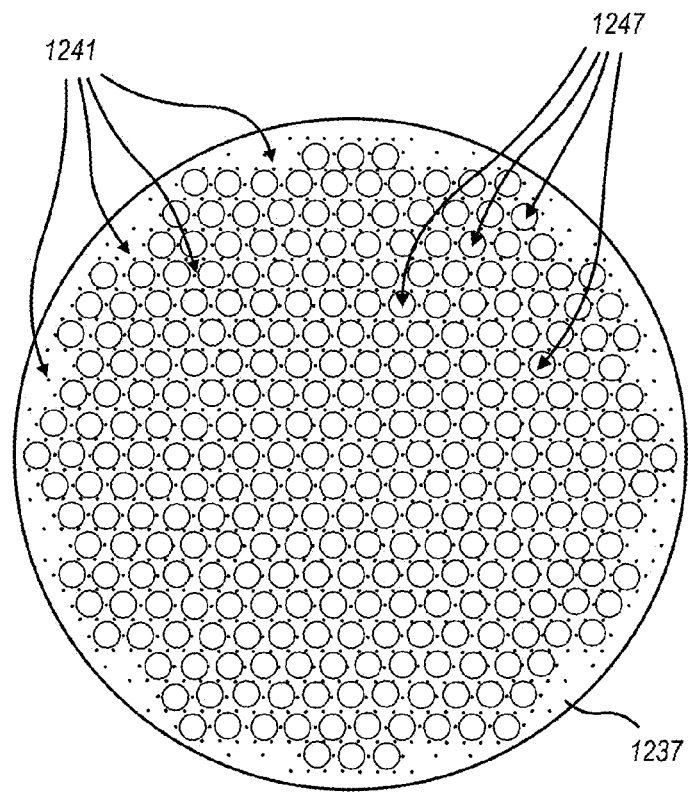
FIG. 17B schematically illustrates an upward facing, schematic plan view of a diffuser plate of the plasma processing system of FIG. 16.

FIG. 17B schematically illustrates an upward facing, schematic plan view of diffuser 1237. Only representative features of diffuser plate 1237 are labeled, and FIG. 17B is not drawn to scale, for clarity of illustration. Apertures 1247 (illustrated as open circles) extend all the way through diffuser plate 1237, while outlet gas apertures 1241 (illustrated as dots) extend only into the bottom surface of diffuser plate 1237, where they are supplied with un-activated gas from gas passage 1239. Diffuser 1237 facilitates further mixing and fine control of ratios of plasma products to un-activated gases, which may be advantageous for some plasma processes, but may be unnecessary for others.

Figure 18:
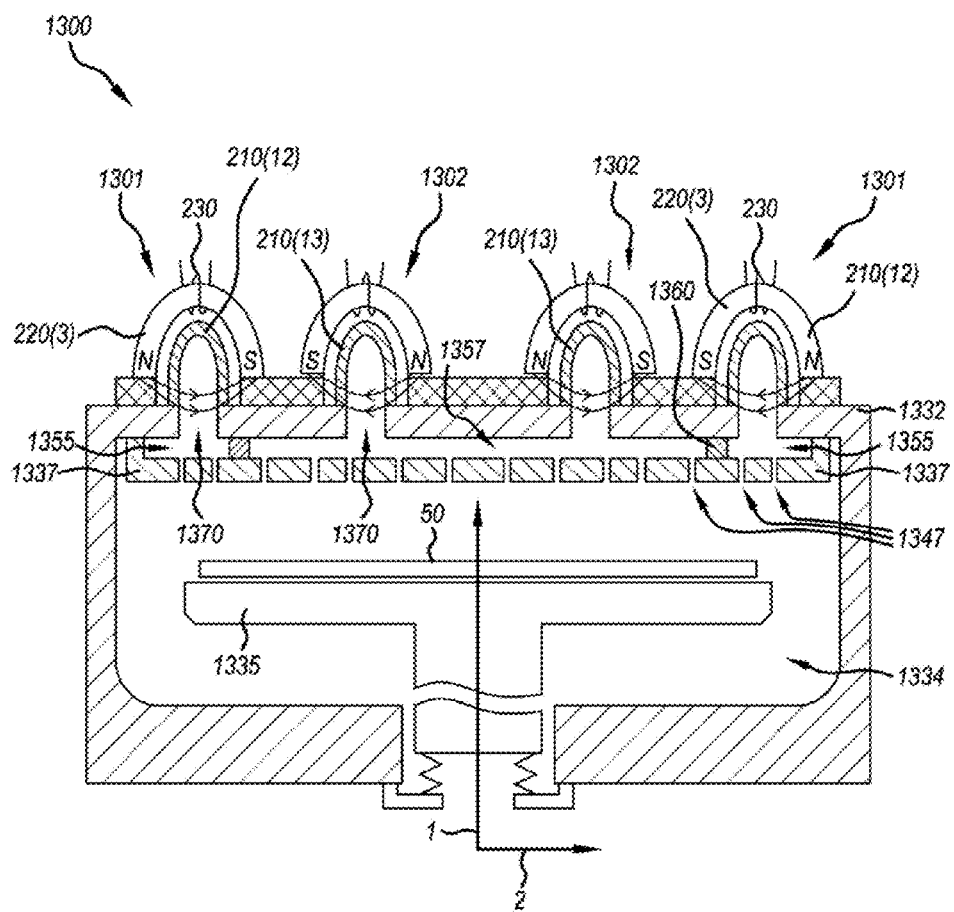
FIG. 18 schematically illustrates, in a cross-sectional view, a plasma wafer processing system that includes two direct outlet toroidal plasma sources, according to an embodiment.

FIG. 18 schematically illustrates, in a cross-sectional view, a plasma wafer processing system 1300 that includes two direct outlet toroidal plasma sources 1301 and 1302. Again, although FIG. 18 is an embodiment directed to wafer processing, it is understood that other embodiments may utilize the same principles for processing of other workpieces. Many features of processing system 1300 will be recognized as substantially similar to systems previously described and are not described again. The toroidal axis 1 and radial direction 2 are shown again in FIG. 18 for reference; azimuthal direction arcs in or out of the planes of FIG. 18, changing sign from left to right of toroidal axis 1. Plasma wafer processing system defines a process chamber 1334 that is radially symmetric about toroidal axis 1; thus plasma source 1301 may be considered an outer plasma source while plasma source 1302 may be considered an inner plasma source, with the toroidal axes of plasma sources 1301 and 1302, and an axis of symmetry of plasma chamber 1334, all being coincident. FIG. 18 illustrates the additional feature of plasma blocks 210(12) and 210(13) that are in open fluid communication with underlying spaces, rather than being bounded by bottom plates. FIG. 18 also illustrates a domain separator 1360.

Similar to the respective locations of plasma sources 1201 and 1202, plasma sources 1301 and 1302 define inner and outer toroidal shapes atop a process chamber 1334. Plasma sources 1301 and 1302 may receive source gases from inlet apertures 260 or 830, as shown in FIGS. 5 and 11 respectively, with or without a gas manifold 810 as shown in FIGS. 10 and 11; such structures are not shown in the view of FIG. 18. Within process chamber 1334, a pedestal 1335 positions workpiece 50 for processing. Plasma blocks 210(12) and/or 210(13) form substantially azimuthally continuous openings 1370 on a first axial side thereof, that is, plasma sources 1301 and 1302 are not substantially bounded on the first axial side, as are plasma sources 1201, 1202 and others previously discussed. Openings 1370 may be substantially azimuthally continuous in that they extend significantly in the azimuthal direction through top plate 1332, however, in this context "substantially azimuthally continuous" does not preclude interruptions to openings 1370 to provide mechanical support for radially inner portions of top plate 1332; openings corresponding to at least about 75% of the major circumference of either plasma source would be considered substantially azimuthally continuous. Also, it is not critical that both plasma blocks 210(12) and 210(13) define substantially azimuthally continuous openings; in embodiments, one of plasma blocks 210(12) and 210(13) defines a substantially azimuthally continuous opening while the other does not. Thus, plasma cavities of plasma sources 1301 and 1302 are in fluid communication with spaces 1355, 1357 formed in an upper portion of process chamber 1334, such that plasma products will pass out of plasma blocks 210(12) and 210(13) through openings 1370 into spaces 1355 and 1357. From spaces 1355, 1357 the plasma products pass through a diffuser plate 1337 into process chamber 1334.

Plasma wafer processing system 1300 may, of course, include provisions for supplying source gases to plasma sources 1301 and 1302 (such as individual gas inlet apertures and/or gas manifolds as described in connection with FIGS. 10-13) and for adding further gases to the plasma products, such as gas inlets 1270 and/or gas passages 1239 illustrated in FIGS. 16, 17A and 17B.

The open design of plasma blocks 210(12) and 210(13) means that pressure in each of spaces 1355, 1357 beneath each plasma block will be substantially determined by input gas flow to the respective plasma blocks. Separation of spaces 1355 and 1357 can thus be maintained, if desired, by using a domain separator 1360. Domain separator 1360 is a circular feature that contacts both top plate 1332 and diffuser plate 1337 about its complete circumference; the cross-sectional view of FIG. 18 shows only two portions of domain separator 1360 that pass through the cross-sectional plane. Domain separator 1360 is typically formed of dielectric material and enforces a separation between plasma products supplied to a center region and an edge region of process chamber 1334. This separation can be used, in embodiments, to control center and edge processing effects separately within process chamber 1334, and thus to optimize center-to-edge processing uniformity at workpiece 50.

The provisions for supplying source gases to plasma sources 1301 and 1302 may be independently controllable so that process effects at a center region and an edge region of the process chamber (e.g., corresponding approximately to those regions most influenced by plasma sources 1302 and 1301 respectively) can be adjusted for best processing uniformity. Independent controllability of source gases to plasma sources 1301 and 1302 may be advantageous whether or not domain separator 1360 is present.

From the preceding descriptions, it should be clear that one, two or more toroidal plasma sources may be utilized to provide uniform distributions of plasma products to a process chamber, by extracting the plasma products from axial sides of the plasma sources along short travel paths to the process chamber. A plurality of toroidal plasma sources may be disposed with elements such as respective plasma blocks, dielectric breaks of the plasma blocks, magnetic elements, induction coils, cooling apparatus, output apertures, inlet gas manifolds and other associated elements arranged for best uniformity and shortest travel paths of plasma products to the process chamber.

Having described several embodiments, it will be recognized by those of skill in the art that various modifications, alternative constructions, and equivalents may be used without departing from the spirit of the invention. Additionally, a number of well-known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the electrode" includes reference to one or more electrodes and equivalents thereof known to those skilled in the art, and so forth. Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

I claim:

1. A plasma processing system, comprising:
a process chamber that includes a wafer pedestal, wherein the process chamber extends upwards at least from the wafer pedestal to a plane that is horizontal and above a top surface of the wafer pedestal; and
a plasma source, comprising an induction coil, a magnetic core element and a plasma generation block that defines a toroidal plasma cavity, wherein:
in operation, the plasma source generates a plasma in the plasma cavity;
the plasma generation block and the plasma cavity are substantially radially symmetric about a toroidal axis that defines an axial direction and a radial direction;
the plasma generation block defines a plurality of outlet apertures on a first axial side of the plasma cavity, wherein plasma products produced by the plasma pass in the axial direction, through the plurality of outlet apertures, from the plasma cavity, through the plane and into the process chamber;
the induction coil winds at least partially about the magnetic core element, and
the magnetic core element is disposed adjacent to the plasma generation block, and extends from a first end that is at or above the plane, on a radially outward side of the plasma generation block, passes above the plasma generation block on a second axial side of the plasma cavity that is axially opposite to the first axial side, and to a second end that is at or above the plane, on a radially inward side of the plasma generation block, but does not extend below the plane;
such that during operation, a current in the induction coil induces a magnetic flux in the magnetic core element, and the magnetic flux in the magnetic core element induces an azimuthal electric current within the plasma cavity, to generate the plasma.

2. The plasma processing system of claim 1, the plasma generation block comprising aluminum and including a plurality of dielectric breaks that, during operation, interrupt azimuthal currents induced in the aluminum by the magnetic flux.

3. The plasma processing system of claim 2, wherein the magnetic core element is one of two magnetic core elements, and each of the two magnetic core elements is arranged about the plasma generation block in azimuthal alignment with corresponding ones of the dielectric breaks.

4. The plasma processing system of claim 1,
the process chamber being substantially radially symmetric about the toroidal axis,
the plurality of outlet apertures being arranged symmetrically with respect to the toroidal axis and with a plurality of the outlet apertures at each of at least three different radii relative to the toroidal axis, such that the plasma products are distributed uniformly, across the radial direction, from the plasma cavity toward the process chamber.

5. The plasma processing system of claim 1, wherein the plasma generation block is flattened at the plane on the first axial side of the plasma cavity and rounded on the second axial side of the plasma cavity.

6. The plasma processing system of claim 5, wherein the magnetic core element is rounded so as to maintain proximity to the plasma generation block from the first end, on the radially outward side of the plasma generation block, about the plasma generation block on the second axial side, to the second end, on the radially inward side of the plasma generation block.

7. The plasma processing system of claim 1, wherein the plasma generation block is flattened at the plane, and the first and second ends of the magnetic core element extend to, but not through, the plane.

8. The plasma processing system of claim 1, wherein the magnetic core element at least partially encloses a cooling tube through which, during operation, a liquid flows to remove heat dissipated by the magnetic core element.

9. A single wafer plasma processing system, comprising:
a process chamber, wherein
the process chamber is substantially radially symmetric about a toroidal axis,
the process chamber includes a pedestal that positions a single wafer for processing within the process chamber, and
the pedestal is disposed substantially concentric with the toroidal axis and positions the single wafer concentric with the toroidal axis;
a plasma source that, during operation, generates a plasma in a toroidal plasma cavity, the plasma source comprising
a plasma generation block, comprising at least two metal sections interspersed with at least two dielectric breaks along a major circumference of the toroidal plasma cavity,
wherein each of the dielectric breaks consists of dielectric material that encircles a minor circumference of the plasma cavity, such that no metal exists within an azimuthal section of the plasma generation block at each of the dielectric breaks; and
at least two magnetic elements adjacent to the toroidal plasma cavity that partially encircle, but do not completely encircle, a minor circumference of the toroidal plasma cavity, wherein each of the magnetic elements is adjacent to the toroidal plasma cavity on a radially inner side of the toroidal plasma cavity, a side of the toroidal plasma cavity that faces away from the process chamber, and a radially outer side of the toroidal plasma cavity, and wherein
the major circumference of the toroidal plasma cavity is substantially radially symmetric about the toroidal axis,
the plasma source defines a plurality of outlet apertures on a first axial side of the toroidal plasma cavity,
during operation, plasma products produced by the plasma pass in the axial direction, through the plurality of outlet apertures, from the toroidal plasma cavity, toward the process chamber, and
at least some of the outlet apertures penetrate the dielectric breaks.

10. The plasma processing system of claim 9, further comprising a diffuser plate defining a plurality of second apertures therethrough, disposed between a second cavity and the process chamber, such that during operation, the plasma products pass through the plurality of outlet apertures into the second cavity, and through the second apertures to enter the process chamber, and wherein:
the diffuser plate extends along a continuous plane at a fixed height from the pedestal from the toroidal axis to a radial limit of the diffuser plate; and
at least some of the second apertures are radially further from the toroidal axis than a radius of the pedestal.

11. The plasma processing system of claim 10, the diffuser plate defining one or more gas passages that, during operation, conduct un-activated gases that have not passed through the toroidal plasma cavity, to the process chamber, and wherein the gas passages form outlets on a side of the diffuser plate that faces the process chamber.

12. The plasma processing system of claim 9, wherein each of the metal sections and each of the dielectric breaks form respective planar surfaces on the first axial side of the toroidal plasma cavity.

13. The plasma processing system of claim 12, wherein: each of the metal sections and each of the dielectric breaks form respective curved surfaces on a second axial side of the toroidal plasma cavity, and each of the at least two magnetic elements are rounded so as to maintain proximity to the metal sections and the dielectric breaks on the radially outer side, the second axial side, and the radially inner side, of the toroidal plasma cavity.

14. The plasma processing system of claim 9, wherein respective cooling tubes pass through the at least two magnetic elements, and during operation, liquid flows through the cooling tubes to remove heat dissipated by the at least two magnetic elements.

* * * * *